(12) United States Patent
de Rochemont

(10) Patent No.: US 11,239,922 B2
(45) Date of Patent: Feb. 1, 2022

(54) MODULE WITH HIGH PEAK BANDWIDTH I/O CHANNELS

(71) Applicant: L. Pierre de Rochemont, Raleigh, NC (US)

(72) Inventor: L. Pierre de Rochemont, Raleigh, NC (US)

( * ) Notice: Subject to any disclaimer, the term of this patent is extended or adjusted under 35 U.S.C. 154(b) by 257 days.

(21) Appl. No.: 16/432,691

(22) Filed: Jun. 5, 2019

(65) Prior Publication Data

US 2020/0092014 A1 Mar. 19, 2020

Related U.S. Application Data

(60) Provisional application No. 62/680,762, filed on Jun. 5, 2018, provisional application No. 62/691,204, filed on Jun. 28, 2018.

(51) Int. Cl.
| | | |
|---|---|---|
| *H04B 10/69* | (2013.01) |
| *H01L 21/48* | (2006.01) |
| *H01L 23/528* | (2006.01) |
| *H01L 23/538* | (2006.01) |
| *H01L 23/66* | (2006.01) |
| *H03H 3/00* | (2006.01) |
| *H03H 7/06* | (2006.01) |
| *H03H 11/42* | (2006.01) |
| *H04L 7/00* | (2006.01) |
| *H04Q 11/00* | (2006.01) |
| *H03H 7/52* | (2006.01) |
| *H01L 25/11* | (2006.01) |

(52) U.S. Cl.
CPC ....... *H04B 10/6972* (2013.01); *H01L 21/486* (2013.01); *H01L 23/528* (2013.01); *H01L 23/5383* (2013.01); *H01L 23/5386* (2013.01); *H01L 23/66* (2013.01); *H01L 25/117* (2013.01); *H03H 3/00* (2013.01); *H03H 7/06* (2013.01); *H03H 7/52* (2013.01); *H03H 11/42* (2013.01); *H04L 7/0087* (2013.01); *H04Q 11/0071* (2013.01); *H01L 2223/6616* (2013.01); *H01L 2223/6627* (2013.01); *H01L 2223/6661* (2013.01)

(58) Field of Classification Search
CPC ......... H03H 7/52; H03H 7/06; H01L 25/117; H01L 23/5383; H01L 23/66; H01L 2223/6616; H01L 2223/6627
See application file for complete search history.

(56) References Cited

U.S. PATENT DOCUMENTS

| | | |
|---|---|---|
| 5,633,785 A | 5/1997 | Parker et al. |
| 6,456,525 B1 | 9/2002 | Perner et al. |
| 6,606,014 B2 | 8/2003 | Miller |
| 7,411,283 B2 | 8/2008 | Hockanson et al. |
| 2002/0040391 A1 | 4/2002 | Chaiken et al. |

(Continued)

OTHER PUBLICATIONS

International Preliminary Report on Patentability in PCT application No. PCT/US2019/030747 dated Nov. 3, 2020.

(Continued)

*Primary Examiner* — Tucker J Wright
(74) *Attorney, Agent, or Firm* — Burns & Levinson, LLP; Jerry Cohen

(57) ABSTRACT

A high peak bandwidth I/O channel embedded within a multilayer surface interface that forms the bus circuitry electrically interfacing the output or input port on a first semiconductor die with the input or output port on a second semiconductor die.

20 Claims, 39 Drawing Sheets

(56) References Cited

U.S. PATENT DOCUMENTS

| | | |
|---|---|---|
| 2002/0161074 A1 | 10/2002 | Zhang et al. |
| 2014/0013129 A1 | 1/2014 | De Rochemont et al. |
| 2015/0256484 A1 | 9/2015 | Cameron |
| 2018/0308636 A1 | 10/2018 | De Rochemont |
| 2018/0358295 A1 | 12/2018 | De Rochemont |

OTHER PUBLICATIONS

International Search Report and Written Opinion in PCT application No. PCT/US2019/030747 dated Nov. 7, 2019.

International Search Report and Written Opinion in PCT application No. PCT/US2019/35633 dated Dec. 12, 2019.

Input

Output

TABLE I

| | Insertion Loss (dB/inch) | | | | | | | | | | | | | |
|---|---|---|---|---|---|---|---|---|---|---|---|---|---|---|
| | 12 GHz Nyquist (24Gbps) | | | | | | | 24 GHz Nyquist (48Gbps) | | | | | | |
| FR4 (εr = 4, tanδ = 0.02) | 1.55 | 4.57 | 8.03 | 14.96 | 35.75 | 70.39 | 139.7 | 3.19 | 7.11 | 12.01 | 21.80 | 51.20 | 100.19 | 198.2 |
| Meiteq 4000-13 EP SI (εr = 3.2, tanδ = 0.008) | 0.96 | 3.86 | 7.32 | 14.25 | 35.04 | 69.68 | 139.0 | 1.77 | 5.69 | 10.59 | 20.39 | 49.78 | 98.77 | 196.7 |
| Rogers 4350B (εr = 3.48, tanδ = 0.0037) | 0.88 | 3.65 | 7.12 | 14.05 | 34.83 | 69.47 | 138.8 | 1.36 | 5.28 | 10.18 | 19.98 | 49.37 | 98.36 | 196.3 |
| Megtron6 (εr = 3.4, tanδ = 0.002) | 0.79 | 3.57 | 7.03 | 13.96 | 34.74 | 69.38 | 138.7 | 1.21 | 5.10 | 10.00 | 19.80 | 49.19 | 98.18 | 196.2 |
| α-SiO(2) (εr = 3.8, tanδ = 0.0004) | 0.71 | 3.49 | 6.95 | 13.88 | 34.66 | 69.30 | 138.6 | 1.02 | 4.94 | 9.84 | 19.64 | 49.03 | 98.02 | 196.0 |
| α-SiO(2) (εr = 3.8, tanδ = 0.00002) | 0.69 | 3.47 | 6.93 | 13.86 | 34.64 | 69.28 | 138.6 | 0.98 | 4.90 | 9.80 | 19.60 | 48.99 | 97.98 | 196.0 |
| Line Width (mils) | 5 | 1 | 0.5 | 0.25 | 0.1 | 0.05 | 0.025 | 5 | 1 | 0.5 | 0.25 | 0.1 | 0.05 | 0.025 |
| Line Width (μm) | 127 | 25.4 | 12.7 | 6.35 | 2.54 | 1.27 | 0.635 | 127 | 25.4 | 12.7 | 6.35 | 2.54 | 1.27 | 0.635 |
| Half line pitch (μm)* | 127 | 29 | 15 | 7.3 | 2.9 | 1.5 | 0.7 | 127 | 29 | 15 | 7.3 | 2.9 | 1.5 | 0.7 |
| I/O Density (I/O/mm/layer) | 16 | 68 | 137 | 274 | 685 | 1369 | 2739 | 16 | 68 | 137 | 274 | 685 | 1369 | 2739 |
| Max improvement (Megtron6) | 15% | 2.9% | 1.5% | 0.73% | 0.29% | 0.15% | 0.07% | 23% | 4% | 2.1% | 1.0% | 0.41% | 0.21% | 0.10% |
| Max improvement (FR4) | 55% | 24% | 14% | 7.4% | 3.1% | 1.6% | 0.8% | 69% | 31% | 18% | 10% | 4.3% | 2.2% | 1.1% |

FIG. 3F

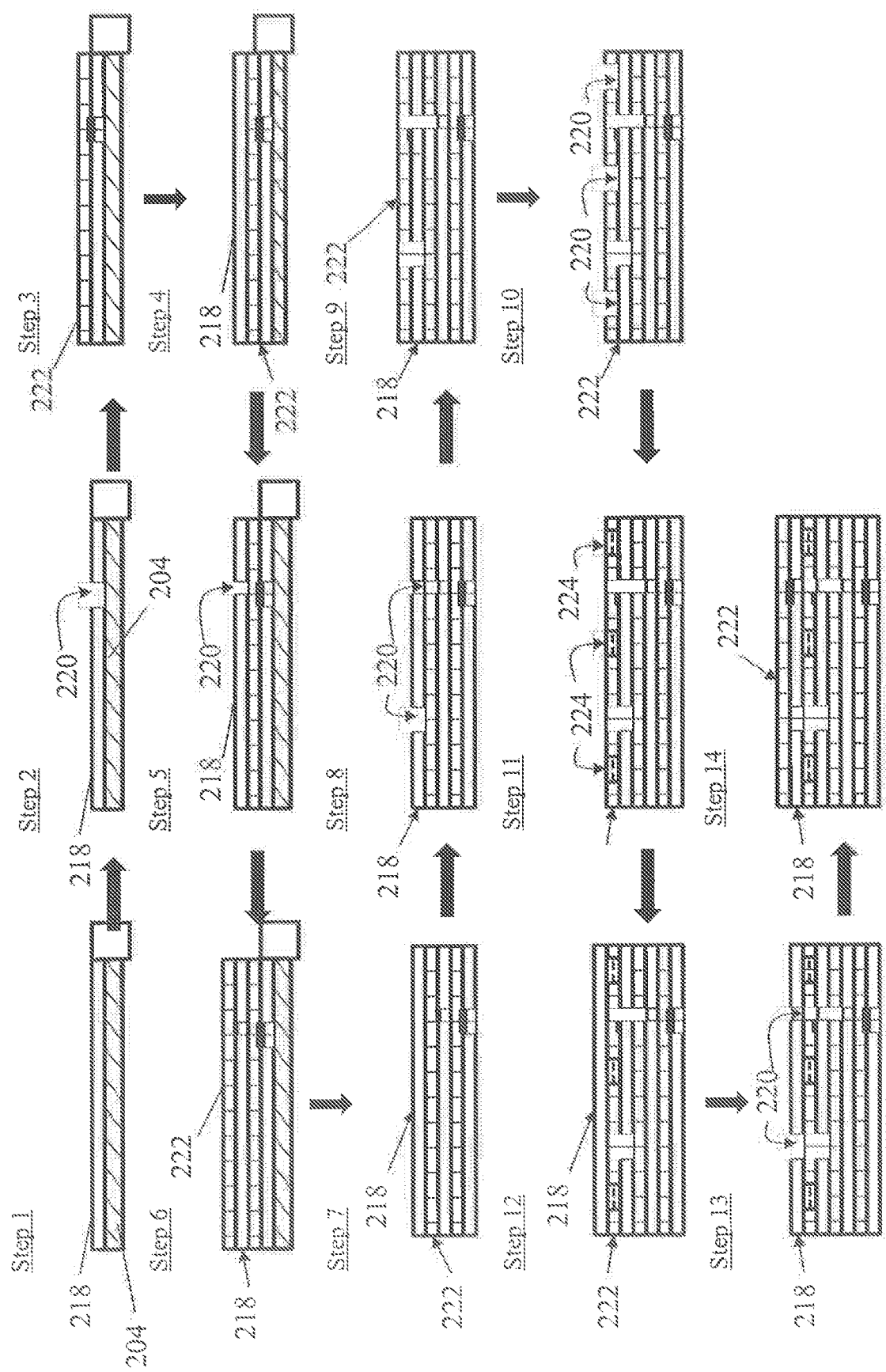

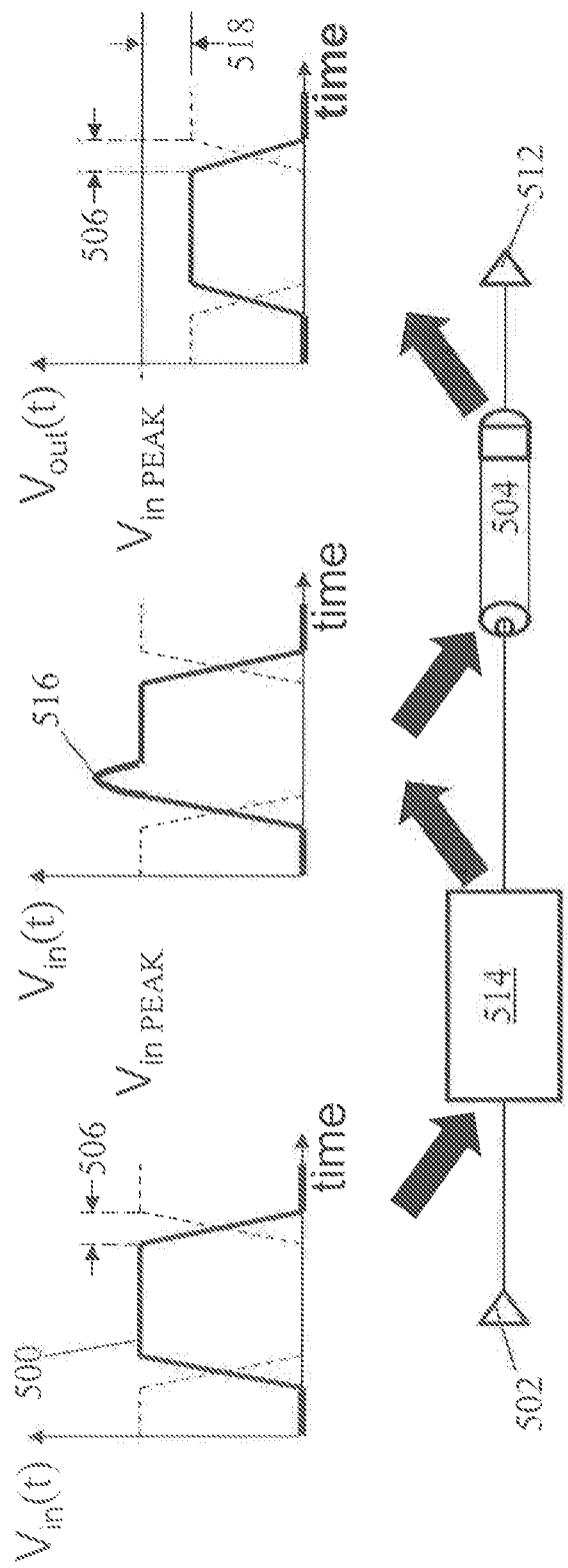
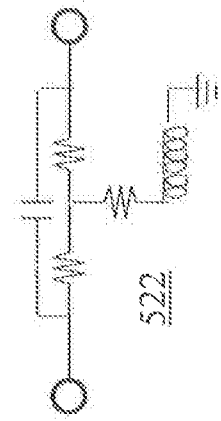
FIG. 9B
FIG. 9C

PERSPECTIVE VIEW
(Dielectric removed for clarity)

PERSPECTIVE VIEW
(Dielectric removed for clarity)

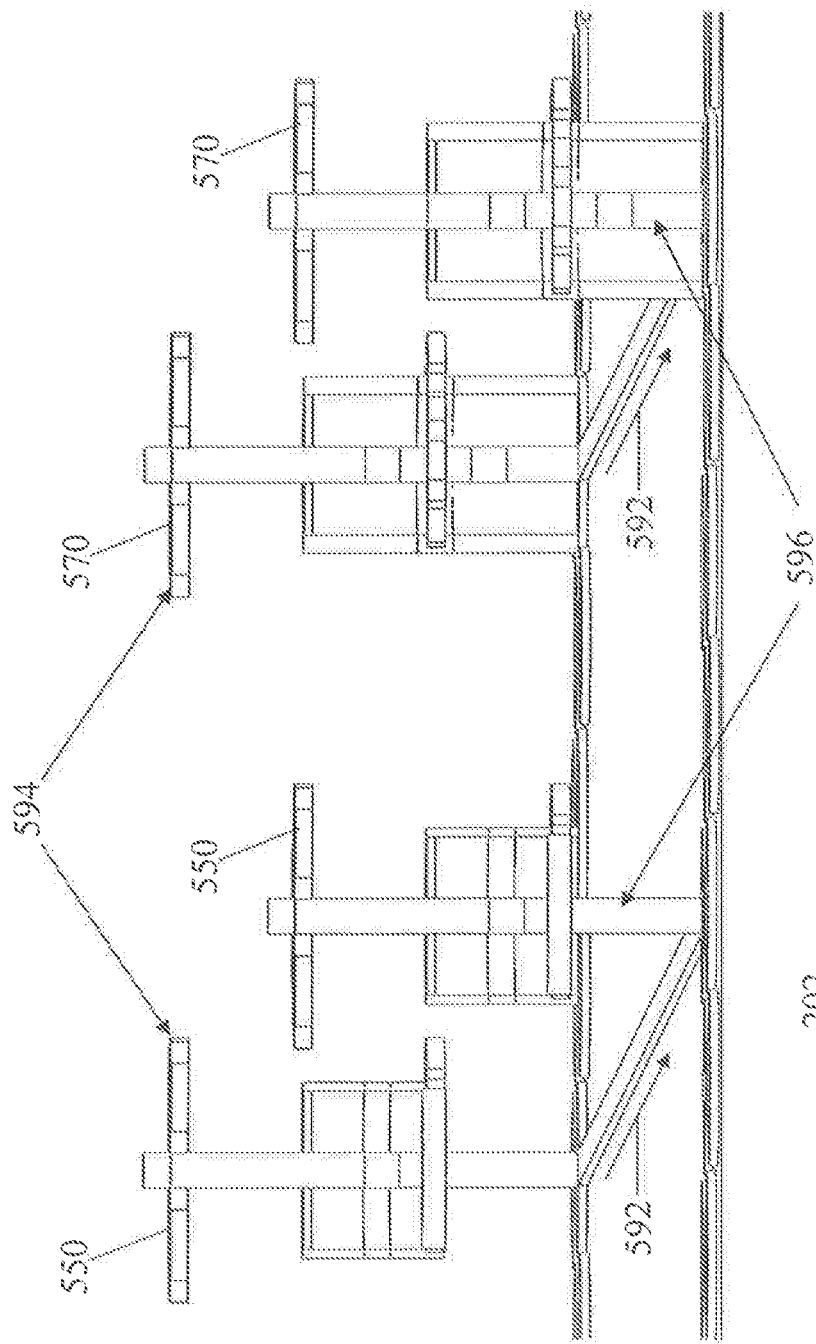

MODULE WITH HIGH PEAK BANDWIDTH I/O CHANNELS

CROSS REFERENCE TO RELATED APPLICATIONS

This application claims priority to and benefit of U.S. Provisional Application No. 62/680,762, entitled INTEGRATED CIRCUIT CONSTRUCTION AND METHOD OF MANUFACTURE, filed on Jun. 5, 2018, and U.S. Provisional Application No. 62/691,204, entitled MODULE WITH HIGH SPEED/HIGH DENSITY I/O CHANNELS, filed on Jun. 28, 2018 the contents of which are incorporated by reference herein in their entirety and for all purposes.

FIELD OF THE INVENTION

The present invention relates generally to the design and construction of high interconnection density, minimal loss I/O channels comprising embedded passive networks that preserve signal integrity at signaling frequencies above 1 GHz, preferably above 10 GHz, to improve memory-processor bandwidths.

BACKGROUND TO THE INVENTION

There is an increasing need to improve data bandwidths between processor units ("PU") and memory chips through the input/output ("I/O") subsystem commonly referred to as the "link". I/O subsystem performance is optimized by reducing signal attenuation, signal distortion, and crosstalk between adjacent signal lines. Memory bandwidth is optimized by maximizing the number of I/O channels and their data transfer rates. As circuits get smaller, the number of I/O channels and the pitch density between I/O pins that interface channels to semiconductor chips increase signal distorting crosstalk.

I/O channels with high signal integrity will minimize conductor and dielectric power loss mechanisms within the channel, as well as mechanisms that distort pulses traveling within the channel that contribute to jitter or Inter-Symbol Interference ("ISI"), like frequency dispersion and crosstalk. Equalizing circuitry mounted on an organic passive interconnect is currently used to correct these distortions. Equalizing circuitry in the link comprises passive elements mounted on organic interconnects/printed circuit boards to reshape a distorted pulse to preserve the desired rise-time. Equalization circuitry may also comprise active components to amplify the attenuated signal. Ideal equalizing circuitry with minimal power consumption will have minimal dependencies upon active components by virtue of material constructions that have minimal losses and use active components that draw minimal power.

Unfortunately, commodity materials used to form the organic interconnects and organic interconnects distort higher frequency signal components that needed are needed to shape a high-speed digital pulse, which limits processor unit clock speeds. Therefore means that enable equalizing circuitry to run higher system clock speeds is desirable.

Peak bandwidth of an input/output link is the product of the data rate times the number of data lanes. Insertion losses within the link are currently limiting peak bandwidths values to many hundreds of GBps (GigaBytes per second) using wide I/O channels comprising a large number of data lanes (1024). Wide I/O channels are driven at slower data rates around 2 Gbps (Gigabits per second). Narrow I/O channels comprising fewer data lanes (256 or less) can be driven at higher data rates (7 Gbps) as depicted in FIG. 1. It is therefore desirable to increase peak bandwidth well into the TeraBytes per second (TBps) by developing means that allow a wide channel to be driven at very high data rates by dramatically reducing channel insertion loss in high density interconnect structures. It is also desirable to introduce power efficient means to amplify attenuated signals within data lanes to improve overall system efficiencies, expressed in terms of pico-Joules/bit (pJ/bit).

Overview of the Related Art

Dias et al. U.S. Ser. No. 15/121,295, filed Mar. 28, 2014, entitled "METHOD AND PROCESS FOR EMIB CHIP INTERCONNECTIONS", (Dias et al. '295) instruct an Embedded Multi-Die Interconnect Bridge (EMIB) that comprises a high density I/O link fabricated on a semiconductor die using BEOL techniques that is embedded within a moldable compound and used to electrically connect a plurality of high density semiconductor die that are mounted on the EMIB. The semiconductor die comprises high density interconnects having half-line pitch less than 2.5 μm that form the high-density I/O channels. The EMIB comprises additional interconnections at a much wider half-line pitch within the moldable compound forming the EMIB dielectric medium. Dias et al. '295 is silent on integrating passive equalization circuitry or amplification circuitry within the EMIB or the embedded semiconductor die mounted upon it. It is also silent on the art of integrating I/O channels within semiconductor carriers that comprise active circuitry, passive networks embedded within a carrier or formed upon the carrier surface, or novel power management systems that evenly distribute power to all devices or components in the system.

Amkor Corporation's SLIM™ and SWIFT™ technologies provide another means to form high density I/O channels using BEOL processes with moldable compounds and copper plating to create the interconnect structure on sacrificial substrate The substrate is removed once semiconductor die have been attached and embedded within the interconnect package. There is no reported evidence that passive components or equalizing and amplifying circuitry are integrated in these structures.

CoWoS is a BEOL process that assemble semiconductor die within a 3D chip stack comprising interposer circuits containing Through-Silicon-Vias or TSVs. There is no reported means to embed passive networks within the 3D chip stack.

The prior art is depicted in FIG. 2, wherein 3D chip stacks 1 and a heterogeneously mounted semiconductor die 2 are placed upon an interconnect structure 3. The interconnect structure 3 is formed from moldable compounds and is used to place the 3D chip stacks 1 and semiconductor die 2 in electrical communication with passive components 4 mounted upon an organic package 5. The passive components 4 are used to terminate or equalize I/O channels within the interconnect structure 3. The interconnect structure 3 could comprise EMIB, SLIM™, or SWIFT™ technologies. Moldable compounds comprise organic materials that have high dielectric dispersion and losses that grow exponentially at higher signaling frequencies.

de Rochemont U.S. Pat. No. 8,715,839, filed Jun. 30, 2006, entitled "ELECTRICAL COMPONENT AND METHOD OF MANUFACTURE" (the '839 application) discloses the integration of capacitive components with properties that remain stable with temperature upon a semiconductor or dielectric surface to form an integrated interconnect. It does not disclose embedding equalization circuitry and amplification stages within the semiconductor substrate to form a low loss I/O channel with high signal integrity and high power efficiency.

de Rochemont U.S. Pat. No. 7,405,698 entitled "CERAMIC ANTENNA MODULE AND METHODS OF MANUFACTURE THEREOF" (the '698 application) discloses the use of high permittivity electroceramic to form transmission lines that have characteristic impedance that matches the input/output impedance of a semiconductor chip, and the integration of those transmission lines on the surface of a semiconductor die or electrical interconnect (interposer circuit), but it does not disclose art related to transmission lines that comprise high permittivity and high permeability dielectrics configured along the path of a transmission line that causes the transmission line to resonate a given frequency or desired clock speed.

de Rochemont U.S. Ser. No. 15/521,145, filed with a priority date May 2, 2017, entitled "HIGH SPEED SEMICONDUCTOR CHIP STACK" (the '145 application) discloses and claims high permittivity electroceramics that have dielectric properties that remain stable with temperature and time (above femto-second time scales) by virtue of having uniform nanoscale grain size and microstructure. It also discloses the incorporation of those high permittivity electroceramics within surface layers formed upon an interposer circuit or semiconductor die that are embedded within the high speed semiconductor chip stack. While it claims the use of these materials at a via, either around a via pad as an integral part of the via pad or adjacent to a via pad to minimize signal reflections, it does not disclose the use of these electroceramics as components to an equalization circuit around a via pad, vertically distributed among several via pads forming the via, or within a I/O channel.

de Rochemont U.S. Ser. No. 16/403,411, filed with a priority date of May 3, 2018, "HIGH SPEED/LOW POWER SERVER FARMS AND SERVER NETWORKS", (the '411 application) claims art related to minimizing the power consumed within a server farm comprising hybrid computing modules and regional and global networks of such server farms.

Definition of Terms

The terms "$1^{st}$ Generation Stack Machine" or "$1^{st}$ Generation Stack Machine Information Architecture" are herein understood to refer to a stack processor information architecture wherein data remains resident in memory where a string of operators and operands pass through select memory addresses to obtain a desired algorithmic result.

The terms "$2^{nd}$ Generation Stack Machine Architecture" or "$2^{nd}$ Generation Stack Machine Architecture" are herein understood to refer to a stack processor information architecture wherein a string of operators and operands are called from memory into a stack machine processor designed to process algorithms using structured programming languages that utilize minimal instruction set (MISC) architectures to obtain the a desired algorithmic result and return it back to a specified location in memory.

The terms "$3^{rd}$ Generation Stack Machine Architecture" or "$3^{rd}$ Generation Stack Machine Information Architecture" are herein understood to refer to an information architecture having minimal dependence upon cache memory utilities wherein a controller maximizes algorithmic efficiencies by dynamically assigning data processing, when warranted, to memory using methods consistent with a $1^{st}$ Generation Stack Machine, or assigning data processing most efficiently resolved by recursive or deeply nested loop algorithms to a Stack Machine processor die using methods consistent with a 2nd Generation Stack Machine and minimal instruction set computing (MISC) architectures, or assigning data processing most efficiently resolved by iterative algorithms to a central processing unit or graphical processing using reduced instruction set computing (RISC) architectures.

The term "average amu" is herein understood to mean the median atomic mass of a unit cell for a crystalline compound derived by summing the fractional atomic mass units contributed by elements forming the crystal lattice.

The term "BEOL" is herein understood to have its conventional meaning of "back end of line", which refers to semiconductor processes that form the electrical interconnections between the active circuitry, such as switching elements, embedded within the semiconductor surface and any device or system to which the semiconductor is electrically connected.

The term "Bitcoin" is herein understood to mean a digital crypto-currency that is mined on a Blockchain using a computer algorithm and exists in limited supply.

The term "Blockchain" is herein understood to mean a process used to form a trusted auditable record in a digital ledger that is distributed across a computer network.

The terms "chemical complexity", "compositional complexity", "chemically complex", or "compositionally complex" are herein understood to refer to a material, such as a metal or superalloy, compound semiconductor, or ceramic that consists of three (3) or more elements from the periodic table.

The term "chip stack" is herein understood to mean a bonded three dimensional (3D) assembly of chips that may comprise semiconductor die and non-semiconductor chip elements, such as sensors, micro-electromechanical systems ("MEMS"), and/or interposer circuits that provide passive electrical interconnections between the various components in the 3D assembly.

The term "critical performance tolerances" is herein understood to refer to the ability for all passive components in an electrical circuit to hold performance values within ±1% of the desired values at all operating temperatures over which the circuit was designed to function.

The term "distributed ledger technology" is herein understood to refer to a computational platform that generates a trusted database distributed across a computer network wherein trust related to an entry or transaction is assured when a majority of computers that are parties to the network confirm the entry or transaction and said entry or transaction remains a permanent record of the computer network that can be openly inspected and cannot be altered.

The term "electroceramic" is herein understood to refer to its conventional meaning as being a complex ceramic material that has robust dielectric properties that augment the field densities of applied electrical or magnetic stimulus.

The term "high interconnection density" or "high I/O density" is herein understood to mean a linear escape density in excess of 200 IO/mm/layer, wherein linear escape density is the number of physical interconnects escaping per millimeter of semiconductor die edge for each layer of a packaging device.

The term "integrated circuit" (or "IC") is herein understood to mean a semiconductor chip into which a large, very large, or ultra-large number of active switching element elements have been embedded.

The term "I/O channel" is herein understood to mean a conductive link between the output port of a first semiconductor chip and the input port of a second semiconductor chip and the intervening circuit elements necessary to optimize the integrity of signals transmitted between the two ports.

The term "liquid chemical deposition" (or "LCD") is herein understood to mean a method that uses liquid precursor solutions to fabricate materials of arbitrary compositional or chemical complexity as an amorphous laminate or free-standing body or as a crystalline laminate or free-standing body that have atomic-scale chemical uniformity and a microstructure that is controllable down to nanoscale dimensions.

The term "MAX-phase material" is herein understood to define a chemically complex intermetallic ceramic material having the general chemical formula $M_{(n+1)}AX_n$, wherein M is first row transition-metal element, A is an "A-group" element found in columns III-VI of the periodic table, and X is either carbon (C) or nitrogen (N).

The term "microstructure" is herein understood to hold its traditional meaning of relating to the grain size, grain chemistry, and grain boundary chemistry of a polycrystalline ceramic material.

The term "passive component" is herein understood to refer to its conventional definition as an element of an electrical circuit that that modulates the phase or amplitude of an electrical signal without producing power gain.

The term "physical layer" is herein understood to mean a patterned or unpatterned material layer embedded within a microelectronic circuit wherein the material possesses some unique physical property that enhances the proper function of the circuit or a circuit element.

The term "processor unit" is herein understood to mean any form of microprocessor, including a GPU, CPU, ARM, stack, embedded, video, audio, or application specific.

The term "resonant gate transistor" is herein understood to refer to any of the transistor architectures disclosed in de Rochemont, U.S. Pat. No. 8,779,489, "POWER FET WITH A RESONANT TRANSISTOR GATE", wherein the transistor switching speed is not limited by the capacitance of the transistor gate, but operates at frequencies that cause the gate capacitance to resonate with inductive elements embedded within the gate structure.

The term "standard operating temperatures" is herein understood to mean the range of temperatures between −40° C. and −125° C.

The term "surface feature" is herein understood to mean one or more patterned physical layers integrated on the surface of a substrate wherein the patterns and physical properties of the physical layers are designed to serve some functional purpose within a microelectronic circuit.

The term "thermoelectric effect" is herein understood to refer to its conventional definition as the physical phenomenon wherein a temperature differential applied across a material induces a voltage differential within that material, and/or an applied voltage differential across the material induces a temperature differential within that material.

The term "thermoelectric material" is herein understood to refer to its conventional definition as a solid material that exhibits the "thermoelectric effect".

The term "thermomechanical" is herein understood to refer to its conventional definition as relating to properties induced or created by the simultaneous application of elevated temperature and mechanical force or pressure.

The term "thinned" is herein understood to refer to an interposer circuit, a sensor chip, or a semiconductor die that has been ground and chemical mechanically polished to reduce its original thickness to a lesser thickness, preferably a thickness on the order of 25 μm or less.

The term "thru via" or "via" is herein understood to refer to its conventional definition as relating to a vertical electrical connection that is made by filling a thru hole with an electrically conductive substance.

The terms "tight tolerance" or "critical tolerance" are herein understood to mean a performance value, such as a capacitance, inductance, or resistance that varies less than ±1% over standard operating temperatures.

The term "transmission line" is herein understood, for the specific purpose of this application, to refer to any of the following: a microstrip, a stripline, ground-cladded stripline, ground-cladded dielectric waveguide, and a dielectric slab waveguide.

The term "via" is herein understood to mean any vertical interconnection that establishes electrical, electro-optical, or electro-radiation communication between horizontal planes of an electrical circuit.

SUMMARY OF THE INVENTION

The present invention relates generally to the design and construction of high interconnection density, minimal loss I/O channels comprising embedded passive networks that preserve signal integrity at signaling frequencies above 1 GHz, preferably above 10 GHz, to improve memory-processor bandwidths.

The present invention further relates to configuring low insertion loss transmission lines and ultra-low loss passive circuit elements embedded within surface layers formed upon a semiconductor chip carrier, an interposer circuit, or a semiconductor die as equalization circuitry operating in Pre-Emphasis mode, Post-Emphasis mode, or both modes.

The present invention additionally relates to the use of a resonant gate transistor that amplifies attenuated signals within the high interconnection density, minimal loss I/O channels embedded within the surface layers of the semiconductor chip carrier, interposer circuit, semiconductor die or module.

The present invention further comprises a resonant gate transistor additionally comprising a broad band filtering stage embedded within the gate structure of the resonant gate transistor that serves as an amplifying equalization circuit or as clock data recovery circuitry.

The present invention specifically relates to a semiconductor carrier comprising one or more discrete semiconductor die or at least one semiconductor chip stack mounted upon the semiconductor carrier that further comprises surface layers having ultra-low insertion loss transmission lines electrically connected to embedded passive and active circuitry functioning as equalization systems to optimize microprocessor-memory bandwidths that optionally includes a resonant gate transistor embedded within an I/O channel.

The present invention additionally claims a hybrid computing module comprising a semiconductor carrier with high interconnection density, minimal loss I/O channels upon which semiconductor die or chip stacks have been mounted upon the carrier surface and data is processed within memory chips using methods consistent with a $1^{st}$ Generation Stack Machine processor.

The present invention further claims a hybrid computing module comprising a semiconductor carrier with high interconnection density, minimal loss I/O channels upon which semiconductor die or chip stacks have been mounted upon the carrier surface and data is processed within a stack machine processor die using methods consistent with a $2^{nd}$ Generation Stack Machine.

The present invention also claims a hybrid computing module comprising a semiconductor carrier with high interconnection density, minimal loss I/O channels and memory-processor bandwidths exceeding 100 MBps, preferably exceeding 1 TBps, upon which semiconductor die or chip stacks have been mounted upon the carrier surface and data is processed using methods consistent with a $3^{rd}$ Generation Stack Machine that has minimal dependence upon cache memory, wherein data processing is dynamically assigned to memory using methods consistent with a $1^{st}$ Generation Stack Machine, or processed in a Stack Machine processor die using methods consistent with a 2nd Generation Stack Machine and minimal instruction set computing (MISC) architectures, or managed by a controller that optimally assigns functions most efficiently resolved by recursive or deeply nested loop algorithms to the MISC Stack Machine processor, and optimally assigns functions most efficiently resolved by iterative algorithms to a central processing unit using reduced instruction set computing (RISC) architectures.

The invention claims a networked computing system comprising an assembly of locally positioned hybrid computing modules wherein the hybrid computing modules comprise a semiconductor carrier with high interconnection density, minimal loss I/O channels and memory-processor bandwidths exceeding 100 MBps, preferably exceeding 1 TBps, and an electro-optic device mounted or formed upon the semiconductor carrier as an optical interface to other hybrid computing modules in a locally networked computing system.

The invention claims electro-optic device mounted or formed upon the semiconductor carrier as an optical interface to other hybrid computing modules in a regional network or global network of hybrid computing modules through an optical telecommunications network, a wireless telecommunications network, or a satellite telecommunications network.

One embodiment of the present invention provides a computing system that comprises one or more hybrid computing modules that further comprise at least one high peak bandwidth I/O channel embedded within a multilayer surface interface, wherein, the multilayer surface interface is formed on a dielectric or semiconducting substrate to form a semiconducting die, a semiconductor carrier, an interposer circuit embedded within a semiconductor chip stack or bonded assembly of semiconductor wafers that are mounted on a substrate or semiconductor carrier; the high peak bandwidth I/O link additionally comprises vias that form an electrical interface with input and output ports on semiconductor die, the semiconductor carrier, or an interposer circuit embedded within the stacked assembly of semiconductor chips; the multi layer surface interface comprises conducting means that forms a channel link within a data signal plane that electrically interfaces signal transmission between the vias, low permittivity/ultra-low loss dielectric, additional conductive means to form power planes and ground planes, and may optionally signal comprise an active semiconductor layer and one or more control planes; and, the multilayer surface interface further comprises a passive network filtering circuit comprising capacitive, inductive, and resistive elements embedded within the high peak bandwidth I/O channel, wherein, the passive network filtering circuit further comprises high energy density electroceramic dielectric components that polarize and depolarize with femto-second response times.

The passive network filtering circuit may be adapted to function as a termination circuit. The passive network filtering circuit may be adapted to function as an equalization circuit. The equalization circuit may be adapted to function in Pre-Emphasis mode, Post-Emphasis mode, or both Pre-Emphasis and Post-Emphasis modes. The passive network filtering circuit may be adapted to function as a frequency resonance circuit.

The hybrid computing module may further comprise active switching elements embedded within an active semiconductor surface of a semiconductor chip carrier, a semiconductor die mounted on the semiconductor chip carrier, or semiconductor embedded within the stacked assembly of semiconductor chips, form an electrical interface with a signal control plane in the multilayer surface interface and the passive network filtering circuit functions as a clock or data recovery circuit.

The conductive means that forms the channel link within a data signal plane may be configured as a differential pair.

The hybrid computing module may have a resonant gate transistor: embedded within an active semiconductor surface of a multilayer interface formed on a semiconductor chip carrier, a semiconductor die, or an active semiconductor interposer circuit, in electrical communication with the signal control plane of the multilayer surface interface, and, inserted between input and output vias within the high-peak bandwidth I/O channel to amplify an attenuated signal. The resonant gate transistor may have inductors, capacitors, and resistors embedded within the resonant gate transistor's gate electrode to function as band tuning elements to tailor maximal amplification of the attenuated signal at a resonant frequency or over desired spectral frequency bands.

The resonant gate transistor may have the amplification tailored to provide maximal amplification at a desired resonant frequency or a selection of resonant frequencies. The amplification may be tailored to provide maximal amplification over equalization bands and functions as an amplifying equalization circuit. The high-peak bandwidth I/O channel may comprise conductive means configured as a differential pair and active switching elements that configure the resonant gate transistor to operate as a bi-directional amplification stage.

The low permittivity, ultra-low loss dielectric may comprise amorphous silica. The hybrid computing module may additionally comprise at least one power management module formed or mounted upon the semiconductor carrier of said hybrid computing module to evenly distribute power across the computing system. The power management module may comprise a resonant gate transistor.

The hybrid computing module may additionally comprise an electro-optic transceiver in electrical communication with a high-peak bandwidth I/O channel that provides optical communications means between the hybrid computing modules within the computing system. The hybrid computing module may comprise redundant or fault-tolerant circuitry.

The high energy density electroceramic dielectric of a capacitive circuit element may comprise a crystalline lattice wherein its unit cell with a median atomic mass greater than 25 amu, preferably greater than 70 amu. The high energy density electroceramic dielectric of a capacitive circuit element may have a relative permittivity ER above 70, preferably a relative permeability in the range of $200 \leq \varepsilon R \leq 800$. The high energy density electroceramic dielectric has stoichiometry given by: $M^{(I)}_{(1-x-y-z)}M^{(II)}_{x}M^{(III)}_{(y)}M^{(IV)}_{(z)}Zr_{(1-a-b)}Hf_{(b)}Ti_{(a)}O_3$, wherein, Zr is zirconium, Hf is hafnium, Ti is titanium, O is oxygen, and $M^{(I)}$, $M^{(II)}$, $M^{(III)}$, $M^{(IV)}$ are additional metal oxide components that form a thermodynamically stable perovskite crystal and x, y, and z, are fractional molar percentages forming ratios such that the sum of all $M^{(I)}$, $M^{(II)}$, $M^{(III)}$, $M^{(IV)}$ elemental components satisfies the constraint: $(1-x-y-z)+(x+y+z)=1$, and, $(1-a-b)+(a+b)=1$.

The additional metal oxide components ($M^{(I)}$, $M^{(II)}$, $M^{(III)}$, $M^{(IV)}$) may comprise scandium (Sc), vanadium (V), chromium (Cr), manganese (Mn), zinc (Zn), niobium (Nb), molybdenum (Mo), tantalum (Ta), tungsten (W), lanthanum (La), cerium (Ce), praseodymium (Pr) neodymium (Nd), samarium (Sm), europium (Eu), terbium (Tb), dysprosium (Dy), holmium (Ho), ytterbium (Yb), indium (In), tin (Sn), lead (Pb) or bismuth (Bi). The capacitive circuit element may have a physical dimension less than ½0th of the guided wavelength of an operating frequency in excess of 3 GHz, preferably in excess of 300 GHz, most preferably in excess of THz. The capacitive circuit element has maximal physical dimension not greater than 10 s of micron, preferably not greater than 1 s of micron, and more preferably less than 1 micron.

The high energy density electroceramic dielectric of an inductive element may comprise a garnet having relative magnetic permeability $\mu_R \geq 10$ and loss tangent $\tan \delta \leq 10^{-3}$ at GHz frequencies. The garnet may adopt either rhombic dodecahedron or trapezohedron crystal structures, or a combination of the two, and has the following chemical formula, $A_3B_2(SiO_4)_3$, wherein Group A metal oxides have equal molar concentration to silicon oxide and group B metal oxides have molar concentration that is ⅔ the molar concentration of silicon oxide; and, preferred group A metal oxides include; calcium oxide (CaO), magnesium oxide (MgO), iron oxide (FeO), and manganese oxide (MnO), and, preferred group B metal oxides include: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The high energy density electroceramic dielectric may have controlled microstructure with uniform grain size ranging from 10 nm to 25 μm, preferably from 250 nm to 5 μm.

The embedded passive filtering network may have the termination circuit comprise: a simple parallel termination; a simple parallel fly-by termination; an active parallel termination, a Thevenin termination, a series RC parallel termination or a differential pair fly-by termination. The termination circuit may comprise planar capacitive, inductive, and resistive circuit elements integrated into the channel link with a stub length less than 0.5 cm. The termination circuit may comprise capacitive, inductive, and resistive circuit elements embedded within an integrated via and have zero stub length. The embedded passive filtering network of Claim 3, wherein the equalization circuitry comprises planar capacitive, inductive, and resistive circuit elements integrated into the channel link with a stub length less than 0.5 cm.

The embedded passive filtering network may have the equalization circuit comprise capacitive, inductive, and resistive circuit elements that are embedded within an integrated via and have zero stub length. The embedded passive filtering network may have the clock or data recovery circuitry comprise planar capacitive, inductive, and resistive circuit elements integrated within the channel link with a stub length less than 0.5 cm. The passive filtering network may have the clock or data recovery circuitry comprise capacitive, inductive, and resistive circuit elements that are embedded within an integrated via and have zero stub length.

The hybrid computing module may have the high peak bandwidth I/O channels distributed across several data signal planes of the multilayer surface interface and comprise ground walls and ground planes, and have interconnection density exceeding 200 IO/mm/layer. The hybrid computing module may have a first semiconductor die that provides memory functions is interfaced through the high peak bandwidth I/O channel to a second semiconductor die that functions as a processor unit. The hybrid computing module may have data processed within the memory function provided by the first semiconductor die using methods and information architectures consistent with a $1^{st}$ Generation Stack Machine processor. The hybrid computing module may have the second semiconductor die function as a stack processor and data stored in memory is processed within the stack processor using methods and information architectures consistent with a $2^{nd}$ Generation Stack Machine processor. The hybrid computing module may have the processor unit function as stack processor with minimal or no dependence on cache memory and uses methods and information architectures consistent with a $3^{rd}$ Generation Stack Machine processor, wherein data processing is dynamically assigned to memory using methods and information architectures consistent with a 1st Generation Stack Machine, or data is processed in the stack processor using methods and information architectures consistent with a 2nd Generation Stack Machine and minimal instruction set computing (MISC) architectures. The hybrid computing module may have a controller circuit optimally assign processor functions most efficiently resolved by recursive or deeply nested loop algorithms to the MISC Stack Machine processor and optimally assign processor functions most efficiently resolved by iterative algorithms to a standard processing unit or graphical processing unit using reduced instruction set computing (RISC) architectures.

Another embodiment of the present invention provides a high peak bandwidth I/O channel embedded within a multilayer surface interface that forms the bus circuitry electrically interfacing the output or input port on a first semiconductor die with the input or output port on a second semiconductor die, wherein the high peak bandwidth I/O channel comprises: vias in electrical communication with the input and output ports on the first and second semiconductor die, a channel link comprising conductive means embedded within low permittivity/ultra-low loss dielectric that electrically interconnects the vias, a passive network filtering circuit comprising capacitive, inductive, and resistive elements embedded within the high peak bandwidth I/O channel, a multilayer surface interface comprising the channel link embedded within a data signal plane, additional conductive means to form power planes and ground planes, or optional signal control planes; wherein, the passive network filtering circuit comprises components including high energy density electroceramic dielectric that polarizes and depolarizes with femto-second response times.

The multilayer surface interface may be formed on a dielectric substrate or semiconducting die, a semiconductor carrier, or an interposer circuit embedded within a stacked assembly of semiconductor chips. The stacked assembly of semiconductor chips may be mounted on a substrate or semiconductor carrier, preferably a substrate or semiconducting carrier comprising a high peak bandwidth I/O channel, lire passive network filtering circuit may function as a termination circuit. The passive network filtering circuit may function as an equalization circuit. Tire equalization circuit may function in Pre-Emphasis mode, Post-Emphasis mode, or both Pre-Emphasis and Post-Emphasis modes. The passive network filtering circuit may function as a frequency resonance circuit. The high-peak bandwidth I/O channel may have active switching elements embedded within an active semiconductor surface of a semiconductor chip carrier, a semiconductor die mounted on the semiconductor chip carrier, or semiconductor embedded within the stacked assembly of semiconductor chips form an electrical interface with a signal control plane in the multilayer surface interface and the passive network filtering circuit functions as a clock or data recovery circuit. The conductive means that forms the channel link within a data signal plane may be configured as a differential pair.

The high-peak bandwidth I/O channel may have a resonant gate transistor that is: embedded within an active semiconductor surface of a multilayer surface interface formed on a semiconductor chip carrier, a semiconductor die, or an active semiconductor interposer circuit; in electrical communication with the signal control plane of the multilayer surface interface; and, inserted between input and output vias within the high-peak bandwidth I/O channel to amplify an attenuated signal, lire resonant gate transistor may have inductors, capacitors, and resistors embedded within the transistor's gate electrode function as band tuning elements to tailor amplification of the attenuated signal. The resonant gate transistor may have the amplification tailored to provide maximal amplification at a desired resonant frequency or a selection of resonant frequencies. The resonant gate transistor may have the amplification tailored to provide maximal amplification over equalization bands and functions as an amplifying equalization circuit. The high-peak bandwidth I/O channel may additionally comprise conductive means configured as a differential pair and switches that configure the resonant gate transistor to operate as a bi-directional amplification stage.

The multilayer surface interface may have the low permittivity, ultra-low loss dielectric comprise amorphous silica. The high energy density electroceramic dielectric of a capacitive circuit element may comprise a crystalline lattice wherein its unit cell with a median atomic mass greater than 25 amu, preferably greater than 70 amu. The high energy density electroceramic dielectric of a capacitive circuit element may have a relative permittivity $\varepsilon_R$ above 70, preferably a relative permeability in the range of $200 \leq \varepsilon_R \leq 800$. The high energy density electroceramic dielectric may have stoichiometry given by: $M^{(I)}{}_{(1-x-y-z)}M^{(II)}{}_{(x)}M^{(III)}{}_{(y)}M^{(IV)}{}_{(z)}Zr_{(1-a-b)}Hf_{(b)}Ti_{(a)}O_3$, wherein, Zr is zirconium, Hf is hafnium, Ti is titanium, O is oxygen, and $M^{(I)}$, $M^{(II)}$, $M^{(III)}$, $M^{(IV)}$ are additional metal oxide components that form a thermodynamically stable perovskite crystal and x, y, and z, are fractional molar percentages forming ratios such that the sum of all $M^{(I)}$, $M^{(II)}$, $M^{(III)}$, $M^{(IV)}$ elemental components satisfies the constraint: $(1-x-y-z)+(x+y+z)=1$, and, $(1-a-b)+(a+b)=1$. The additional metal oxide components ($M^{(I)}$, $M^{(II)}$, $M^{(III)}$, $M^{(IV)}$) may comprise scandium (Sc), vanadium (V), chromium (Cr), manganese (Mn), zinc (Zn), niobium (Nb), molybdenum (Mo), tantalum (Ta), tungsten (W), lanthanum (La), cerium (Ce), praseodymium (Pr) neodymium (Nd), samarium (Sm), europium (Eu), terbium (Tb), dysprosium (Dy), holmium (Ho), ytterbium (Yb), indium (In), tin (Sn), lead (Pb) or bismuth (Bi). The high-peak bandwidth I/O channel may include the capacitive circuit element having a physical dimension less than 1/20th of the guided wavelength of an operating frequency in excess of 3 GHz. The capacitive circuit element may have maximal physical dimension not greater than 10 s of micron, prefer ably not greater than 1 s of micron, and more preferably less than 1 micron.

The high-peak bandwidth I/O channel may have the high energy density electroceramic dielectric of an inductive element comprise a garnet having relative magnetic permeability $\mu_R \geq 10$ and loss tangent tan $\delta \leq 10^{-3}$ at GHz frequencies. The garnet may adopt either rhombic dodecahedron or trapezohedron crystal structures, or a combination of the two, and has the following chemical formula $A_3B_2(SiO_4)_3$, wherein Group A metal oxides have equal molar concentration to silicon oxide and group B metal oxides have molar concentration that is ⅔ the molar concentration of silicon oxide; and, preferred group A metal oxides include: calcium oxide (CaO), magnesium oxide (MgO), iron oxide (FeO), and manganese oxide (MnO), and, preferred group B metal oxides include: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The high energy density electroceramic dielectric may have controlled microstructure with uniform grain size ranging from 10 nm to 25 μm, preferably from 250 nm to 5 μm.

The embedded passive filtering network may have the termination circuit comprise: a simple parallel termination; a simple parallel fly-by termination; an active parallel termination, a Thevenin termination, a series RC parallel termination or a differential pair fly-by termination. The termination circuit may comprise planar capacitive, inductive, and resistive circuit elements within the I/O link with a stub length less than 0.5 cm. The termination circuit may comprise capacitive, inductive, and resistive circuit elements that embedded within an integrated via and have zero stub length. The equalization circuitry may comprise planar capacitive, inductive, and resistive circuit elements within the I/O link with a stub length less titan 0.5 cm. The equalization circuit may comprise capacitive, inductive, and resistive circuit elements that are embedded within an integrated via and have zero stub length. The embedded passive filtering network may have the clock or data recovery circuitry comprise planar capacitive, inductive, and resistive circuit elements within the I/O link and a stub length less than 0.5 cm. The passive filtering network may have the clock or data recovery circuitry comprise capacitive, inductive, and resistive circuit elements that are embedded within an integrated via and have zero stub length.

The high peak bandwidth I/O channel may have the signal control planes modulate active switching elements embedded within the active semiconductor layer. The high peak bandwidth I/O channel may have a plurality of channel links distributed across a across a plurality of data signal planes embedded within the multilayer surface interface. The plurality of channel links may be electrically isolated from one another by ground planes and ground walls. The high peak bandwidth I/O channel may have a high interconnection density I/O channel and have a linear escape density in excess of 200 IO/mm/layer, preferably in excess of 1,000 IO/mm/layer. The high peak bandwidth I/O channel may have the first semiconductor die be a processor unit and the second semiconductor die be a memory chip. The memory chip may be embedded within a vertical chip stack assembly and is in electrical communication with a controller circuit.

Yet another embodiment of the present invention provides a circuit module comprising a high peak bandwidth I/O channel formed upon a substrate upon which semiconductor die are attached, wherein the high peak bandwidth I/O channel comprises a multilayer surface interface that further comprises: conducting means that forms a channel link within a data signal plane that electrically interfaces signal transmission between the vias that form an electrical connection with input/output ports of semiconductor die mounted upon the substrate; low permittivity/ultra-low loss dielectric that envelopes the channel link; additional conductive means to form power planes and ground planes that separate, and, a passive network filtering circuit comprising capacitive, inductive, and resistive elements embedded within the high peak bandwidth I/O channel, wherein, the passive network filtering circuit elements further comprises high energy density electroceramic dielectric that polarizes and depolarizes with femto-second response times.

The substrate may be a semiconductor. The semiconductor substrate may be a semiconductor carrier. The multilayer surface interface may comprise a signal control plane that electrically interfaces with active circuitry embedded within the active plane of tire semiconductor substrate. The active circuitry embedded within the active plane may comprise an Op-Amp. The Op-Amp may be in electrical communication with passive circuit elements embedded within the multilayer surface interface. The Op-Amp and embedded passive circuit elements may form a fully integrated gyrator circuit. The fully integrated gyrator circuit may function as an inductive element. The fully integrated gyrator may function as a network filter. The folly integrated gyrator may function as a loss-less transformer. The active circuitry embedded within the active plane may comprise a resonant gate transistor. The active circuit embedded within the active plane may comprise a resonant gate transistor and active switching elements. The circuit module may have a semiconductor die heterogeneously mounted on the substrate surface. The circuit module may have a plurality of semiconductor are embedded within a chip stack assembly. The chip stack assembly may comprise a high peak bandwidth I/O channel.

The circuit module may have the semiconductor die manage any or all of the following circuit functions: memory, memory controller, device controller, central processor unit, graphical processor, stack processor, quantum processor; arrayed gate field programmability, radio connectivity, optical field imaging, radiation field imaging, electrooptical imaging; and, application-specific integrated (ASIC) circuitry. The circuit module may have a semiconductor die used to function as an imaging device that digitally captures electromagnetic fields at clock speeds in excess of 3 GHz, preferably in excess of 100 GHz, and most preferably at 1 THz. The circuit module may have memory functionality comprising read-only memory, random access memory, dynamic random access memory, static dynamic random access memory, nonvolatile memory, ferroelectric random access memory, optical memory, resistive-element random access memory. A circuit module may have the high peak bandwidth I/O link additionally comprise vias that form an electrical interface with input and output ports to a semiconductor chip carrier in electrical communication with circuit modules. The circuit module may have passive network filtering circuit function as a termination circuit. The passive network filtering circuit may function as an equalization circuit. The equalization circuit may function in Pre-Emphasis mode, Post-Emphasis mode, or both Pre-Emphasis and Post-Emphasis modes. The passive network filtering circuit may function as a frequency resonance circuit. The circuit module may have active circuitry embedded within an active semiconductor surface of a multilayer surface interface of semiconductor within the circuit module that forms an electrical interface with a signal control plane in the multilayer surface interface and the passive network filtering circuit functions as a clock or data recovery circuit. The circuit module may have the conducting means that forms the channel link within a data signal plane be configured as a differential pair.

The circuit module may have the active circuitry comprise a resonant gate transistor. The resonant gate transistor may be: embedded within an active semiconductor surface of a multilayer surface interface formed on a semiconductor chip carrier, a semiconductor die, or an active semiconductor interposer circuit, in electrical communication with the signal control plane of the multilayer surface interface, and, inserted between input and output vias within the high-peak bandwidth I/O channel to amplify an attenuated signal. The resonant gate transistor may have inductors, capacitors, and resistors embedded within the transistor's gate electrode function as band tuning elements to tailor amplification of the attenuated signal. The resonant gate transistor may have amplification tailored to provide maximal amplification at a desired resonant frequency or a selection of resonant frequencies. The resonant gate transistor may have amplification tailored to provide maximal amplification over equalization bands and functions as an amplifying equalization circuit.

The circuit module may have the high-peak bandwidth I/O channel additionally comprise conductive means configured as a differential pair and active switching elements that configure the resonant gate transistor to operate as a bi-directional amplification stage. The multilayer surface interface may have the low permittivity, ultra-low loss dielectric comprises amorphous silica. The circuit module may have the high energy density electroceramic dielectric of a capacitive circuit element comprise a crystalline lattice wherein its unit cell with a median atomic mass greater than 25 amu, preferably greater than 70 amu. The circuit module may have the high energy density electroceramic dielectric of a capacitive circuit element with a relative permittivity CR above 70, preferably a relative permeability in the range of $200 \leq \varepsilon_R \leq 800$. The circuit module may have the high energy density electroceramic dielectric with stoichiometry given by: $M^{(I)}_{(1-x-y-z)}M^{(II)}_{(x)}M^{(III)}_{(y)}M^{(IV)}_{(z)}Zr_{(1-a-b)}Hf_{(b)}Ti_{(a)}O_3$, wherein, Zr is zirconium, Hf is hafnium, Ti is titanium, O is oxygen, and $M^{(I)}$, $M^{(II)}$, $M^{(III)}$, $M^{(IV)}$ are additional metal oxide components that form a thermodynamically stable perovskite crystal and x, y, and z, are fractional molar percentages forming ratios such that the sum of all $M^{(I)}$, $M^{(II)}$, $M^{(III)}$, $M^{(IV)}$ elemental components satisfies the constraint: $(1-x-y-z)+(x+y+z)=1$ and, $(1-a-b)+(a+b)=1$. The high energy density electroceramic dielectric may have additional metal oxide components ($M^{(I)}$, $M^{(II)}$, $M^{(III)}$, $M^{(IV)}$) comprise scandium (Sc), vanadium (V), chromium (Cr), manganese (Mn), zinc (Zn), niobium (Nb), molybdenum (Mo), tantalum (Ta), tungsten (W), lanthanum (La), cerium (Ce), praseodymium (Pr) neodymium (Nd), samarium (Sm), europium (Eu), terbium (Tb), dysprosium (Dy), holmium (Ho), ytterbium (Yb), indium (In), tin (Sn), lead (Pb) or bismuth (Bi). The circuit module may have the capacitive circuit element with a physical dimension less than ½0th of the guided wavelength of an operating frequency in excess of 3 GHz, preferably in excess of 300 GHz, and most preferably in excess of 1 THz. The circuit module may have the capacitive circuit element with a maximal physical dimension not greater than 10 s of micron, preferably not greater than 1 s of micron, and more preferably less than 1 micron.

The module may have the high energy density electroceramic dielectric of an inductive element comprise a garnet having relative magnetic permeability $\mu_R \geq 10$ and loss tangent tan δ≤10⁻³ at GHz frequencies. The inductive element may have the garnet adopt either rhombic dodecahedron or trapezohedron crystal structures, or a combination of the two, and has the following chemical formula, $A_3B_2(SiO_4)_3$, wherein Group A metal oxides have equal molar concentration to silicon oxide and group B metal oxides have molar concentration that is ⅔ the molar concentration of silicon oxide; and, preferred group A metal oxides include: calcium oxide (CaO), magnesium oxide (MgO), iron oxide (FeO), and manganese oxide (MnO), and, preferred group B metal oxides include: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The garnet may have the high energy density electroceramic dielectric include a controlled microstructure with uniform grain size ranging from 10 nm to 25 μm, preferably from 250 nm to 5 μm.

The embedded passive filtering network may have the termination circuit comprise: a simple parallel termination; a simple parallel fly-by termination; an active parallel termination, a Thevenin termination, a series RC parallel termination or a differential pair fly-by termination. The embedded passive filtering network may have the termination circuit comprise planar capacitive, inductive, and resistive circuit elements within the I/O link with a stub length less than 0.5 cm. The embedded passive filtering network may have the termination circuit comprise capacitive, inductive, and resistive circuit elements that embedded within an integrated via and have zero stub length.

The embedded passive filtering network may have the equalization circuitry comprise planar capacitive, inductive, and resistive circuit elements within the I/O link with a stub length less than 0.5 cm. The embedded passive filtering network may have the equalization circuit comprise capacitive, inductive, and resistive circuit elements that are embedded within an integrated via and have zero stub length. The embedded passive filtering network may have the clock or data recovery circuitry comprises planar capacitive, inductive, and resistive circuit elements within the I/O link and a stub length less than 0.5 cm. The embedded passive filtering network may have the clock or data recovery circuitry comprise capacitive, inductive, and resistive circuit elements that are embedded within an integrated via and have zero stub length.

The circuit module may have the signal control planes modulate active switching elements embedded within the active semiconductor layer. The circuit module may have a plurality of channel links distributed across a across a plurality of data signal planes embedded within the multilayer surface interface. The circuit module may have the plurality of channel links electrically isolated from one another by ground planes and ground walls, lire circuit module may have the high peak bandwidth I/O channel be a high interconnection density I/O channel has a linear escape density in excess of 200 IO/mm/layer, preferably in excess of 1,000 IO/mm/layer. The circuit module may have the equalization circuitry configured to have MAXIM topology. The circuit module may have the equalization circuitry configured to have AGILENT topology. The circuit module may have the high-peak bandwidth I/O channels further comprise dielectric waveguides, preferably consisting essentially of low-permittivity/ultra-low loss amorphous silica dielectric and the conductive means is configured as send/receive radiating elements.

A further embodiment of the present invention provides a resonant gate transistor embedded within a first region of a first region of an active semiconductor surface on a semiconducting substrate that is in electrical communication with a multilayer surface interface comprising high-peak bandwidth I/O channels, wherein: one or more inductive elements are electrically inserted within the transistor's gate electrode; the gate electrode has elongated gate width having physical dimension that exceeds the gate length by ≥50×, preferably ≥1,000×, and most preferably exceeds the gate length by 500,000× such that the large gate capacitance and elongated gate width reduces the transistor's On-Resistance to negligible values; the inductance of the inductive elements causes the large capacitance to resonate at pre-determined frequencies thereby allowing the gate to switch or amplify large currents with high power efficiency at pre-determined resonant frequencies; and, the high-peak bandwidth I/O channels further comprise low permittivity, ultra-low loss dielectric and high energy density electroceramic dielectric that polarizes and depolarizes with femto-second response times.

The resonant gate transistor may have one or more inductive and other passive circuit elements electrically inserted within the transistor's gate electrode to form a passive filtering network that causes the resonant gate transistor to resonate and amplify or switch signals over a band of pre-determined frequencies. The one or more inductive elements may be embedded within the gate electrode and located within the first region of the active semiconductor surface. The inductive and other passive circuit elements may be embedded within the gate electrode and located within the first region of the active semiconductor surface. The one or more inductive elements may be embedded within the multilayer surface interface of a high-peak bandwidth I/O channel and electrically inserted into the gate electrode by means of a via. The inductive and other passive circuit elements may be embedded within the multilayer surface interface of a high-peak bandwidth I/O channel and electrically inserted into the gate electrode by means of a via.

The resonant gate transistor may be embedded within a circuit module. The circuit module may have a plurality of passive filtering networks are integrated within signal data planes or vias in the high-peak bandwidth I/O channel and an active switching element embedded within the active semiconductor surface is used to select which filtering function is inserted into the resonant response of the resonant gate transistor. The resonant gate transistor may be embedded within a first region of the active semiconductor surface and forms an electrical interface with another resonant gate transistor in a second region of the active semiconductor surface through the high-peak bandwidth I/O channel.

The may comprise a fully integrated gyrator, further comprising the active circuitry of an Op-Amp and inverting passive circuitry. The fully integrated gyrator may be electrically inserted within the gate electrode of the resonant gate transistor. The fully integrated gyrator may have the gyrator's inverting passive circuit be a capacitor. The fully integrated gyrator's inverting passive circuit may comprise a complex passive filtering network. The fully integrated gyrator may function as an amplifying equalization circuit.

The circuit module may have the active Op-Amp circuitry for the fully integrated gyrator be co-located with the active circuitry resonant gate transistor in a first region of the active semiconductor surface and the inverting passive circuitry for the fully integrated gyrator may be located in multilayer surface interface of the high peak bandwidth I/O channel. The inverting passive circuitry may comprise planar passive circuit components. The inverting passive circuitry may comprise fully integrated vias.

The circuit module of Claim 141, wherein the active for the resonant gate transistor is located in a first region of the active semiconductor surface and the active Op-Amp circuitry for the fully integrated gyrator is located in a second region of the active semiconductor surface and tire inverting passive circuitry is located within a multilayer surface interface that forms an electrical interface between the resonant gate transistor and the fully integrated gyrator through a high-peak bandwidth I/O channel.

The circuit module may have the second region of the active semiconductor surface integrated on a second semiconductor device that is bonded to the multilayer surface interface formed on a semiconductor substrate that comprises the first region of the active semiconductor surface such that the first region of the active semiconductor surface on the semiconductor substrate forms an electrical interface to the second region of the active semiconductor surface is integrated on a second semiconductor device through a high-peak bandwidth I/O channel.

The circuit module may have the second region of the active semiconductor surface integrated on a second semiconductor device in vertical alignment with the first region of the active semiconductor surface on the semiconductor substrate. The circuit module may have the low permittivity, ultra-low loss dielectric comprise amorphous silica. The circuit module may have the high energy density electroceramic dielectric of a capacitive circuit element comprise a crystalline lattice wherein its unit cell with a median atomic mass greater than 25 amu, preferably greater than 70 amu. The high energy density electroceramic dielectric of a capacitive circuit element may have a relative permittivity $\varepsilon_R$ above 70, preferably a relative permeability in the range of $200 \leq \varepsilon_R \leq 800$ The high energy density electroceramic dielectric may have stoichiometry given by: $M^{(I)}_{(1-x-y-z)}M^{(II)}_{(x)}M^{(III)}_{(y)}M^{(IV)}_{(z)}Zr_{(1-a-b)}Hf_{(b)}Ti_{(a)}O_3$, wherein, Zr is zirconium, Hf is hafnium, Ti is titanium, O is oxygen, and $M^{(I)}$, $M^{(II)}$, $M^{(III)}$, $M^{(IV)}$ are additional metal oxide components that form a thermodynamically stable perovskite crystal and x, y, and z, are fractional molar percentages forming ratios such that the sum of all $M^{(I)}$, $M^{(II)}$, $M^{(III)}$, $M^{(IV)}$ elemental components satisfies the constraint: $(1-x-y-z)+(x+y+z)=1$, and, $(1-a-b)+(a+b)=1$. The high energy density electroceramic dielectric may have the additional metal oxide components ($M^{(I)}$, $M^{(II)}$, $M^{(III)}$, $M^{(IV)}$) comprise scandium (Sc), vanadium (V), chromium (Cr), manganese (Mn), zinc (Zn), niobium (Nb), molybdenum (Mo), tantalum (Ta), tungsten (W), lanthanum (La), cerium (Ce), praseodymium (Pr) neodymium (Nd), samarium (Sm), europium (Eu), terbium (Tb), dysprosium (Dy), holmium (Ho), ytterbium (Yb), indium (In), tin (Sn), lead (Pb) or bismuth (Bi).

The circuit module may have the capacitive circuit element with a physical dimension less than 1/20th of the guided wavelength of an operating frequency in excess of 3 GHz, preferably in excess of 300 GHz, and most preferably in excess of 1 THz. The capacitive circuit element may have maximal physical dimension not greater than 10 s of micron, preferably not greater than 1s of micron, and more preferably less than 1 micron.

The circuit module may have the high energy density electroceramic dielectric of an inductive element comprise a garnet having relative magnetic permeability $\mu_R \geq 10$ and loss tangent $\tan \delta \leq 10^{-3}$ at GHz frequencies. The garnet may adopt either rhombic dodecahedron or trapezohedron crystal structures, or a combination of the two, and has the following chemical formula, $A_3B_2(SiO_4)_3$, wherein Group A metal oxides have equal molar concentration to silicon oxide and group B metal oxides have molar concentration that is ⅔ the molar concentration of silicon oxide; and, preferred group A metal oxides include: calcium oxide (CaO), magnesium oxide (MgO), iron oxide (FeO), and manganese oxide (MnO), and, preferred group B metal oxides include: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The high energy density electroceramic dielectric may have controlled microstructure with uniform grain size ranging from 10 nm to 25 µm, preferably from 250 nm to 5 µm.

A bonded pair of semiconductor circuit modules may each comprise a resonant gate transistor embedded within an active semiconductor surface on each semiconductor module that is in electrical communication with a multilayer surface interface comprising high-peak bandwidth I/O channels, wherein: one or more inductive elements are electrically inserted within the transistors' gate electrodes; the gate electrodes have elongated gate width having physical dimension that exceeds the gate length by ≥50×, preferably ≥1,000×, and most preferably exceeds the gate length by 500,000× such that the large gate capacitance and elongated gate widths reduce the transistors' On-Resistance to negligible values; the inductance of the inductive elements causes the large capacitance to resonate at pre-determined frequencies thereby allowing the gate to switch or amplify huge currents with high power efficiency at pre-determined resonant frequencies; the high-peak bandwidth I/O channels further comprise low permittivity, ultra-low loss dielectric and high energy density electroceramic dielectric that polarizes and depolarizes with femto-second response times; the high peak bandwidth I/O channels further comprise passive filtering networks are embedded on signal data planes or in fully integrated vias within the multilayer surface interface of each semiconductor circuit module forming the bonded pair; an active interfacial circuit layer is located at the bonding interface, which comprises active Op-Amp circuitry and forms fully integrated gyrator circuits with inverting passive circuitry embedded within high-peak bandwidth I/O channels of each semiconductor circuit module; and, electrical communications and power interface is created to modulate resonant gate transistors and other functions in each of the semiconductor circuit modules forming the bonded pair.

The resonant gate transistor may have one or more inductive and other passive circuit elements electrically inserted within the transistor's gate electrode to form a passive filtering network that causes the resonant gate transistor to resonate and amplify or switch signals over a band of pre-determined frequencies. The bonded pair of semiconductor circuit modules may have a fully integrated gyrator function as an amplifying equalization circuit. The high-peak bandwidth I/O channels may further comprise clock or data recovery circuits. The bonded pair of semiconductor circuit modules may have high energy density electroceramic dielectric forming passive circuit elements with physical dimension less than 1/20th of the guided wavelength of an operating frequency in excess of 3 GHz, preferably in excess of 300 GHz, and most preferably in excess of 1 THz.

The bonded pair of semiconductor circuit may have one of the semiconductor circuit modules function as a wireless transceiver within a satellite or terrestrial telecommunications network. One of the semiconductor circuit modules may function as an optical or electro-optical transceiver within a space-based satellite system or a terrestrial fiber-optic telecommunications network. One of the semiconductor circuit modules may function as a processor unit within a server farm or server farm network. The bonded pair of semiconductor circuit modules may have the processor unit be a hybrid computing module. One of the semiconductor circuit modules may function as a wireless transceiver in a mobile device that interfaces with a regional or global server farm network.

A method for manufacturing a high peak bandwidth I/O channel utilizing liquid chemical deposition methods and back-end-of-line techniques to integrate high energy density electroceramic dielectric, conductive means, and low permittivity/ultra-low loss dielectric, preferably amorphous silica dielectric, within a multilayer surface interface having submicron feature size formed on a substrate, wherein the multilayer surface interface comprises ground, power, and signal data planes.

The substrate may be a semiconductor.

The semiconductor substrate may comprise active circuitry integrated within an active layer of the semiconductor substrate surface.

The active circuitry may include a high peak bandwidth I/O channel that may comprise a signal control plane that further comprises: a first layer of low permittivity/ultra-low loss dielectric, conductive means layer, and a second layer of low permittivity/ultra-low loss dielectric is formed, wherein openings etched within the first layer of low permittivity/ultra-low loss dielectric to provide a via path and optional ground wall connections to the active layer of the semiconductor substrate surface, the conductive means layer is applied and photo-lithographically patterned to form an electrical interface with active circuitry within the active layer of the semiconductor substrate surface through the openings etched within the first layer of low permittivity/ultra-low loss dielectric, the applied conductive means layer is optionally polished, the second layer of low permittivity/ultra-low loss dielectric is formed, and, openings are etched into the second layer of low permittivity/ultra low-loss dielectric to provide a via opening and optional ground wall connections to the applied conductive means forming an electrical interface with active circuitry within the active layer of the semiconductor substrate and the via openings are subsequently filed by conductive means to complete electrical interface to subsequent layers in the multilayer surface interface.

The method may have one or more ground planes formed by applying conductive means to the substrate or a previously formed layer of low permittivity/ultra-low loss dielectric.

The conductive means forming the ground plane layer may be photo-lithographically patterned to meet a specific design objective for the high peak bandwidth I/O channel or to create an opening needed to form an electrical interface through a via with conductive means on other layers within the multilayer surface interface.

The signal data plane may comprise: first and second layers of low permittivity/ultra-low loss dielectric, high energy density electroceramic embedded within the first and second layers of low permittivity/ultra-low loss dielectric, first and second conductive means layers that form signal traces and an electrical interface with ground planes, other signal data planes, and a power plane contained within the multilayer surface interface, and a second ground plane that is manufactured by: forming a first layer of low permittivity/ultra-low loss dielectric upon a ground plane layer formed on a substrate or upon previously formed ground plane layers within a multilayer surface interface, etching photo-lithographically patterned openings within the first layer of low permittivity/ultra-low loss dielectric; optionally etching an opening within the first layer of low permittivity/ultra-low loss dielectric to expose the ground plane layer, forming high energy density electroceramic dielectric in the additional openings to integrate passive circuit elements within the first layer of low permittivity/ultra-low loss dielectric in the signal data plane, optionally polishing the first layer of low permittivity/ultra-low loss dielectric and high energy density electroceramic dielectric, etching additional openings in the first layer of low permittivity/ultra-low loss dielectric, forming and photo-lithographically patterning the first conductive means layer to form signal traces between, or conductive traces within, passive circuit elements and to form vias or ground walls that establish an electrical interface with the ground plane layer and other signal data planes or power planes previously formed within the multilayer interface located beneath the ground plane, optionally polishing the first conductive means layer, forming the second layer of low permittivity/ultra-low loss dielectric, etching photo-lithographically patterned openings within the second layer of low permittivity/ultra-low loss dielectric; forming high energy density electroceramic dielectric in tire additional openings to integrate passive circuit elements within the second layer of low permittivity/ultra-low loss dielectric in the signal data plane, optionally polishing the second layer of low permittivity/ultra-low loss dielectric and high energy density electroceramic dielectric, etching additional openings in the second layer of low permittivity/ultra-low loss dielectric, forming and photo-lithographically patterning the second conductive means layer to form a ground plane and vias or ground walls that establish an electrical interface between with the signal data plane and other signal data planes, ground planes, or power planes previously formed or to be formed within the multilayer interface above the signal data plane.

The method may include a differential pair conductor formed within a signal data plane by inserting a third layer of low permittivity/ultra-low loss dielectric and an additional signal trace formed in a third conductive means layer that photo-lithographically patterned between the first and second low permittivity/ultra-low loss layers that further comprise high energy density electroceramic dielectric.

The method may include voids photo-lithographically patterned within the first and second conductive means layers in locations that form a via pad, and high energy density electroceramic dielectric applied and optionally polished to fill the voids and form an integrated via. The method may include passive circuit elements formed as planar passive circuit elements. The passive circuit elements may be integrated within a via. The method may provide passive circuit elements configured to function passive as filtering networks. The passive filtering network may be an equalization circuit. The method may have the multilayer surface interface formed on a semiconductor substrate that comprises active circuitry integrated within an active layer of the semiconductor substrate surface. The method may have the multilayer interface comprise a signal control plane and the passive filtering network is an amplifying equalization circuit. The active circuitry may comprise an Op-Amp. The multilayer surface interface may comprise a fully integrated gyrator. The active circuitry may comprise a resonant gate transistor.

The method of may have the high energy density electroceramic dielectric comprise a crystalline lattice wherein its unit cell with a median atomic mass greater than 25 amu, preferably greater than 70 amu. The method may include the high energy density electroceramic dielectric of a capacitive circuit element having a relative permittivity $\varepsilon_R$ above 70, preferably a relative permeability in the range of $200 \leq \varepsilon_R \leq 800$. The method may have the high energy density electroceramic dielectric has stoichiometry given by: $M^{(I)}_{(1-x-y-z)} M^{(II)}_{(x)} M^{(III)}_{(y)} M^{(IV)}_{(z)} Zr_{(1-a-b)} Hf_{(b)} Ti_{(a)} O_3$, wherein, Zr is zirconium, Hf is hafnium, Ti is titanium, O is oxygen, and $M^{(I)}$, $M^{(II)}$, $M^{(III)}$, $M^{(IV)}$ are additional metal oxide components that form a thermodynamically stable perovskite crystal and x, y, and z, are fractional molar percentages forming ratios such that the sum of all $M^{(I)}$, $M^{(II)}$, $M^{(III)}$, $M^{(IV)}$ elemental components satisfies the constraint: $(1-x-y-z)+(x+y+z)=1$, and, $(1-a-b)+(a+b)=1$. The additional metal oxide components ($M^{(I)}$, $M^{(II)}$, $M^{(III)}$, $M^{(IV)}$) may comprise scandium (Sc), vanadium (V), chromium (Cr), manganese (Mn), zinc (Zn), niobium (Nb), molybdenum (Mo), tantalum (Ta), tungsten (W), lanthanum (La), cerium (Ce), praseodymium (Pr) neodymium (Nd), samarium (Sm), europium (Eu), terbium (Tb), dysprosium (Dy), holmium (Ho), ytterbium (Yb), indium (In), tin (Sn), lead (Pb) or bismuth (Bi). The method may include the high energy density electroceramic dielectric having physical dimension less than 1/20th of the guided wavelength of an operating frequency in excess of 3 GHz, preferably in excess of 300 GHz, and most preferably in excess of 1 THz. The method may include the photo-lithographically patterned openings within the first layer and second layer of low permittivity/ultra-low loss dielectric having maximal physical dimension not greater than 10 s of micron, preferably not greater than 1 s of micron, and more preferably less than 1 micron. The method may include the high energy density electroceramic dielectric comprising a garnet having relative magnetic permeability $\mu_R \geq 10$ and loss tangent $\tan \delta \leq 10^{-3}$ at GHz frequencies. The garnet may adopt either rhombic dodecahedron or trapezohedron crystal structures, or a combination of the two, and has the following chemical formula $A_3 B_2 (SiO_4)_3$, wherein Group A metal oxides have equal molar concentration to silicon oxide and group B metal oxides have molar concentration that is 2/3 the molar concentration of silicon oxide; and, preferred group A metal oxides include: calcium oxide (CaO), magnesium oxide (MgO), iron oxide (FeO), and manganese oxide (MnO), and, preferred group B metal oxides include: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The high energy density electroceramic dielectric may have a controlled microstructure with uniform grain size ranging from 10 nm to 25 µm, preferably from 250 nm to 5 µm.

An even further embodiment of the present invention provides a networked computing system including a telecommunications system that contains network nodes and manages the flow of data between and within server farms, wherein the hardware forming the telecommunications system, transceiver circuits within network nodes, and server farms comprise hybrid computing modules that comprise: semiconductor die that serve all functions needed to support networked computing, wherein, the semiconductor die are mounted on a substrate that forms an electrical interface between the semiconductor die in the hybrid computing module, and, the substrate comprises a multilayer surface interface that further comprises a high peak bandwidth I/O channel comprising: low permittivity/ultra-low loss dielectric; conductive means used to form ground planes, power planes, and signal data planes and electrical interface between the ground planes, power planes, and signal data planes; wherein, the signal data planes further comprise high energy density electroceramic dielectric embedded within layers of low permittivity/ultra-low loss dielectric and photo-lithographically patterned to form passive circuit elements configured to function as a passive filtering network; and, wherein high energy density electroceramic dielectric forming capacitive passive circuit elements has a dielectric response that polarizes and de-polarizes on femto-second time scales and maintains physical dimension less than 1/20th of the guided wavelength of a system operating frequency in excess of 3 GHz, preferably in excess of 300 GHz, and most preferably in excess of 1 THz.

The substrate may be a semiconductor carrier wherein the multilayer layer interface comprises a control signal layer and active circuitry embedded within an active semiconductor layer. The networked computing system may have a plurality of semiconductor die bonded within a chip slack comprising an interposer circuit. The networked computing system may have the interposer circuit comprise a high peak bandwidth I/O channel. The interposer circuit may comprise a semiconductor substrate and a multilayer layer interface comprises a control signal layer and active circuitry embedded within an active semiconductor layer. The networked computing system may have the hybrid computing module comprise a multilayer layer interface having a control signal layer and active circuitry embedded within an active semiconductor layer. The networked computing system may have the active circuitry comprise a resonant gate transistor. The active circuitry may comprise an operational amplifier. The hybrid computing module may comprise a fully integrated gyrator.

The networked computing system may have the high peak bandwidth I/O channels form an electrical interface between the semiconductor die and an electro-optic transceiver that further may comprise high peak bandwidth I/O channels within its internal circuitry that encodes electronic signal data processed by the hybrid computing module into optical signal data transmitted from the hybrid computing module though a local optical communications bus and decodes optical signal data received by the hybrid computing module from the local optical communications bus into electronic signal data to be processed by the hybrid computing module. The electro-optic transceiver may comprise a material layer forming a 3D quantum gas. The networked computing system may include the telecommunications system forming a regional network comprising wireless, optical and satellite telecommunications systems. The telecommunications system may form a global network comprising wireless, optical and satellite telecommunications systems. The passive filtering network may be configured to function as an equalization circuit. The networked computing system may include the equalization circuit enabling clock and data recovery. The passive filtering network may be formed by planar passive circuit elements. The passive filtering network may be embedded within an integrated via. The passive filtering network may be an amplifying equalization circuit. The telecommunications systems may interact with mobile computing devices that comprise circuit modules having high peak bandwidth I/O channels.

A still further embodiment of the present invention provides an integrated via that comprises a via contact pad in electrical communication with an input or output electrode and an I/O link embedded within a multilayer surface interface formed on substrate, wherein at least one passive circuit element comprising high energy density electroceramic dielectric is inserted as an arcuate construction around the circumference of the via contact pad to form a capacitive, inductive, or resistive passive circuit element electrically connected in series or in parallel with a ground plane, a power plane, or an I/O link embedded within the signal data plane on which the via contact pad is located, or an I/O link on other signal data planes located above or below the via contact pad within the multilayer surface interface with which the via contact pad forms an electrical connection, and, high energy density electroceramic dielectric forming a capacitive passive circuit element has a dielectric response that polarizes and de-polarizes on femto-second time scales and maintains physical dimension less than 1/20th of the guided wavelength of a system operating frequency in excess of 3 GHz, preferably in excess of 300 GHz, and most preferably in excess of 1 THz.

The at least one passive circuit element may be part of a passive filtering network. The passive filtering network may comprise planar passive components. The passive filtering network may comprise a plurality of integrated vias. The integrated via may include a via contact pad in electrical communication with a semiconductor die. The substrate may be a semiconductor substrate comprising active circuitry embedded with a semiconductor surface active layer. The integrated via may have the integrated via in electrical communication with the active circuitry. The active circuitry may be a resonant gate transistor. The active circuitry may be an operational amplifier. The integrated via may be part of a fully integrated gyrator. The active circuitry may be an active switching element. The passive filtering network may form a termination circuit. The passive filtering network may form an equalization circuit. The passive filtering network may resonate at a select frequency or over predetermined frequency bands. The passive filtering network may be part of a clock or data recovery circuit, lire via contact pad may comprise a plurality of passive circuit elements that are electrically connected in series within the via contact pad. The via contact pad may comprise a plurality of passive circuit elements wherein at least two passive circuit elements are electrically connected in parallel through a branching point. The at least one passive circuit element may be part of a passive filtering network and the integrated via may form an amplifying equalization circuit.

The integrated mat have the high energy density electroceramic dielectric comprise a crystalline lattice wherein its unit cell with a median atomic mass greater than 25 amu, preferably greater than 70 amu. The high energy density electroceramic dielectric of a capacitive circuit element may have a relative permittivity KR above 70, preferably a relative permeability in the range of $200 \leq \varepsilon_R \leq 800$. The high energy density electroceramic dielectric may have stoichiometry given by: $M^{(I)}_{(1-x-y-z)}M^{(II)}_{(x)}M^{(III)}_{(y)}M^{(IV)}_{(z)}Zr_{(1-a-b)}Hf_{(b)}Ti_{(a)}O_3$, wherein, Zr is zirconium, Hf is hafnium, Ti is titanium, O is oxygen, and $M^{(I)}$, $M^{(II)}$, $M^{(III)}$, $M^{(IV)}$, are additional metal oxide components that form a thermodynamically stable perovskite crystal and x, y, and z, are fractional molar percentages forming ratios such that the sum of all $M^{(I)}$, $M^{(II)}$, $M^{(III)}$, $M^{(IV)}$ elemental components satisfies the constraint: $(1-x-y-z)+(x+y+z)=1$, and, $(1-a-b)+(a+b)=1$. The integrated via of Claim 238, wherein the additional metal oxide components ($M^{(I)}$, $M^{(II)}$, $M^{(III)}$, $M^{(IV)}$) comprise scandium (Sc), vanadium (V), chromium (Cr), manganese (Mn), zinc (Zn), niobium (Nb), molybdenum (Mo), tantalum (Ta), tungsten (W), lanthanum (La), cerium (Ce), praseodymium (Pr) neodymium (Nd), samarium (Sm), europium (Eu), terbium (Tb), dysprosium (Dy), holmium (Ho), ytterbium (Yb), indium (In), tin (Sn), lead (Pb) or bismuth (Bi).

The integrated via may have the high energy density electroceramic dielectric comprise a garnet having relative magnetic permeability $\mu_R \geq 10$ and loss tangent $\tan \delta \leq 10^{-3}$ at GHz frequencies. The garnet may adopt either rhombic dodecahedron or trapezohedron crystal structures, or a combination of the two, and has the following chemical formula $A_3B_2(SiO_4)_3$, wherein Group A metal oxides have equal molar concentration to silicon oxide and group B metal oxides have molar concentration that is ⅔ the molar concentration of silicon oxide; and, preferred group A metal oxides include: calcium oxide (CaO), magnesium oxide (MgO), iron oxide (FeO), and manganese oxide (MnO), and, preferred group B metal oxides include: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). The high energy density electroceramic dielectric may have a controlled microstructure with uniform grain size ranging from 10 nm to 25 μm, preferably from 250 nm to 5 μm.

BRIEF DESCRIPTION OF THE DRAWINGS

The present invention is illustratively shown and described in reference to the accompanying drawings, in which:

FIGS. 3A thru 3F depict various factors that contribute to insertion loss in an I/O channel.

FIGS. 6A,6B,6C illustrate the structural architecture of a high peak bandwidth I/O channels and its construction.

FIGS. 9A thru 9F illustrate means to embed passive equalization circuitry within an I/O link.

DETAILED DESCRIPTION OF THE DRAWINGS

Figure 1:
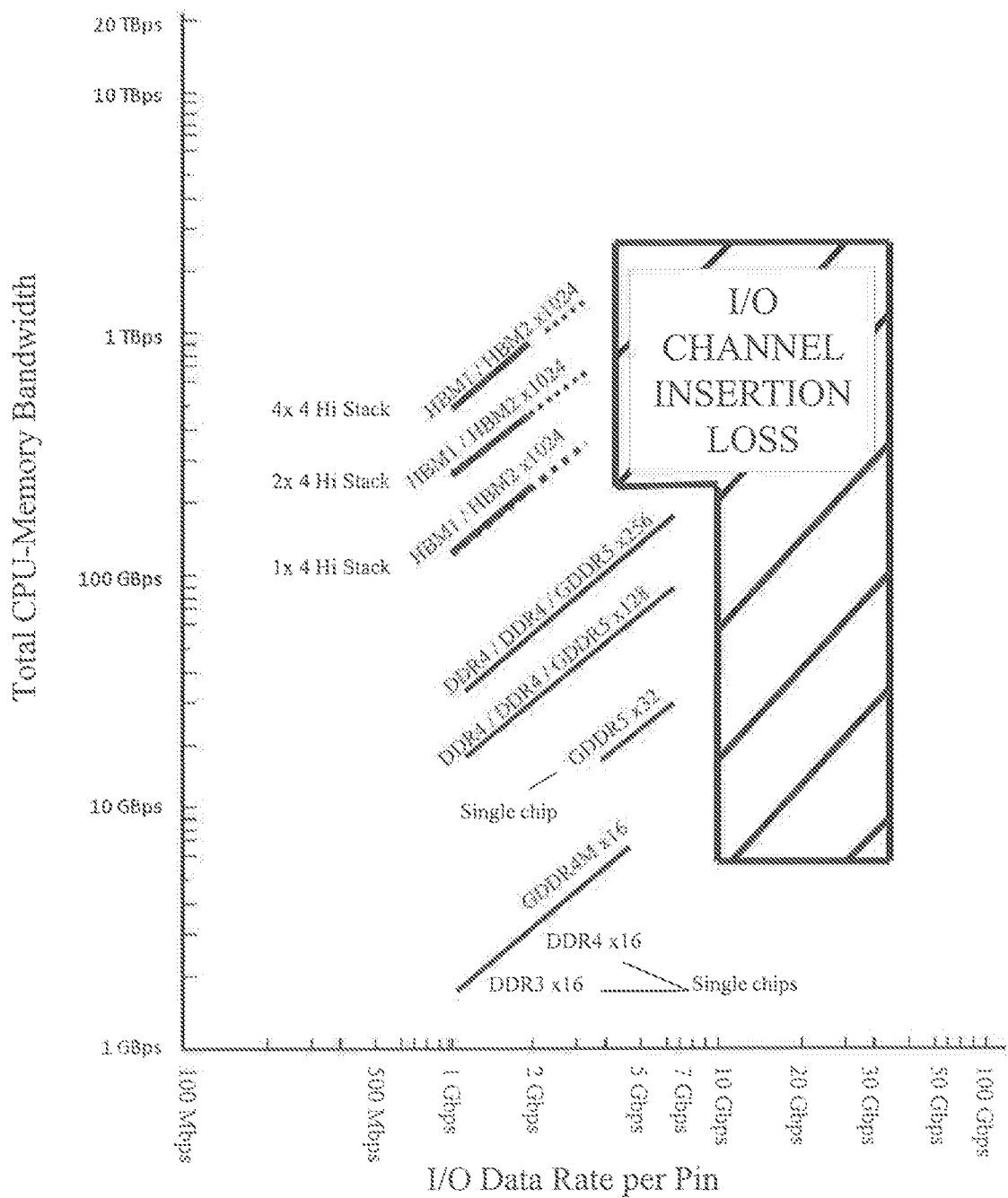
FIG. 1 depicts the relationship between peak bandwidth, the number of I/O channels forming a communications link and the data rate within the channel.

The present invention is illustratively described above in reference to the disclosed embodiments. Various modifications and changes may be made to the disclosed embodiments by persons skilled in the art without departing from the scope of the present invention as defined in the appended claims.

This application incorporates by reference all matter contained in de Rochemont U.S. Pat. No. 7,405,698 entitled "CERAMIC ANTENNA MODULE AND METHODS OF MANUFACTURE THEREOF" (the '698 application), de Rochemont U.S. Pat. No. 8,715,839 filed Jun. 30, 2006, entitled "ELECTRICAL COMPONENT AND METHOD OF MANUFACTURE" (the '839 application), de Rochemont U.S. Pat. No. 8,350,657 (the '657 application), filed Jan. 6, 2007 entitled "POWER MANAGEMENT MODULE AND METHODS OF MANUFACTURE", de Rochemont U.S. Ser. No. 14/560,935, (the '935 application), filed Dec. 4, 2014 entitled "POWER MANAGEMENT MODULE AND METHODS OF MANUFACTURE", de Rochemont and Kovacs, U.S. Pat. No. 8,715,814, "LIQUID CHEMICAL DEPOSITION PROCESS APPARATUS AND EMBODIMENTS", (the '814 application) and U.S. Pat. No. 8,354,294 (the '294 application), de Rochemont, "MONOLITHIC DC/DC POWER MANAGEMENT MODULE WITH SURFACE FET", U.S. Pat. No. 8,552,708 (the '708 application), de Rochemont, U.S. Pat. No. 8,749,054, "SEMICONDUCTOR CARRIER WITH VERTICAL POWER FET MODULE", (the '054 application), de Rochemont U.S. Pat. No. 9,023,493, "CHEMICALLY COMPLEX ABLATIVE MAX-PHASE MATERIAL AND METHOD OF MANUFACTURE", (the '493 application), de Rochemont U.S. Pat. Nos. 8,779,489 and 9,153,532, "POWER FET WITH A RESONANT TRANSISTOR GATE", (the '489 and '532 application), de Rochemont U.S. Pat. No. 9,123,768, "SEMICONDUCTOR CHIP CARRIERS WITH MONOLITHICALLY INTEGRATED QUANTUM DOT DEVICES AND METHOD OF MANUFACTURE THEREOF", (the '768 application), de Rochemont U.S. Pat. No. 8,952,858, "FREQUENCY-SELECTIVE DIPOLE ANTENNAS", (the '858 application), de Rochemont and Kovacs U.S. Pat. No. 9,348,385, "HYBRID COMPUTING MODULE" (the '385 application), de Rochemont, U.S. Pat. No. 9,490,414, "FULLY INTEGRATED THERMOELECTRIC DEVICES AND THEIR APPLICATION TO AEROSPACE DE-ICING SYSTEMS", (the '414 application), de Rochemont U.S. Ser. No. 15/958,706, "RESONANT HIGH ENERGY DENSITY STORAGE DEVICE", (the '706 application), de Rochemont, U.S. Ser. No. 15/99,234, HIGH SPEED SEMICONDUCTOR CHIP STACK, (the '234 application), and de Rochemont U.S. Ser. No. 16/403,411, "HIGH SPEED/LOW POWER SERVER FARMS AND SERVER NETWORKS", (the '411 application).

The '698 application instructs on methods and embodiments that provide meta-material dielectrics, including artificial magnetic ground planes, that have dielectric inclusion(s) with performance values that remain stable as a function of operating temperature. This is achieved by controlling the microstructure within dielectric inclusion(s) to nanoscale dimensions so they uniformly measure less than or equal to 50 nm. de Rochemont '839 instructs the integration of passive components that hold performance values that remain stable with temperature in printed circuit boards, semiconductor chip packages, wafer-scale SoC die, and power management systems, de Rochemont '159 instructs on how LCD is applied to form passive filtering networks and quarter wave transformers in radio frequency or wireless applications that are integrated into a printed circuit board, ceramic package, or semiconductor component, de Rochemont '657 instructs methods to form an adaptive inductor coil that can be integrated into a printed circuit board, ceramic package, or semiconductor device. de Rochemont et al. '814 discloses the liquid chemical deposition (LCD) process and apparatus used to produce macroscopically large compositionally complex materials, that consist of a theoretically dense network of polycrystalline microstructures comprising uniformly distributed grains with maximum dimensions less titan 50 nm. Complex materials are defined to include semiconductors, metals or super alloys, and metal oxide ceramics, de Rochemont '814 and '708 instruct on methods and embodiments related to a fully integrated low EMI, high power density inductor coil and/or high power density power management module, de Rochemont '489 and '532 instruct on methods to integrate a field effect transistor that switch arbitrarily large currents at arbitrarily high speeds with minimal On-resistance into a fully integrated silicon chip carrier, de Rochemont '768 instructs methods and embodiments to integrated semiconductor layers that produce a 3-dimensional electron gas within semiconductor chip carriers and monolithically integrated microelectronic modules, de Rochemont '302 instructs methods and embodiments to optimize thermoelectric device performance by integrating chemically complex semiconductor material having nanoscale microstructure, de Rochemont '858 instructs means to form a circuit resonant element by folding arms of dipole antenna or transmission line to induce inductive and capacitive loads through current vector coupling. The various embodiments and means claimed in the present application are constructed using liquid chemical deposition (LCD) methods instructed by de Rochemont et al. '814. de Rochemont '706 instructs the use of an electroceramic dielectric whose polarization response responds in phase with an applied electrical stimulus above femto-second ($10^{-15}$ seconds), and the incorporation of the electroceramic dielectric within a resonant circuit, de Rochemont '234 instructs means to terminate transmission lines at a via by integrating high energy density electroceramic dielectric whose properties remain stable with temperature and time at time scales greater than femto-second time scales to minimize spurious signals generated at through silicon vias (TSVs), but it does not instruct means to form equalizing circuitry or dock data recovery circuitry or to minimize inter-symbol-interference (ISI) within a high-speed chip stack, de Rochemont '411 instructs means to improve power efficiency of a server farm and regional/global network of server farms, does not instruct means to form equalizing circuitry or clock data recovery circuitry or to minimize inter-symbol-interference (ISI) within a high-speed chip stack.

LCD methods permit the integration of high chemical complexity electroceramic dielectrics on a buried microelectronic layer with the requisite chemical precision to make the finished product economically viable. It enables chemically complex electroceramic dielectrics to be selectively deposited on a semiconductor surface at temperatures that do not damage embedded active circuitry. It further enables the integration of chemically complex electroceramic dielectrics with atomic scale chemical uniformity and uniform microstructure, including microstructure that has nanoscale uniformity irrespective of electroceramic dielectric chemical complexity.

An I/O channel is to mean a conductive link between the output port of a first semiconductor chip 1 or stack of chips 1 and the input port of a second semiconductor chip 2 and the intervening circuitry and waveguide materials necessary to optimize the integrity of signals transmitted between the two ports.

Reference is now made to FIGS. 3A,3B,3C,3D,3E and Table I to provide background for unique embodiments of the invention that minimize insertion loss within an I/O channel in order to drive link data rates at a higher Nyquist frequency or I/O Data Rate per Pin. The Nyquist frequency is half the sampling rate of a discrete-time system and is a measure of the upper bound for the symbol rate across a bandwidth-limited channel such as a pass band channel, limited radio frequency band, or a frequency division multiplex channel. A 12 GHz Nyquist translates to a 24 Gbps I/O data rate per pin. A 24 GHz Nyquist translates to a 48 Gbps data rate, etc. High peak bandwidths requires means to form high density (closely spaced) I/O channels that can be driven at high Nyquist frequencies with minimal insertion loss arising from crosstalk, dispersion, signal reflection, and attenuation.

Figure 3A:
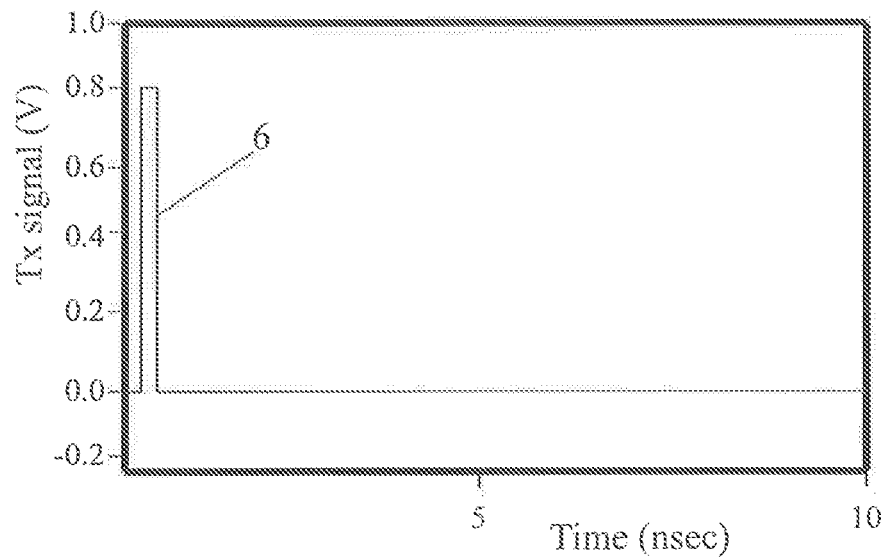
Figure 3B:
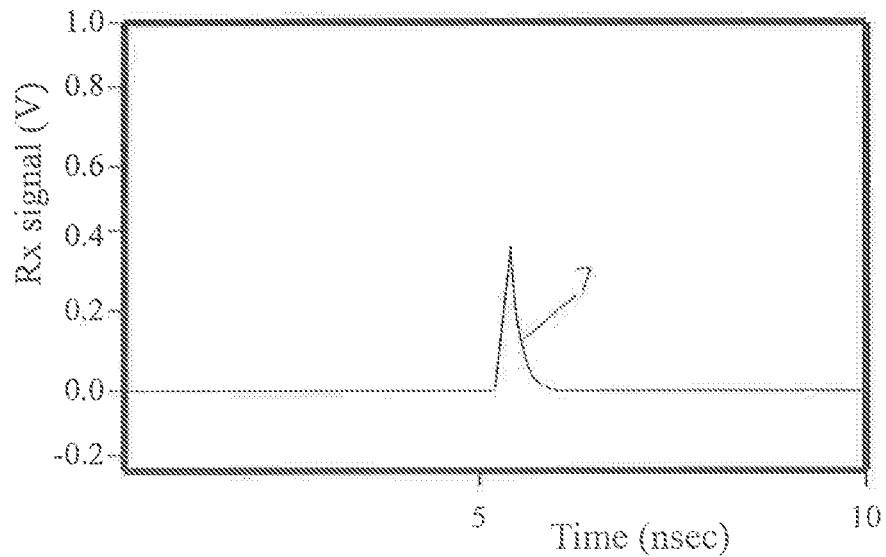

Insertion loss within an I/O channel causes the amplitude of a input signal pulse 6 to diminish as an output pulse 7 broadened width, increased rise-time, and reduced amplitude over distance traveled in the I/O channel as depicted in FIG. 3A,3B. These losses and pulse broadening effects are derived from multiple factors and they limit the distance over which a digital pulse can reliably transmit a digital symbol. These losses increase dramatically with increasing frequency and are often estimated using the nonphysical equation:

$$Atten[dB/in] \sim \frac{1}{w[mils]}\sqrt{f[GHz]} + 2.3 \times f[GHz] \times \tan\delta \times \sqrt{\varepsilon_R} \quad (1)$$

which mathematically approximates all contributing loss factors, where w is the width of the conductor in mils, f is the frequency in GHz, tan δ is the loss tangent, and $\varepsilon_R$ is the relative permittivity of the dielectric in which the conductor tracer is embedded.

Physical factors contributing to loss are either dominated by materials properties or they are design related. Materials-dominant factors include signal attenuation, caused by conductor or dielectric losses, and noise problems generated by signal reflections at poorly terminated discontinuities in the circuit structure. Poor electrical terminations are caused by an inability to embed suitable materials needed to neutralize the reflection at the discontinuity and the inability of packaging materials to respond in phase with electromagnetic signals driven at higher frequencies. This is the case for the materials comprising passive components 4 and organic package 5 used in modern high-speed assemblies. Design-dominant factors relate to handling crosstalk and maintaining mode-field integrity. If design related issues are well managed, the only limiting factor achieving higher data rates becomes materials attenuation losses.

de Rochemont '706 and '234, incorporated herein by reference, instruct art related to dielectric materials having uniform microstructures at the nanoscale that respond in phase with electromagnetic stimulus up to femto-second time scales (PetaHertz frequencies), and their use in terminating signals (neutralizing reflections) at vias in high speed chip stacks, de Rochemont '054 and '768, incorporated herein by reference, instruct art related to semiconductor carriers upon which chip stacks and semiconductor die are mounted that comprise bus circuitry integrated within carriers, but it does not instruct preferred embodiments to form bus circuitry that further comprises ultra-low loss, high density I/O channels that increase data rates and peak memory-processor band widths.

Figure 3D:
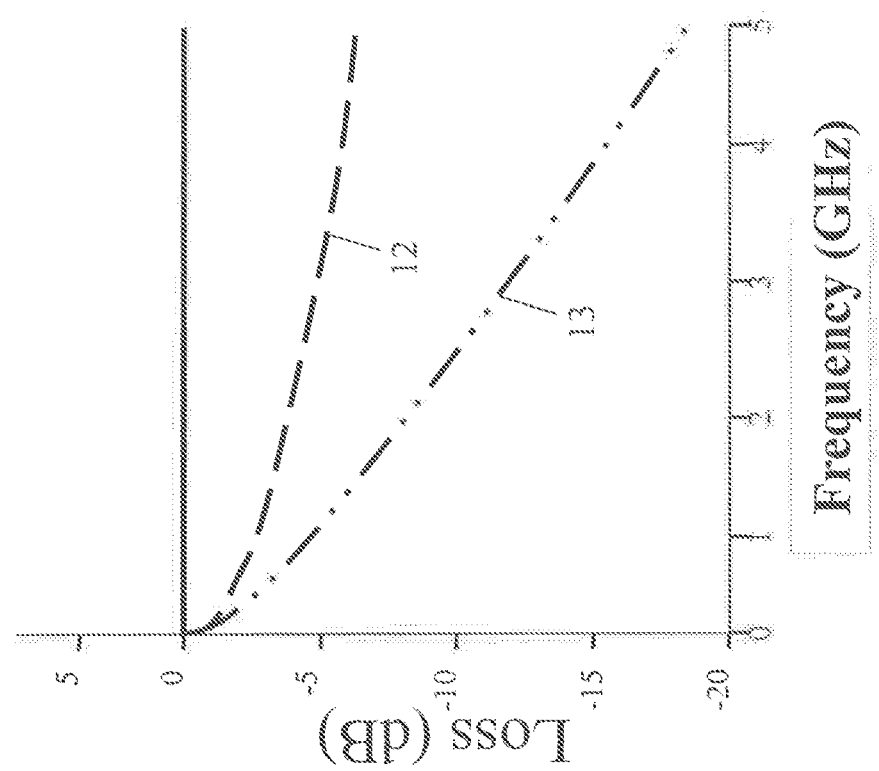
Figure 3C:
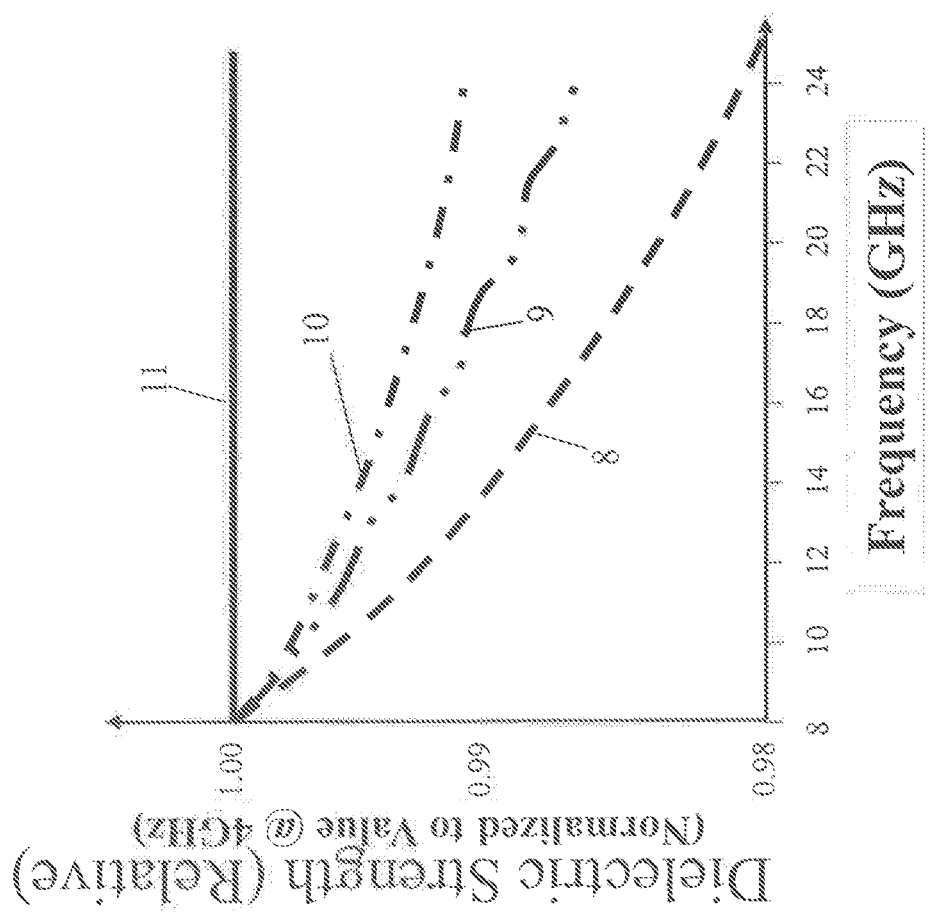

Dielectric dispersion is a contributing factor to pulse distortion as it causes some frequencies in the wave packet forming the pulse to travel at different propagation velocities to the others. FIG. 3C illustrates the variability in relative dielectric strength (normalized to values measured at GHz) with signal frequency of various high performance dielectric media up to 25 GHz. Moldable organic compounds provided by Rogers Corporation that have the highest performance are: High Performance FR-4 8, Theta™ Laminate and prepreg 9, and RO4350B™ Laminate/RO4450F™ prepreg 10. All of these organic compounds have dielectric constants that cause dispersion to be increasingly problematic at higher Nyquist frequencies, limiting the ability to achieve high data rates in I/O channels comprising these dielectric materials.

Amorphous silica 11, used in optical fiber, is the most transparent dielectric medium used in industry. Dispersion is nonexistent at cm wavelengths (GHz frequencies), and does not become an issue until micron wavelengths, where it is still so minimal that optical frequency electromagnetic pulses do not have to be reshaped until they have passed 40-60 km lengths of the medium. Therefore, means to form I/O channels with amorphous silica 11 is desirable to forming a low insertion loss link.

Signal attenuation is derived from conductor losses and dielectric losses. Conductor losses increase with frequency due to the skin affect, which concentrates current densities in thinner and thinner regions close to the conductor surface with increasing frequencies. FIG. 3D depicts the relative contribution of conductor losses 12 and dielectric losses 13 in a 34-inch long I/O channel formed in FR4 dielectric up to 5 GHz. FIG. 3D clearly illustrates that dielectric loss 13 outpaces conductor loss 12 at increasing frequency. Therefore, it is an imperative to form high data rate I/O channels using dielectric media that have the lowest possible dielectric loss 13. In addition to have minimal dispersion characteristics, loss tangents (tan δ) for amorphous silica have been reported to fall in the range of 0.0004≤tan δ≤0.00002.

Figure 3E:
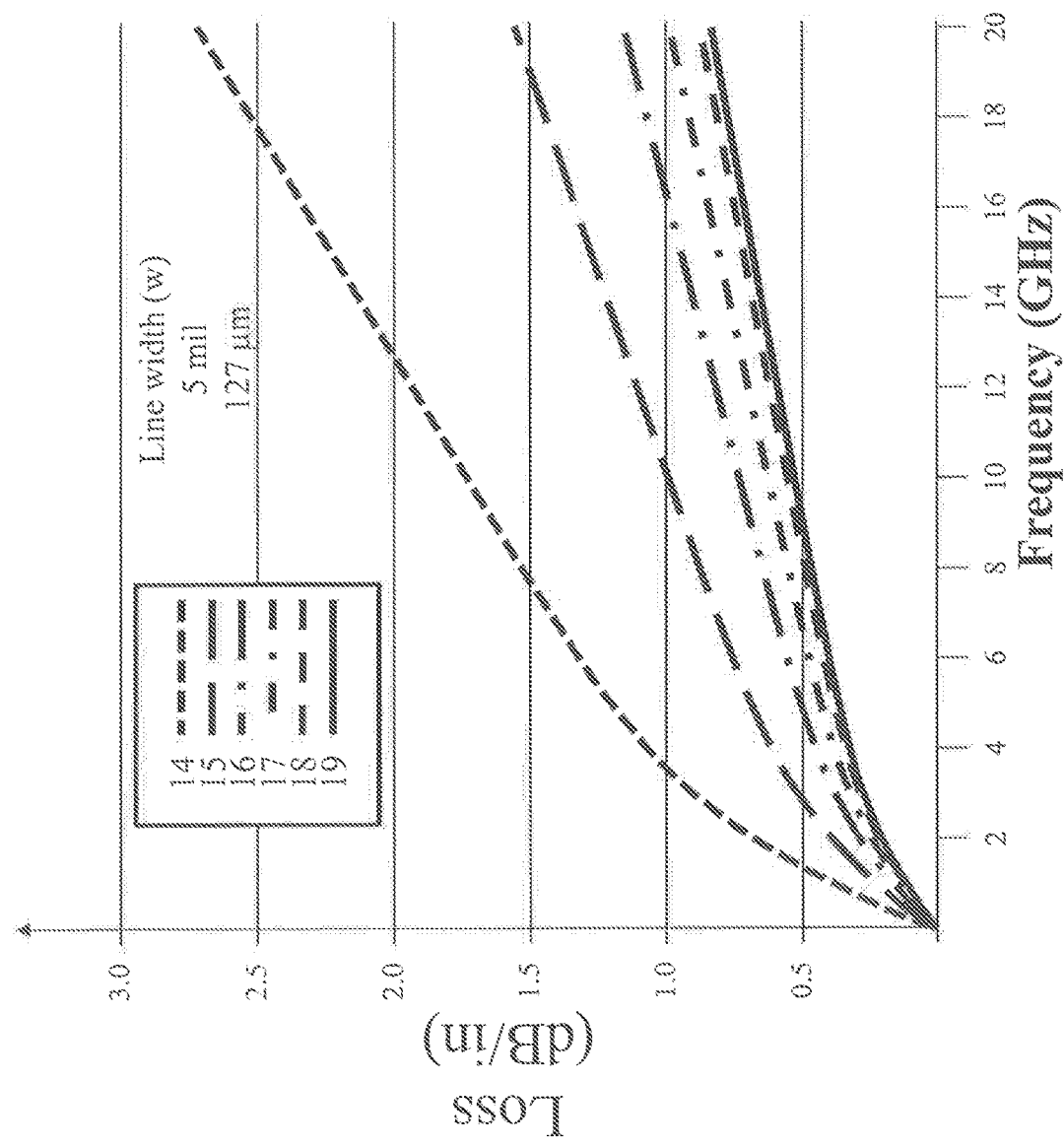
Figure 4:
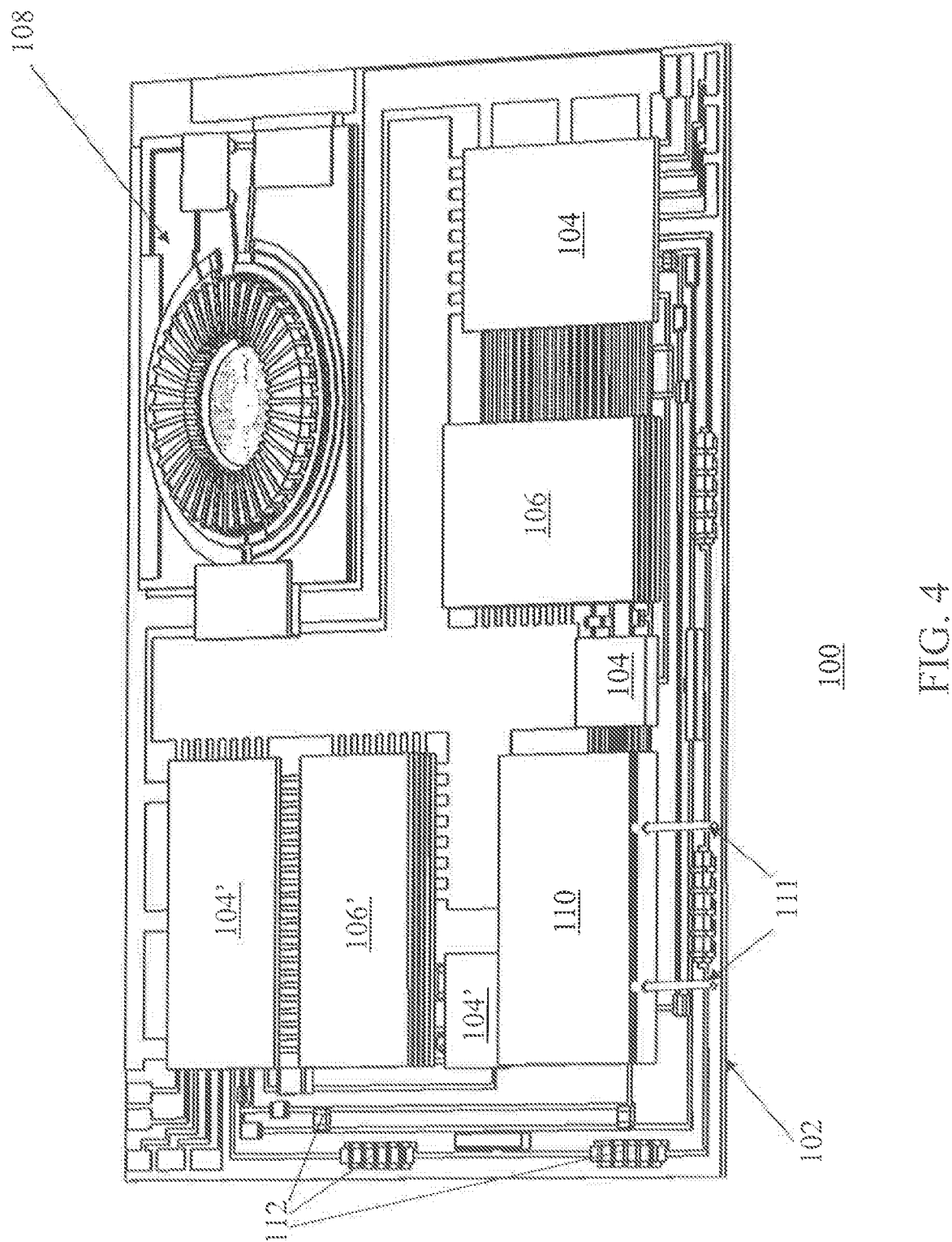
FIG. 4 illustrates a hybrid computing module comprising I/O channels having ultra-high peak memory-processor bandwidth.

FIG. 3E illustrates insertion loss (represented in dB/in) as a function of frequency up to 20 GHz as derived using Equation 1, which models the effect of crosstalk, dispersion, and attenuation in a low-density transmission line having a 5 mil (127 μm) line width for the following dielectric media: FR4 (tan δ=0.02, $\varepsilon_R$=4) 14, Nelco 4000-13 EP Si (tan δ=0.008, $\varepsilon_R$=3.2) 15, Rogers 4350B (tan δ=0.0037, $\varepsilon_R$=3.48) 16, Megtrone6 (tan δ=0.002, $\varepsilon_R$=3.4) 17, amorphous silica (tan δ=0.0004, $\varepsilon_R$=3.8) 18, and amorphous silica (tan δ=0.00002, $\varepsilon_R$=3.8) 19. I/O channels operating at higher Nyquist frequencies, especially frequencies that extend beyond 20 GHz, will optimally comprise media that have minimal dielectric loss, even in links comprising low density interconnects having 5 mil (127 μm) line widths.

Table 1 illustrates how insertion loss scales with increasing interconnect densities (smaller line width/tighter I/O pitch) at line widths ranging from 5 mil (127 μm) to 0.0025 mil (0.7) when I/O channels comprising FR4 14, Nelco 4000-13 EP Si 15, Rogers 4350B 16, Megtrone 17, and amorphous silica (α-SiO$_2$) having tan δ=0.0004 18 and tan δ=0.00002 19 are driven at 12 GHz and 24 GHz Nyquist frequencies corresponding data rates of 24 Gbps and 48 Gbps, respectively. Amorphous silica 18,19 clearly provides a distinct advantage over the moldable organic compounds 14,15,16,17 at low density I/O channels (16 I/O/mm/layer), where there is 55% maximum improvement (using α-SiO$_2$ tan δ=0.00002) over FR4 14 dielectrics and a 15% maximum improvement over Magtrone6 17 dielectric at a 12 GHz Nyquist, and a 69% maximum improvement over FR4 14 dielectrics and a 23% maximum improvement over Magtrone6 17 dielectric at a 24 GHz Nyquist. However, peak processor-memory bandwidth requires significantly higher I/O densities, especially semiconductor technology nodes scale down below 14 nm. At the more necessary I/O channels densities (>1369 I/O-mm$^{-2}$ per layer) required by modern technology nodes insertion losses generated by crosstalk overwhelms signal integrity, even when using materials having ultra-low dielectric loss. In these instances, amorphous silica 18,19 clearly still provides an advantage over the moldable organic compounds 14,15,16,17 at high density I/O channels (2739 I/O-mm$^{-2}$ per layer), but it is only a 0.8% maximum improvement over FR4 14 dielectrics and a 0.07% maximum improvement over Magtrone6 17 dielectric at a 12 GHz Nyquist, and a 1.1% maximum improvement over FR4 14 dielectrics and a 0.1% maximum improvement over Magtrone6 17 dielectric at a 24 GHz Nyquist.

It is significant to note that the maximum improvement gained from amorphous silica is always greater in percentage terms at a 24 GHz Nyquist than it is at a 12 GHz Nyquist with increasing interconnection density. Although small. Table I shows the "Max Improvement" gained from using amorphous silica (tan δ=0.00002) over FR4 14 ranges from 25% to 38% with increasing interconnection densities, and a gain of 43% to 55% over Magtrone6 17 with increasing interconnection density. Therefore, to achieve peak processor-memory bandwidth it is not only necessary to incorporate ultra-low loss materials within the I/O link operating at high Nyquist frequencies, it is absolutely necessary to develop means to fully neutralize crosstalk when operating in the regime of high interconnection densities where crosstalk interference becomes the dominating mechanism of signal and symbol interference.

Reference is now made to FIGS. 4-12 to illustrate means and embodiments to improve peak memory-processor bandwidths by forming ultra-low loss/high signal integrity I/O channels within a multilayer surface interface 200 of an inactive interposer circuit, an active interposer circuit comprising semiconducting substrate, or a semiconductor chip carrier 102. All embodiments comprise embedded passive circuitry optimally placed in the heterogeneous circuit or high speed semiconductor chip stack to minimize signal reflections at transmission line discontinuities, terminate signals between signal sources and signal loads, serve as equalization circuitry or function as a clock data recovery system. The semiconducting interposer circuit and semiconductor chip carrier may additionally comprise active circuitry to amplify attenuated signals. All embodiments comprise ultra-low loss dielectric media, preferably amorphous silica dielectric or some functionally equivalent dielectric medium. All embodiments minimize crosstalk between parallel traces, reduce ground bounce and switching noise, and reduce over system noise by evenly distributing power among all devices.

A hybrid computing module 100, further comprising high peak bandwidth I/O channel 202, may comprise a semiconductor chip carrier 102, one or more semiconductor die 104,106 configured heterogeneously a single die 104 mounted upon the semiconductor chip carrier 102 or as a semiconductor chip stack 106, preferably a high-speed chip stack assembly 106, which may comprise high speed semiconductor chip stack assembly as instructed by de Rochemont '234, mounted upon the semiconductor chip earner 102. It is herein understood that a semiconductor chip stack 106 is also understood to mean a bonded assembly of semiconductor wafers. The hybrid computing module 100 may also comprise redundant, fault tolerant, or distributed circuitry consisting of single 104' or a chip slack assembly 106' mounted upon the semiconductor chip carrier 102. A power management module 108 formed or mounted upon the semiconductor chip carrier 102 that further comprising a resonant gate transistor, as instructed in de Rochemont '489 and '532 incorporated herein by reference, reduces ground bounce, switching noise, and overall system noise by evenly distributing power locally to all the devices 104,104',106, 106',110 and any active circuitry within the semiconductor chip carrier 102 by switching power to the devices at switching speeds above 500 MHz, preferably at processor clock speeds or higher. The hybrid computing module 100 may comprise a plurality of power management modules 108 and resonant gate transistors as a given design warrants. The hybrid computing module 100 may additionally comprise an electro-optic transceiver 110 that provides an optical interface to other devices, preferably other hybrid computing modules, in a networked computer. The hybrid computing module 100 comprises passive circuit elements 112 consisting of inductors, resistors, and capacitors formed upon or within the semiconductor chip carrier 102 that filter noise, terminate signal lines to minimize reflections, and match impedances. The hybrid computing module 100 further comprises bus circuitry (not shown in FIG. 4 for clarity, but depicted below) that enable Nyquist frequencies well into 10 s and 100 s of GHz at high I/O densities to drive peak processor-memory bandwidths well into TBps and above.

Reference is now made to FIGS. 5A,5B,5C,5D,5E,5F,5G to illustrate limitations to obtaining high signal integrity in prior art I/O channels to better clarify preferred embodiments of the invention that relate to signal terminations within an interposer network formed upon a semiconducting or inactive dielectric substrate or within the bus circuitry embedded within a semiconductor chip earner 102.

A first limitation to the prior art (FIG. 2) relates to the physical size of passive components and the inability to integrate powder-processed electroceramic dielectrics at the wafer scale using BEOL manufacturing techniques.

As a general rule, discrete components assembled within the circuit have to have physical size that is less than ½oth of the guided wavelength of the operating frequency to fall within "lumped circuit" design approximations. The "lumped circuit" approximation facilitates design as instantaneous fields within the discrete component no longer have to be accounted for. The further signals push above 30 GHz, the more wavelengths drop below 1 cm. This means the physical dimensions of passive circuit elements need to be constrained to maximal lengths/widths that are less than 0.5 mm or 500 μm to maintain lumped circuit approximations. It is an objective of the application to enable a fully integrated circuit module 226 that operates above 30 GHz, preferably above 300 GHz, and most preferably above 3 THz, wherein passive circuit elements are integrated within the circuit using lumped circuit approximations.

This level of integration requires passive circuit elements that comprise high energy density electroceramic dielectric 224 to be incorporated within the circuit using a method that is compatible with BEOL construction methods to bridge the gap between on-chip communications and the off-chip world while achieving high interconnection densities that exceed 200 IQ/mm/layer. Modern BEOL construction techniques are costly because of deposition rates on the order of 1 nm/hr when applied to high energy density materials. This commercial constraint has limited commercially viable production means to integrating single metal element dielectrics, such as silicon dioxide ($SiO_2$), silicon nitride ($Si_3N_4$), where silicon (Si) is the metal (semiconducting semi-metal) element, or titanium oxide ($TiO_2$) and hafnium oxide ($HfO_2$), where titanium (Ti) and hafnium (Hf) are the metal sole metal elements. This manufacturing limitation restricts dielectrics to having permittivity approximately equal to 4 (silicon dioxide), 7 (silicon nitride), 80 (titanium oxide), and 25 (hafnium oxide).

The area, A, required to achieve a desired capacitance is directly proportional to the thickness of the dielectric, $\square$, and the desired capacitance, and inversely proportional to the permittivity of the dielectric $\varepsilon_0\varepsilon_R$ as shown in equation 2.

$$A = \frac{C\ell}{\varepsilon_0\varepsilon_R} \qquad (2)$$

Therefore, for a given thickness between the capacitor's electrodes, materials having higher permittivity $\varepsilon_0\varepsilon_R$ (energy density) will require a smaller area A within an integrated component. Higher energy density passive components more easily fall within the "lumped circuit" design approximation at higher signaling frequency.

Liquid Chemical Deposition (LCD) techniques as instructed by de Rochemont '839 and de Rochemont and Kovacs (the '814 application, incorporated herein by way of reference, form capacitive dielectrics comprising high chemical complexity with microstructures that are uniform at the nanoscale using production temperatures that will not damage diffusion profiles of active elements embedded within a semiconductor substrate. The uniform nanoscale microstructures enable capacitive dielectrics that will reduce random noise symbol jitter because their dielectric properties will remain stable with temperature and time. Most importantly, these high chemical complexity materials that enable high energy density dielectrics are produced at commercially viable production rates. This permits the integration of high energy density dielectrics within a circuit using BEOL techniques described below.

High energy density dielectrics have high dielectric permittivity $\varepsilon_0\varepsilon_R$ or magnetic permeability $\mu_0\mu_R$ that can be used to shrink component size as depicted in Table II below.

TABLE II

| $C = \frac{\varepsilon_0\varepsilon_R A}{d}$ | $\varepsilon_R$ | Shrink Factor (to $SiO_2$) |
|---|---|---|
| $SiO_2$ | 4 | 1× |
| $Si_3N_4$ | 7 | 1.75× |
| $HfO_2$ | 25 | 6.25× |
| $TiO_2$ | 80 | 20× |
| $BaTiO_2$ | 200 | 50× |
| $LaHfZrTiO_3$ | 800 | 200× |

It is therefore desirable aspect of the application to integrate high chemical complexity dielectrics (such as $BaTiO_2$ or $LaHfZrTiO_3$) to achieve maximal component miniaturize that will keep passive elements safely in the "lumped circuit" design regime in order to push the operational speed of microelectronic circuitry from GHz frequencies to THz frequencies.

The "shrink factors" enabled by the high energy density electroceramic dielectrics enable the integration of passive circuit elements having maximal physical dimension of 500 μm enabling lumped circuit approximations at 30 GHz, of 50 μm enabling lumped circuit approximations at 300 GHz, and 5 μm enabling lumped circuit approximations at 3 THz. The de Rochemont '411 application, incorporated herein by reference, instructs means to produce a fully integrated gyrator circuit which uses a capacitive circuit element and an operational amplifier (Op-Amp), which can be substituted as an inductive circuit element at higher frequency domains when physical constraints limit the integration of conventional inductor coils. It is therefore a preferred embodiment of the application to incorporate fully integrated gyrators as inductive circuit elements, wherein the Op-Amp circuitry is integrated within an active semiconductor layer 214 along with other active switching elements. The gyrator capacitive element is integrated within one or more unused portions of a data signal plane 210, within the multilayer surface interface 200 of a high peak-bandwidth I/O channel.

Figure 5A:
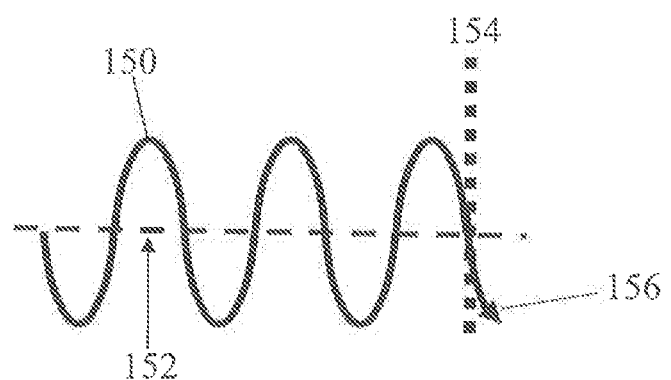
FIGS. 5A thru 5G illustrate various factors that affect signal integrity within an I/O channel.

A second physical limitation of the prior art that induces "ringing" and signal reflections at higher frequencies, thus inhibiting higher peak bandwidth, relates to the need to add reactance (capacitance or inductance) to the signal termination. At MHz and low GHz signaling frequencies, simply adjusting trace length is sufficient to be able to terminate a signal using a resistive load because a signal standing wave 150 and its harmonic frequency components traveling along a conductor with trace length 152 measures close to or is an integer multiple of half-wavelength ($\lambda_{guided}/2$) of the signal standing wave 150. In this instance, the signal standing wave 150 will naturally have zero or near-zero amplitude at the discontinuity 152, resulting in and full power transmission 156 through the discontinuity 154 as shown in FIG. 5A. The discontinuity could be a via, bend in the transmission line, or a pin or connection to an interconnected device.

Figure 5B:
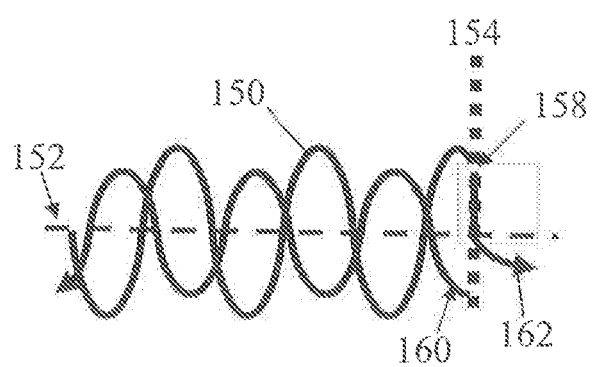

Transistor scaling has in resulted high I/O densities requiring more tightly spaced I/O pins, vias and conductor traces. These high density conditions impose physical limitations on the space available to adjust trace length 152 so that it measures close to or is an integer multiple of half-wavelength ($\lambda_{guided}/2$) of the signal standing wave 150. In this instance, the standing wave 150 has non-zero amplitude 158 at the discontinuity 154 as depicted in FIG. 5B. The non-zero amplitude component 158 generates a reflected wave 160 that destructively interferes with the signal standing wave 150 producing a sharply attenuated transmitted wave 162 through the discontinuity 154.

Figure 2:
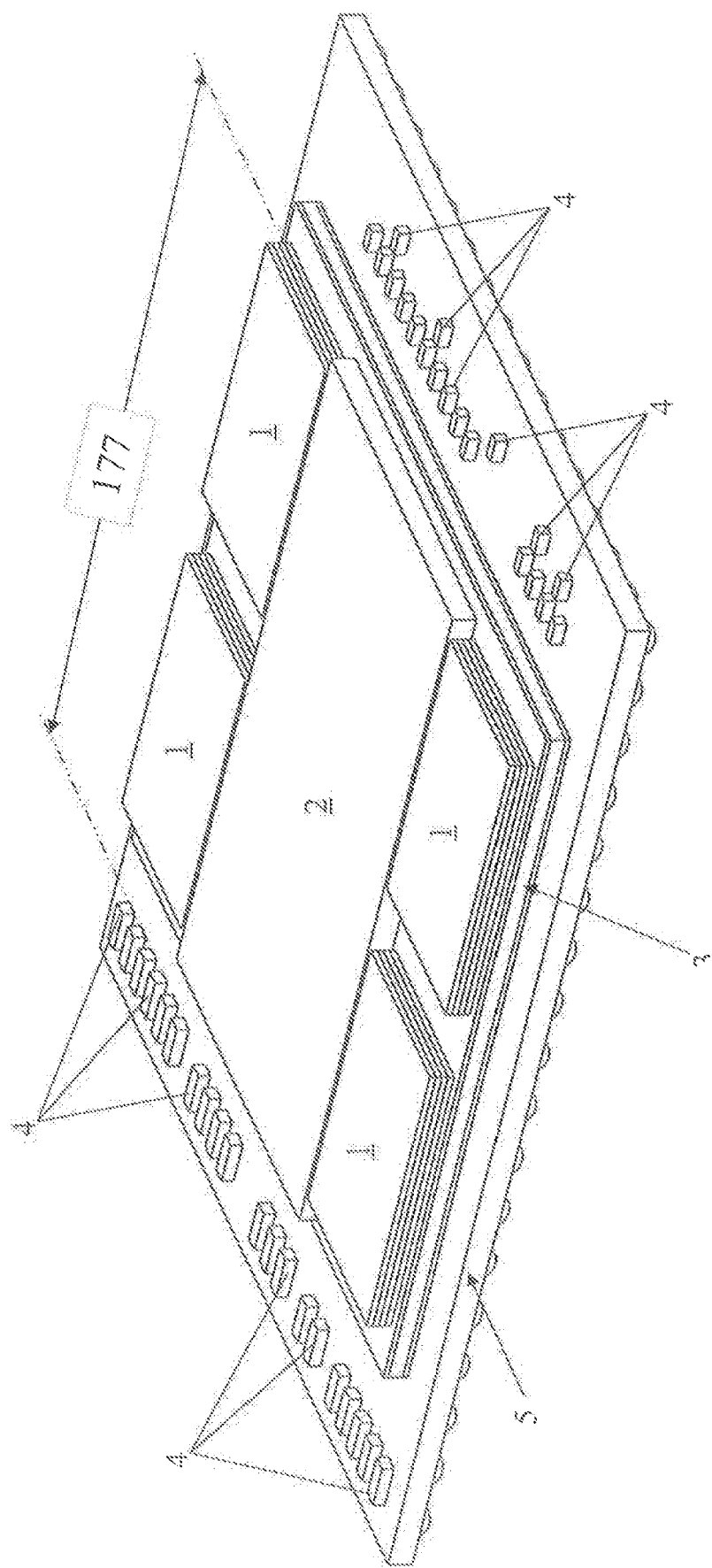
FIG. 2 depicts the prior art that limits improved peak memory-processor bandwidths.

In these cases, reactance provided by inductive or capacitive elements is needed at the discontinuity 154 to adjust the phase (or electrical length) of the signal standing wave 150 to have a phase-adjusted periodicity that terminates (effectively has zero or near-zero amplitude) at the discontinuity 154 allowing full or nearly full power transmission to pass through. As illustrated in FIG. 2, the prior art locates its terminating elements (passive components 4) on the surface of an organic package 5 within an array surrounding the semiconductor devices 1,2 and the interconnect structure 3, where they are most needed.

Figure 5C:
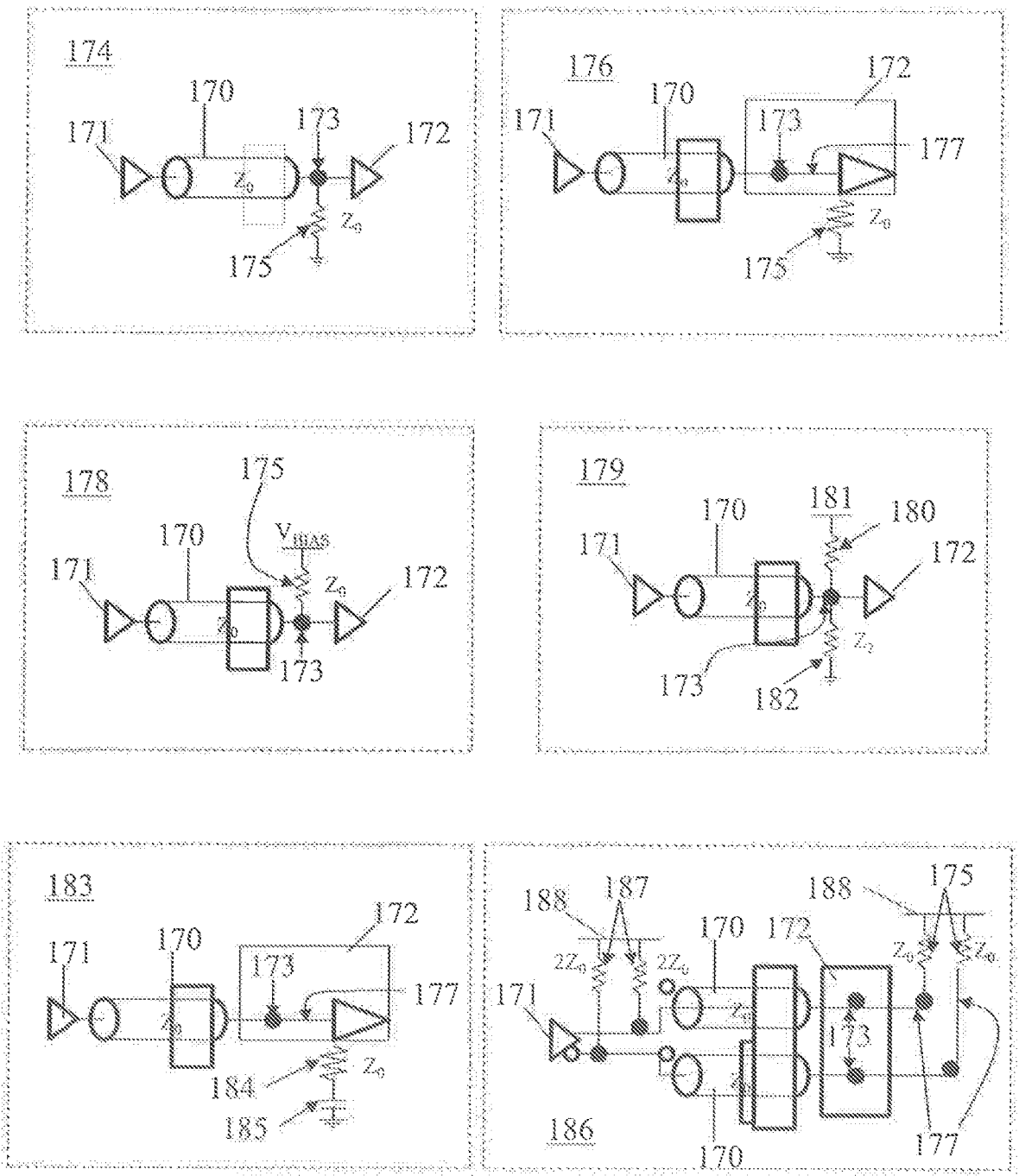
Figure 5D:
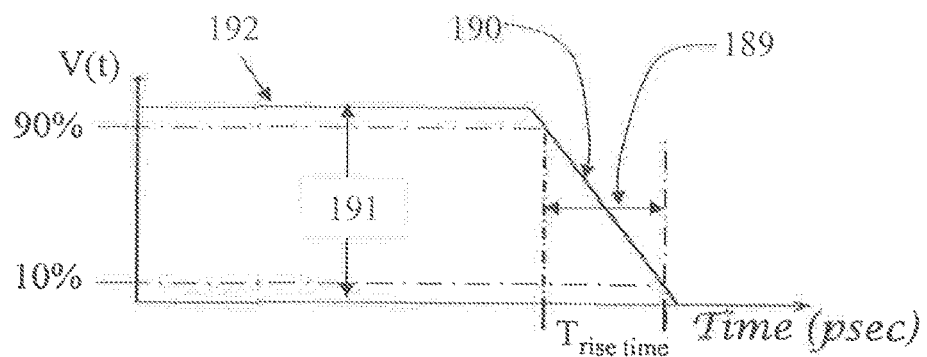

A third physical limitation also relates to the inability to locate passive components in optimal locations to achieve proper impedance matching. FIG. 5C depicts some common impedance matching configurations used for transmission lines 170 having characteristic impedance $Z_o$ that connect a source 171 to a load 172 at a load pad 173. It is assumed these configurations don't require reactance at the pad 173. These terminations include, but are not limited to:

i. a simple parallel termination 174 directly connects the load pad 172 to an impedance matching resistor 175 that matches the characteristic impedance ($Z_o$) of the transmission line 170 to ground;
ii. a simple parallel fly-by termination 176 connects the load pad 172 through a stub 177 to an impedance matching resistor 175 that matches the characteristic impedance ($Z_o$) of the transmission line 170 and is also connected to ground because the physical dimensions of the load 172 do not permit an immediate connection between the pad at the impedance matching resistor 175;
iii. an active parallel termination 178 directly connects the load pad 172 to an impedance matching resistor 175 that matches the characteristic impedance ($Z_o$) of the transmission line 170 to a voltage source, $V_{bias}$;
iv. an Thevenin termination 179 uses a Thevenin voltage divider, wherein the terminating resistance that matches the characteristic impedance ($Z_o$) of the transmission line 170 is split between a first resistor 180 connected between the load pad 173 and a power supply 181 and a second resistor 182 directly connects the load pad 173 to ground;
v. a series RC parallel fly-by termination 183 uses a resistor 184 and capacitor 185 networked in series as the terminating impedance where the resistor 184 connected to the pad 173 through a stub 177 has a resistance that matches the characteristic impedance of the transmission line 170 and the capacitor 185 blocks a constant flow of current to ground without delaying the signal beyond design thresholds;
vi. a differential pair (3.3 V PCMIL) Fly-By termination 186 utilizes two transmission lines 170 with two parallel resistors 187 at the transmitter that connect the transmission lines 170 to a terminating voltage 188 and have resistance twice the characteristic impedance of tire transmission lines 170 and two terminating resistors 175 that match the characteristic impedance of the transmission lines 170 and connect the load pads 173 to the terminating voltage 188 through stubs 177.

Stubs 177 used in impedance-matching terminations are a key limitation preventing circuits from operating at frequencies greater than 2.5-3.5 GHz in systems assembled on printed circuit board or 7 GHz in stacked chip assemblies and heterogeneous modules. As depicted in FIG. 2, stubs 177 are generated in the prior art by placing terminating passive components in an array surrounding the semiconducting devices 1,2 and the high density interconnect structure 3 necessitating a plurality of conductor traces (not shown) that need to have equal length to properly synchronize the device.

As illustrated in FIGS. 5D,5E,5F,5G, time delays ($t_{DELAY_{(stub)}}$) incurred as signals traverse stubs 177 are a major limitation in high-frequency circuit design. Proper synchronization needed to minimize signal reflections imposes the following constraint:

$$t_{DELAY_{(stub)}} < T_{rise\ time}/3 \quad (3a)$$

where pulse rise time ($T_{rise\ time}$) 189 is the time differential as the leading edge 190 of the pulse 191 rises from 10% to 90% of the maximum pulse height (voltage) 192, and, $$t_{DELAY_{(stub)}} = l_{stub}/v_{prop} \quad (3b)$$

where $v_{prop}$ is the signal propagation velocity over the stub 177. This infers, $$t_{DELAY_{(stub)}} \propto \sqrt{\mu_R \varepsilon_R} \quad (3c)$$

where $\sqrt{\mu_R \varepsilon_R}$ is the square root of the relative permeability ($\mu_R$) times the relative permittivity ($\varepsilon_R$) of the dielectric enveloping the trace conductor.

Figure 5E:
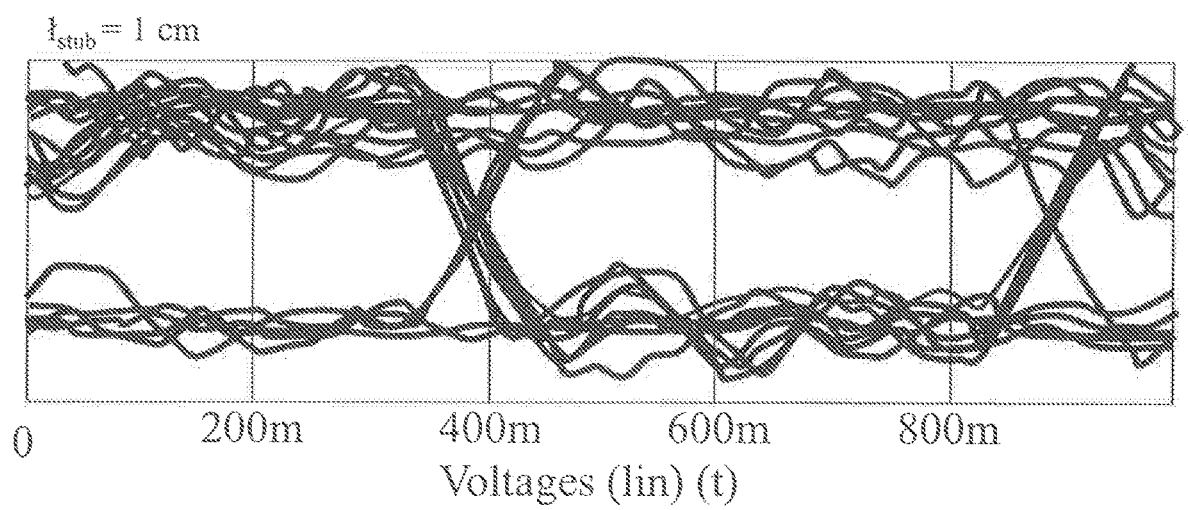
Figure 5F:
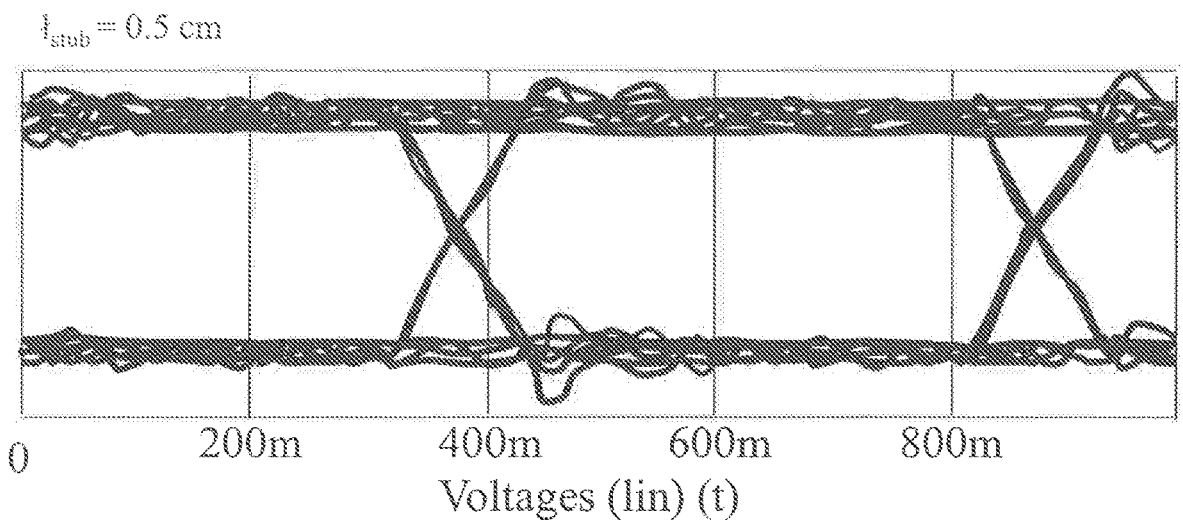
Figure 5G:
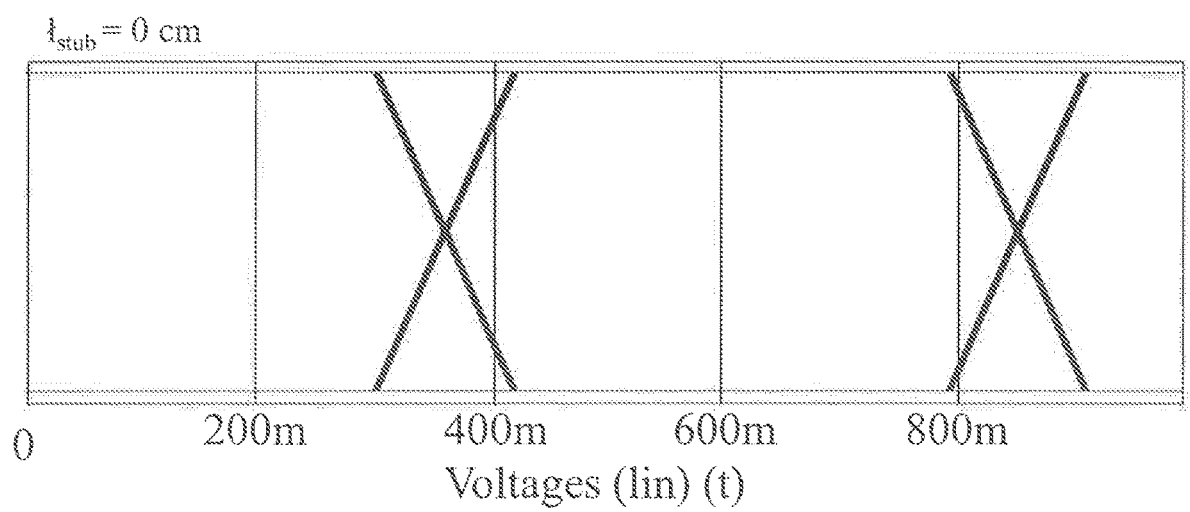

Higher Nyquist frequencies shorten pulse rise time 189, which, in turn through equation 3a, shortens the minimal permissible time delays ($t_{DELAY_{(stub)}}$). FIGS. 5E,5F,5G illustrate representative SPICE simulations of "eye diagrams" for modern state of the art circuitry having stub length 177 measuring 1 cm (FIG. 5E), 0.5 cm (FIG. 5F), and 0.0 cm (FIG. 5G). Eye diagrams assess the signal integrity and reflection noise in an I/O link. The longer stub length 177 ($\square_{stub}$=1 cm, 0.5 cm, FIGS. 5E&5F respectively) generate more reflections and produce noisier circuits that compromise signal integrity, especially at higher signal frequencies that shorten pulse rise time 189. It is therefore desirable to have short stub length 177 less than 0.5 cm, preferably zero stub length 177, and use low density dielectrics to minimize reflection noise to push Nyquist frequencies and channel data rates well above the current limitations of the prior art, which has minimal stub length 177 in the range of 0.5 cm to 1 cm, if not higher.

Figure 6A:
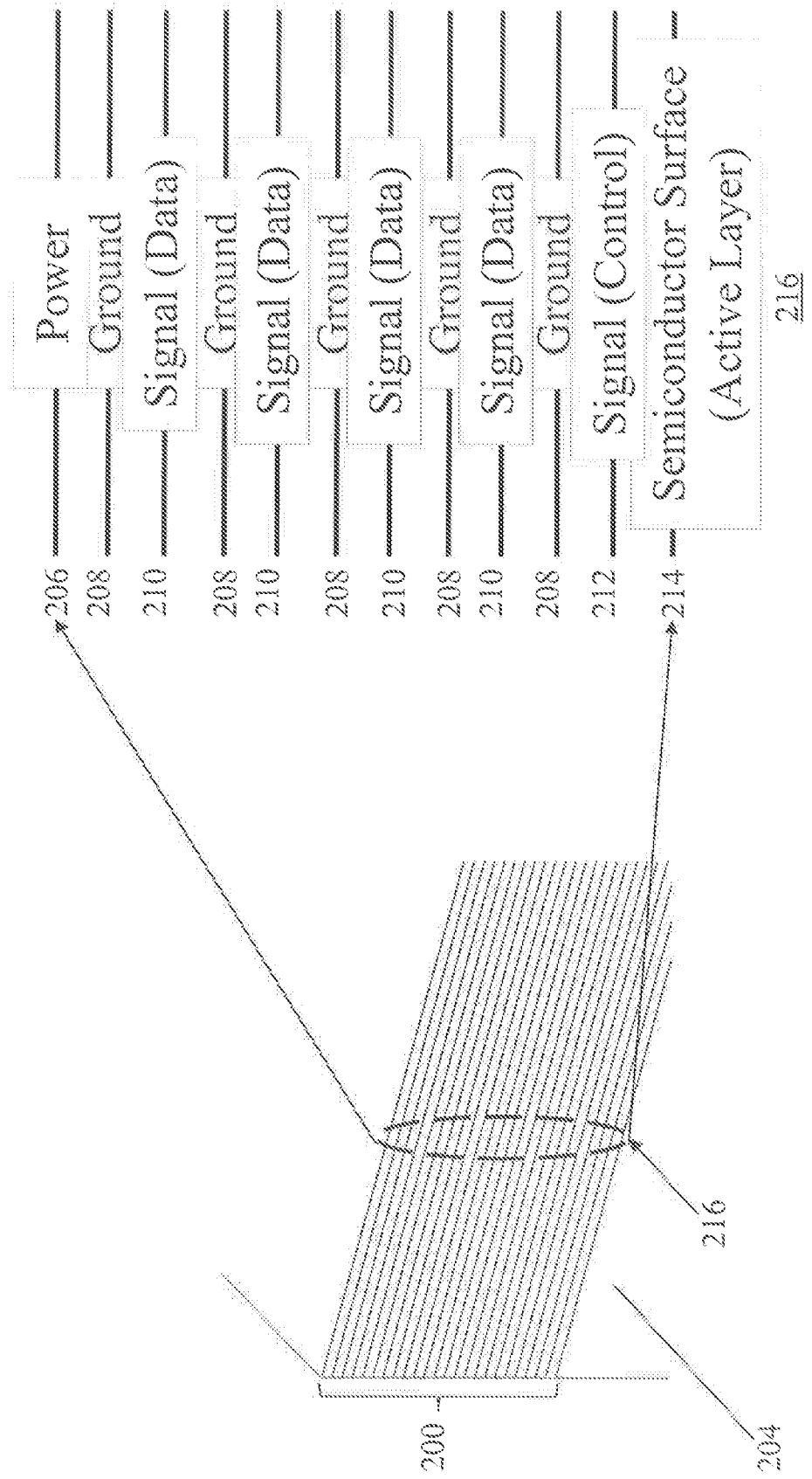
Figure 6C:
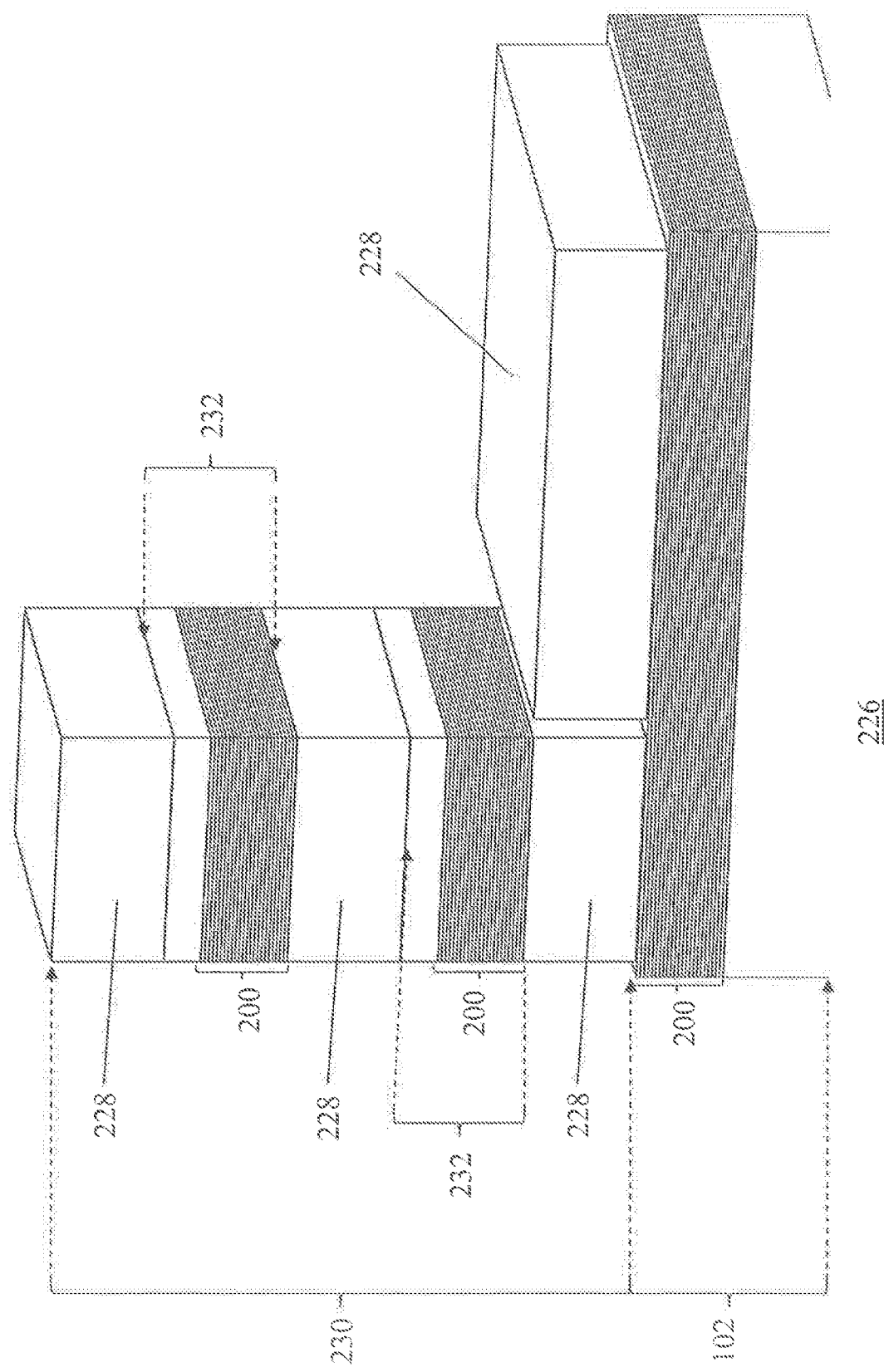

Reference is now made to FIGS. 6A,6B,6C, to illustrate the structural architecture and its method of construction. The application incorporates art instructed by de Rochemont '234 that provide means to terminate circuit discontinuities at vias within a high speed semiconductor chip stack. The present application expands upon these methods to form high interconnection density I/O links operating at improved peak bandwidths that improve peak memory bandwidths when data is transmitted between input/output ports of a first semiconductor 1 or stack of semiconductors 1 and the output/input ports of a second semiconductor 2. The high peak bandwidth I/O channel 202 may be formed within the bus circuitry of a semiconductor carrier 102, on the surface of a semiconductor die 104, or within active semiconducting or non-active dielectric interposer circuits 232 embedded within a chip stack assembly 106. The present application further instructs means to integrate equalization, amplification, and clock and data recovery systems within the high peak bandwidth I/O channel 202.

FIG. 6A depicts a multilayer surface interface 200 in which circuitry forming the high peak bandwidth I/O channel 202 is embedded. The high peak bandwidth I/O channel 202 comprises vias 300,402 that form an electrical interface between the input and output ports on semiconductor die 104,106,228, the semiconductor carrier 102, an interposer circuit 232, or a high-speed semiconductor chip stack. Electrically conductive means 222 forms the channel link 530, a low permittivity, ultra-low loss dielectric 218, preferably amorphous silica dielectric, and a passive filtering network 404 is integrally embedded within the high peak bandwidth I/O channel 202. The passive filtering network 404 may be embedded on the plane of the channel link 530 or it may alternatively be embedded within an integrated via 400,450.

The multilayer surface interface 200 is formed upon a substrate 204. BEOL techniques are recommended for forming the surface features that will in turn comprise network filtering elements (resistors, capacitors, inductors) that function as equalization and clock-data recovery circuitry. The substrate 204 is preferably a semiconducting substrate, more preferably a silicon semiconducting substrate, but may also comprise any semiconductor or comprise any dielectric material or any material if an insulating dielectric is formed as the primary layer in the multilayer surface interface 200. The multilayer surface interface 200 is formed using BEOL techniques that may comprise any semiconductor technology node, but preferably utilize nodes in the range of 22 nm-90 nm.

The multilayer surface interface 200 comprises, at a minimum, a power plane 206, one or more ground planes 208, and one or more data signal planes 210, that are insulated from one another by a low-permittivity, ultra-low loss dielectric, preferably amorphous silica dielectric. The multilayer surface interface 200 further comprises a signal control plane 212 when formed upon an active semiconductor surface 214 in which active switching elements are integrated. The active semiconductor surface 214 is included in semiconductor chip carriers 102 or in active semiconductor interposer circuits 232 that amplify signals or manage active switching functions within a chip stack assembly 106. The structural architecture 216 of the multilayer surface interface 200 may comprise any number or combination of power planes 206, ground planes 208, data signal planes 210, and signal control planes 212. The signal control plane 212 is not necessary when the multilayer surface interface 200 is constructed upon a substrate 204 that comprises an inactive dielectric and functions simply as a passive interconnect structure 3.

As illustrated in FIG. 6B, the multilayer surface interface 200 is constructed by forming a low permittivity, ultra-low loss dielectric 218, preferably an amorphous silica dielectric, upon a substrate 204 (Step 1) that may comprise active circuitry embedded beneath its surface when forming a semiconductor carrier 102 or an active semiconductor interposer circuit 232. The creation of a control signal plane 212 can be omitted when fabricating I/O links on inactive substrates. LCD methods are preferred when forming these structures, especially when forming thin films having the high chemical complexity required by high energy density electroceramic dielectrics needed to shrink the physical size of filtering components. LCD methods are uniquely capable of forming capacitive elements that polarize and depolarize with femto-second response times. LCD methods may be applied directly or indirectly to form the layers and chemical mechanical polishing steps may be included to smooth surfaces to ideal flatness.

Conventional BEOL steps are used to etch an opening 220 in the ultra-low loss dielectric 218 in locations where it is necessary to access any active circuitry that might be embedded in the substrate 204 (Step 2). Conductive means 222 is applied to form the control signal plane 212 and its electrical connection to the active layer on the semiconductor surface 214 (Step 3).

An ultra-low loss dielectric 218 is applied over the conductive means 222 to electrically isolate the control signal plane 212 (Step 4). Openings 220 are etched in locations in the ultra-low loss dielectric 218 in locations where it is necessary to access the signal control plane 212 or active layer 214 (Step 5). The openings 220 are filled in when applying conductive means 222 to form a ground plane 208 (Step 6). An ultra-low loss dielectric 218 is applied over the conductive means 222 to electrically isolate the ground plane 212 from superior conductive means layers (Step 7). Openings 220 are etched in locations in the ultra-low loss dielectric 218 in locations where it is necessary to access the ground plane 212 or lower levels in the circuit (Step 8). The openings 220 are filled in, making connection to lower layers, when applying conductive means 222 to form a data signal plane 210 (Step 9).

Openings 220 are etched in locations in the conductive means 222 forming the data signal plane 210 in locations where it is necessary to apply high energy density electroceramic dielectric 224 to embed planar passive components within the data signal plane 210 (Step 10). These techniques are not limited to embedding planar passive within the data signal plane 210. As will be shown below, unique designs require planar passive components to be embedded within power planes 206, ground planes 208, and signal control planes 212, where the same methods illustrated in Step 10 are applied to those layers.

High energy density electroceramic dielectric 224 is applied to fill in the openings 220 and form planar passive components (Step 11). An ultra-low loss dielectric 218 is applied over the conductive means 222 to electrically isolate the data signal plane 210 with the embedded electroceramic dielectric 224 (Step 12).

Openings 220 are etched in locations in the ultra-low loss dielectric 218 in locations where it is necessary to electrically connect the data signal plane 210 or superior levels in the circuit or to the ground plane immediately above it (Step 13). The openings 220 are filled in, making connection to lower layers, when applying conductive means 222 to form a ground plane 208 (Step 14).

Steps 1 through 14 are repeated to successively include additional data signal planes 210, ground planes 208, and power planes 206 and build up the structural architecture 216 of a multilayer surface interface 200.

With respect to embedded high energy density electroceramic dielectric 224, a specific objective of the present invention minimizes signal distortion, power loss, and the physical size of capacitors, inductors, or resistors formed using high energy density electroceramic dielectric 224 embedded within a power plane 206, ground plane 208, data signal plane 210 or control signal plane 212 forming a high peak bandwidth I/O channel 202. A preferred embodiment of any high energy density electroceramic dielectric 224 used as a capacitive dielectric claims perovskite electroceramic dielectric in which dielectric polarization rates respond at femto-second time scales and have dielectric properties that remain stable with temperature. This is achieved with a microstructure that has uniform nanoscale microstructure, wherein all grains have identical grain and grain boundary chemistry (molar composition that varies $\leq \pm 1.5$ mol %) and uniform grain size less than 50 nm.

Smaller capacitor component sizes are achieved using high energy density electroceramic dielectric 224 having higher electron densities. Therefore it is a preferred embodiment of the present invention to incorporates high energy density dielectric electroceramic dielectric 224 within a planar capacitor wherein the average amu within the electroceramic crystalline lattice is greater than 25 amu, preferably greater than 50 amu to engender a relative permittivity that is greater than 70, but preferably in the range of $200 \leq \varepsilon_R \leq 800$. The basic stoichiometry of the high energy density electroceramic dielectric is given by the formula equation:

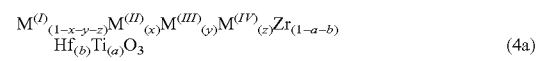

$$M^{(I)}_{(1-x-y-z)}M^{(II)}_{(x)}M^{(III)}_{(y)}M^{(IV)}_{(z)}Zr_{(1-a-b)}Hf_{(b)}Ti_{(a)}O_3 \quad (4a)$$

where $M^{(I)}$, $M^{(II)}$, $M^{(III)}$, $M^{(IV)}$ are additional metal oxide components that form a thermodynamically stable perovskite crystal and x, y, and z, are fractional molar percentages forming ratios such that the sum of all $M^{(I)}$, $M^{(II)}$, $M^{(III)}$, $M^{(IV)}$ elemental components satisfies the constraint:

$$(1-x-y-z)+(x+y+z)=1 \quad (4b)$$

And, $$(1-a-b)+(a+b)=1 \quad (4c)$$

Higher average amu is achieved by incorporating higher amu elements into the perovskite chemical formula. It is therefore a specific embodiment of the application to claim high energy density electroceramic dielectric 224 within embedded capacitive elements that comprise three or more metal oxide components that further comprise an admixture of three (3) or more of the elements listed in Table III.

As instructed in de Rochemont '234, incorporated herein by reference, it is desirable for a capacitive high energy density electroceramic dielectric to have extremely low dissipation currents. Therefore, a particular aspect of the invention dopes capacitive high energy density electroceramic dielectric 224 with small amounts (≤0.05 mol %) of silicon dioxide ($SiO_2$) that will migrate with conductive metal oxide species from the grain core and into the grain boundaries to form electrically insulating metal oxide phases that resist dissipation currents and neutralize the formation of internal conductive pathways.

TABLE III

| Transition Metal Elements | | | | | | | | | | | |
|---|---|---|---|---|---|---|---|---|---|---|---|
| Symbol | | | | | | | | | | | |
| | Sc | Ti | V | Cr | Mn | Zn | Zr | Nb | Mo | Hf | Ta | W |
| amu | 21 | 22 | 41 | 42 | 25 | 30 | 40 | 41 | 42 | 72 | 73 | 74 |
| Lanthanide Metal Elements | | | | | | | | | | | |
| Symbol | | | | | | | | | | | |
| | La | Ce | Pr | Nd | Sm | Eu | Gd | Tb | Dy | Ho | Yb |
| amu | 57 | 58 | 59 | 60 | 62 | 63 | 64 | 64 | 66 | 67 | 70 |
| Post Transition Metal Elements | | | | | | | | | | | |
| Symbol | | | | | | | | | | | |
| | In | Sn | Pb | Bi |
| amu | 49 | 50 | 82 | 83 |

Garnets are the preferred high energy density electroceramic dielectric 224 embedded within openings 220 in conductive means 222 used to embed inductive passive components within a power plane 206, ground plane 208, data signal plane 210 or control signal plane 212 forming a high peak bandwidth I/O channel 202. Garnets provide high magnetic permeability ($\mu_r \geq 10$) and ultra-low loss (tan $\delta \leq 10^{-3}$) at GHz frequencies, making them excellent magnetic core materials. Garnets adopt either rhombic dodecahedron or trapezohedron crystal structures, or a combination of the two, and have the following chemical formula:

$$A_3B_2(SiO_4)_3 \qquad (2)$$

Where Group A metal oxides have equal molar concentration to silicon oxide and group B metal oxides have molar concentration that is ⅔ the molar concentration of silicon oxide. Group A metal oxides preferred for use in high permeability garnet electroceramic dielectrics include: calcium oxide (CaO), magnesium oxide (MgO), iron oxide (FeO), and manganese oxide (MnO). Group B metal oxides preferred for use in high permeability garnet electroceramic dielectrics include: aluminum oxide ($Al_2O_3$), iron oxide ($Fe_2O_3$), chromium oxide ($Cr_2O_3$), vanadium oxide ($V_2O_3$), zirconium oxide ($ZrO_2$), titanium oxide ($TiO_2$), silicon oxide ($SiO_2$), yttrium oxide ($Y_2O_3$), cobalt oxide ($Co_3O_4$), gadolinium oxide ($Gd_2O_3$) neodymium oxide ($Nd_2O_3$) and holmium oxide ($Ho_2O_3$). Optimal compositions for high permeability garnet electroceramic dielectrics comprise admixtures of Group A and/or Group B metal oxides. It is preferred embodiment of the present invention that the high permeability garnet magnetic cores 142 integrated in a high-speed semiconductor chip stack 200 have controlled microstructure with uniform grain size ranging from 10 nm to 25 μm, preferably from 250 nm to 5 μm.

As depicted in FIG. 6C, the circuit module 226 claimed by application comprises high peak bandwidth I/O channels 202 integrated within a multilayer surface interface 200 are formed on a semiconductor substrate that functions as a semiconductor carrier 102 upon which semiconductor die 228 are mounted. The semiconductor die 228 may be mounted as a singular die, or as a plurality of chips embedded within a chip stack 230. Semiconductor die 228, preferably semiconductor die 228 that are "thinned" prior to mounting or assembly, may provide any function (memory, processor, controller, etc.) needed operate a module's 226 design objectives. Interposer circuits 232, comprising a multilayer surface interface 200 that further comprise high peak bandwidth I/O channels 202, are formed on the surface of substrates 234. The substrates 234 may comprise semiconductor or inactive dielectric media, or may function as a semiconducting carrier 102 embedded within a vertical chip stack 230 assembly.

Semiconductor die 228 mounted on the circuit module 226 or embedded within a chip stack 230 may be used to manage any or all of the following circuit functions: memory, memory controller, device controller, central processor, stack processor, graphical processor, quantum processor, field programmable gate arrays, radio connectivity, optical field imaging, radiation field imaging, electro-optical imaging, and application specific (ASIC) functions. A preferred application of circuit module comprises semiconductor die 104,106,228 that function as a charge-coupled imaging device that images electromagnetic fields at clock speeds in excess of 3 GHz, preferably in excess of 100 GHz, most preferably above 1 THz.

Semiconductor die 104,106,228 that provide memory functionality may comprise any type of memory including: read-only memory, conventional random access memory (RAM), dynamic random access memory (DRAM), static dynamic random access memory (SDRAM), nonvolatile memory, such as ferroelectric random access memory (FRAM), or resistive random access memory (RRAM or X-Point), or optical memory.

High peak bandwidth I/O channels embedded within a dielectric substrate or semiconductor carrier 102 may be used to electrical interface a circuit module 226 to other circuit modules 226.

Memory functions within the circuit module 226 that comprises a semiconductor carrier 102 with high peak bandwidth I/O channels 202 and semiconductor die 228 that provide memory may process data within those semiconductor die 228 using methods and information architectures consistent with a $1^{st}$ Generation Stack Machine processor.

Memory, memory controller functions within the circuit module 226 that comprises a semiconductor carrier 102 with high peak bandwidth I/O channels 202 and semiconductor die 228 that provide memory and stack processor functionality may process data within those semiconductor die 228 using methods and information architectures consistent with a $2^{nd}$ Generation Stack Machine processor.

The present invention also claims memory, memory controller and stack processor functions within the circuit module 226 that comprises a semiconductor carrier 102 with high peak bandwidth I/O channels 202 and semiconductor die 228 that provide memory, memory controller, central processor, graphical processor, and stack processor functionality and process data within those semiconductor die 228 using methods and information architectures consistent with a $3^{rd}$ Generation Stack Machine processor that has minimal dependence upon cache memory, wherein data processing is dynamically assigned to memory using methods consistent with a $1^{st}$ Generation Stack Machine, or processed in a Stack Machine processor die using methods consistent with a 2nd Generation Stack Machine and minimal instruction set computing (MISC) architectures, or managed by a controller circuit that optimally assigns processor functions most efficiently resolved by recursive or deeply nested loop algorithms to the MISC Stack Machine processor, and optimally assigns functions most efficiently resolved by iterative algorithms to a central processing unit or graphical processing using reduced instruction set computing (RISC) architectures.

Reference is now made to FIGS. 7A,7B thru 9A,9B,9C, 9D,9E,9F to illustrate embodiments relating to means by which electroceramic dielectric 224 embedded as passive circuitry within conductive means 222 forming power planes 206, ground planes 208, signal data planes 210, or signal control planes 212 are configured within high-peak bandwidth I/O links 202.

Figure 7A:
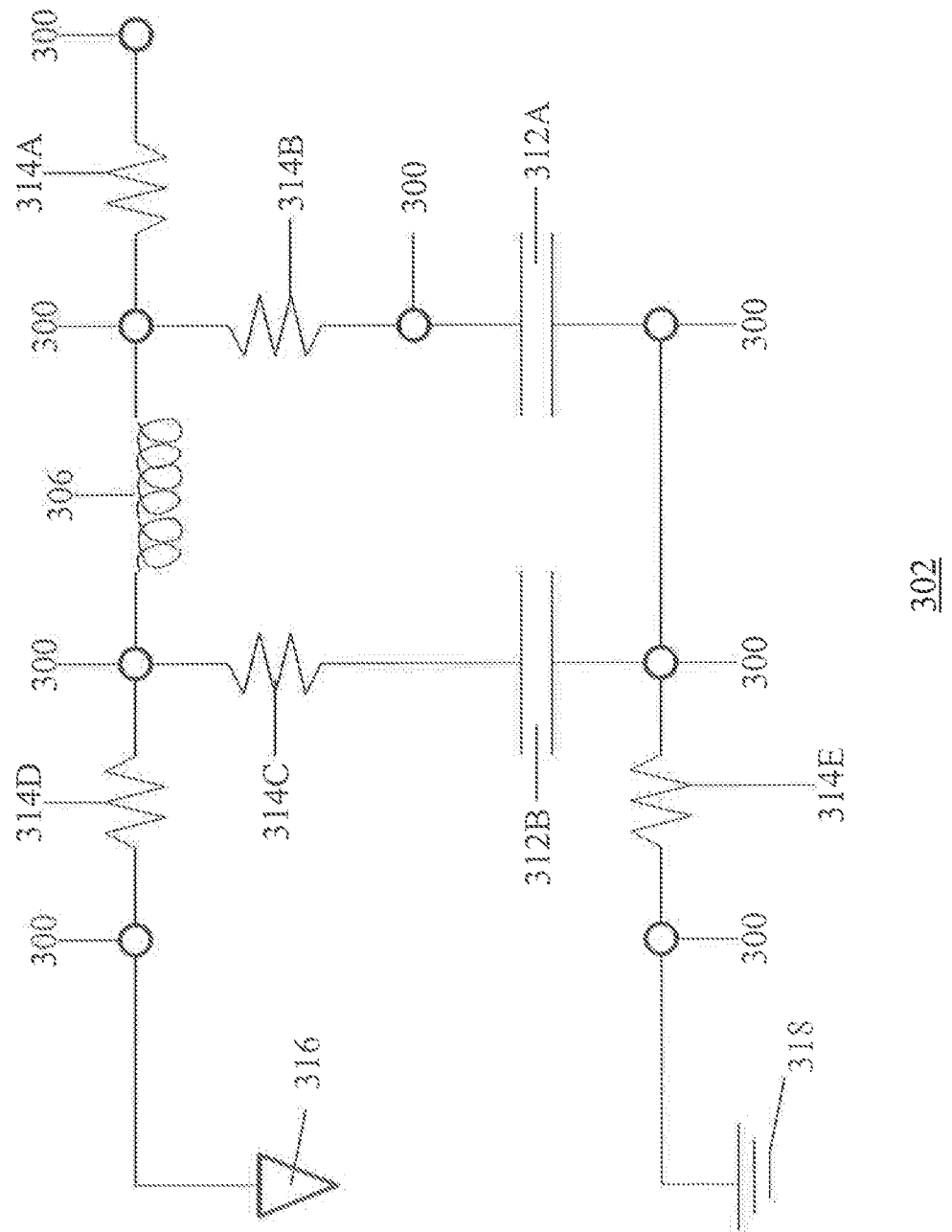
FIGS. 7A,7B illustrate means to form passive filtering networks with minimal stub length from a via.
Figure 7B:
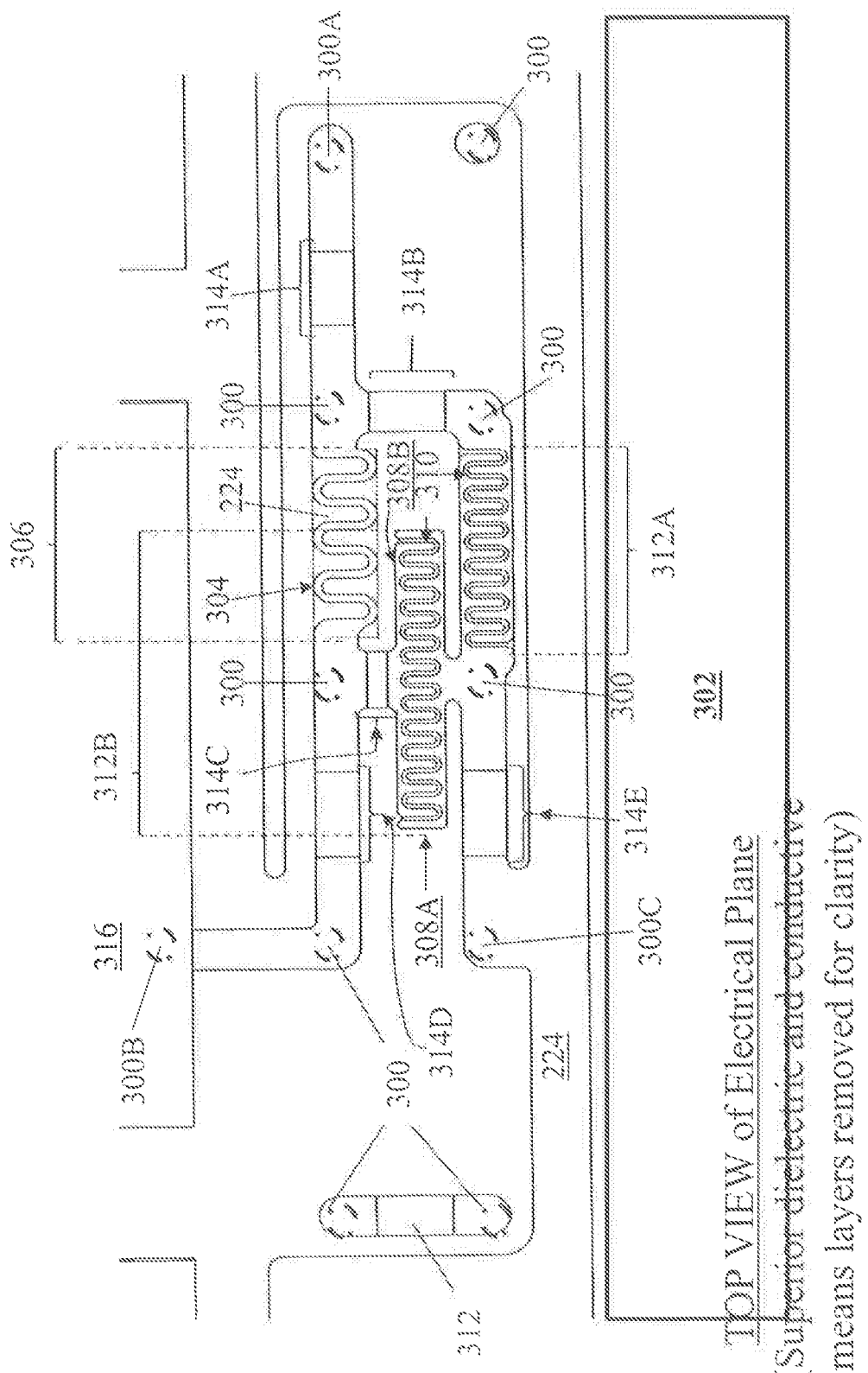

A primary object to forming high-peak bandwidth I/O channels 202 is to form terminations having minimal or zero stub length 177. It is therefore a specific embodiment of the present application to embed electroceramic dielectric 224 or other materials within conductive means as planar passive components that are in direct electrical communication with a via 300. As illustrated in FIGS. 7A,7B, a planar passive filtering network 302, uses vias 300 as network nodes within a plane comprising a conductive means 222 layer. The passive filtering network 302 is formed within a plane comprising a conductive means 222 layer by etching openings 220 that form a meander line electrode 304 that becomes the winding of a planar inductor 306 formal between two vias 300 (network nodes) wherein high permeability electroceramic dielectric 224 forms the magnetic core the planar inductive component 306; etching openings to form two inter-digitated electrodes 308A,308B that become the input/output, after high permittivity electroceramic dielectric 224 is inserted within the openings 220, of the planar capacitive components 310A;310B; and, etching openings 220 that form spacing within a conductive means 222 layer wherein resistive material 312 is inserted to form planar resistors 314A,314B,314C,314D,314E. The resistive material 312 may comprise a high resistivity electroceramic dielectric 224 or may alternatively comprise a high resistivity metal, alloy, or superalloy.

The planar passive filtering network 302 is completed by connecting the planar passive filtering network 302 may be comprised within or is electrically connected to a signal (data, power, or control) input at via node 300A. It is connected to the device 316 at via node 300B, and connected to ground 318 located on a ground plane 208 at via node 300C. As will be illustrated below, vias 300 may also be used to connect a passive filtering network to other planar passive components 306,310,314 that form branches of or form other passive filtering networks 302 located on other planes 206,208,210,212,214.

While planar passive components 306,310,314 and passive filtering networks minimize stub length 177 between via nodes 300 connected to devices 316, and power inputs 206, signal 210,212 inputs, and ground 208, stub length 177 is not reduced to zero, which is required to move the microelectronics industry from the GHz frequency domain to the THz regime. Therefore, means that reduce stub length 177 to zero is desirable.

Reference is now made to FIGS. 8A,8B,8C,8D,8E to illustrate integrated vias 400,450 as a preferred embodiment of the invention to integrate passive circuitry having zero stub length 177 within a conductive means 222 layer embedded in a multilayer surface interface 200 that forms high-peak bandwidth I/O channels 202 for a semiconductor carrier 102, a chip stack assembly 106, semiconductor die 228, interposer circuit 232, circuit module 226, or hybrid computing module 100.

The integrated via 400,450 comprises a via contact pad 402 in electrical communication with a passive filtering network 404 that may further comprise an inductive element 408, a capacitive element 410, and a resistive element 412, formed in the plane of the channel link 530. Although illustrated as termination circuits in FIGS. 8A,8B,8C,8D,8E, passive filtering networks 404 may also be embedded within integrated vias 400,450 and may, without limitation, provide any electrical function useful in a high frequency circuit, such as termination, equalization, frequency resonance, and clock or data recovery.

Figure 8A:
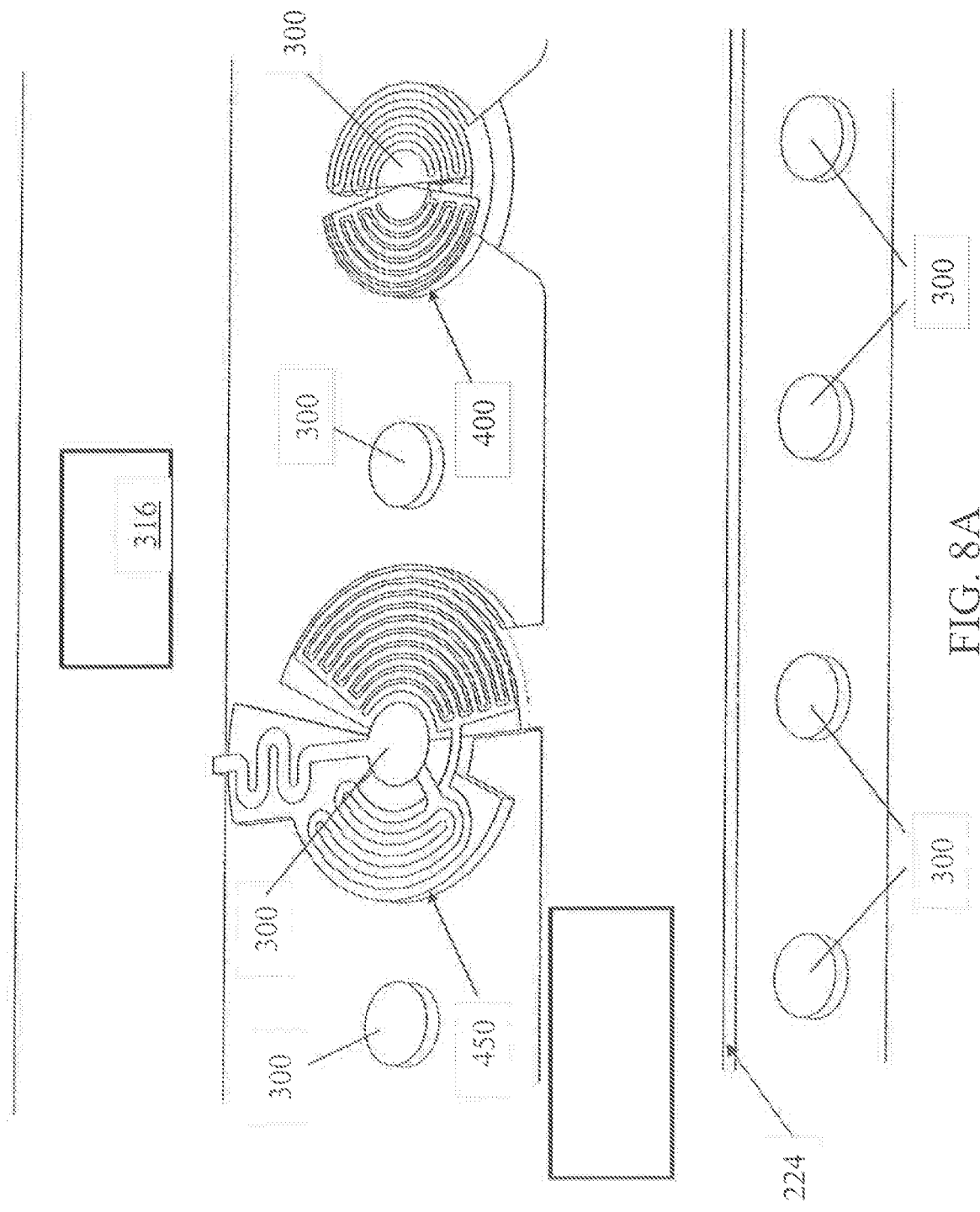
FIGS. 8A thru 8E illustrate means to form passive filtering networks with zero stub length from a via.
Figure 8B:
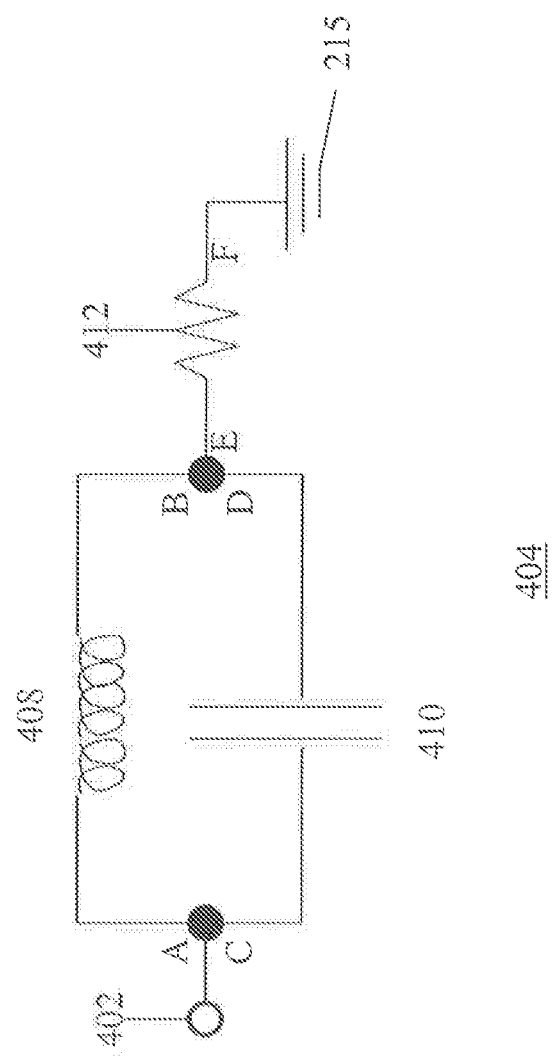
Figure 8C:
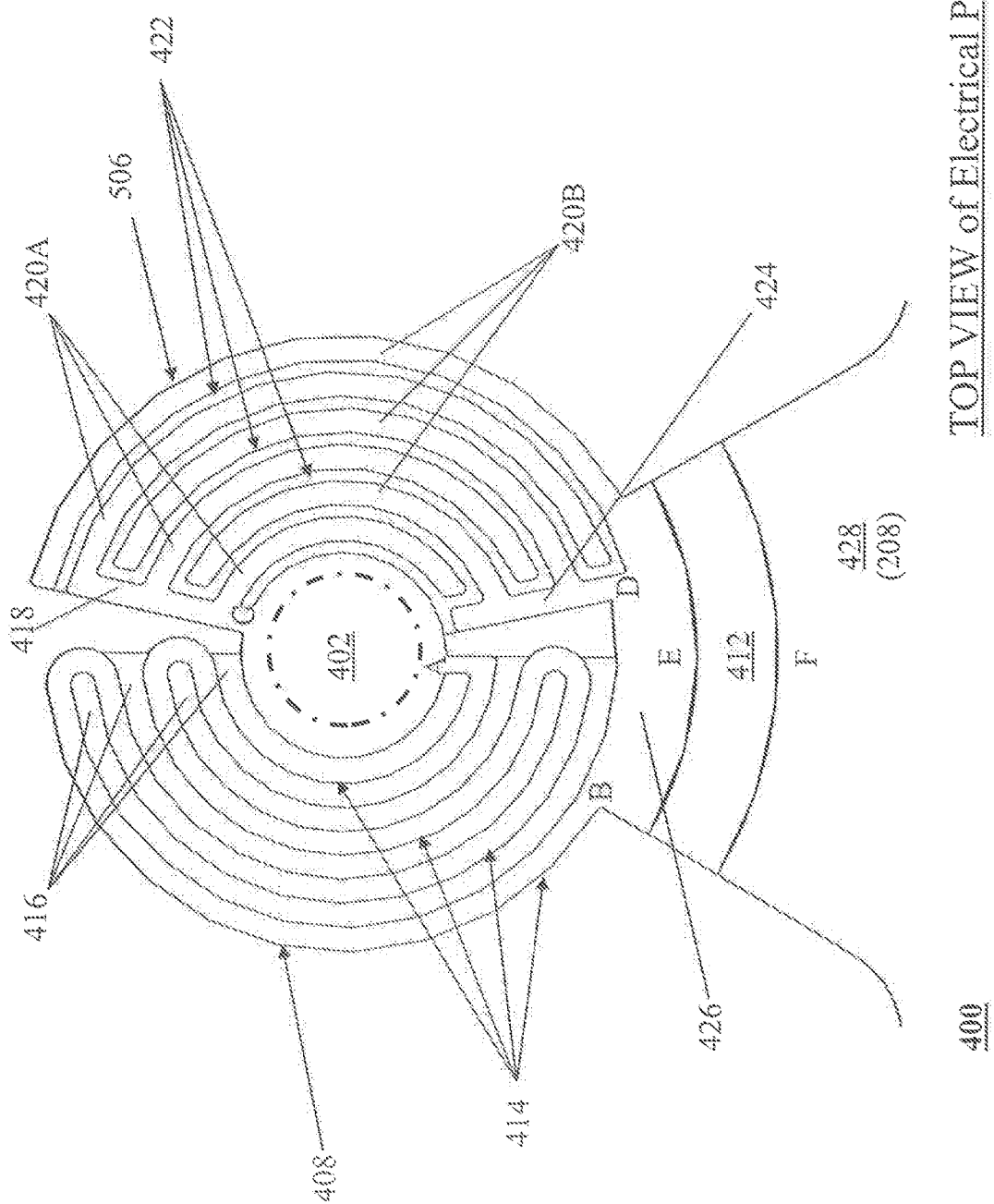

The inductive element 408, a capacitive element 410, and a resistive element 412 are configured as arcuate elements in series, in parallel, or in series and in parallel around the circumference of the via contact pad 402. The planar passive filtering network 404 in FIG. 8B is illustrated as an integrated via 400 in FIG. 8C. The via contact pad 402 provides a signal input at point A to inductive element 408, wherein inductive element 408 comprises a meandering electrode 414 formed within a conductive means 222 layer and traces an arcuate path external to the circumference of the via contact pad 402 through a magnetic core 416 comprising high permeability electroceramic dielectric 224, preferably garnet electroceramic dielectric, to conclude at point B.

Via contact pad 402 makes parallel electrical connection at point C to an input electrode 418 of capacitive element 410 formed within conductive means 222. Conductive digits 420A extending from input electrode 418 trace arcuate paths through gaps 422 filled with high permittivity electroceramic dielectric 224 that couple conductive digits 420A to conductive digits 420B extending along a arcuate path around via contact pad 402 from output electrode 424 that makes parallel connection to the output of inductive element 408 at point D through a first arcuate strip 426 of conductive means 222. The first arcuate strip 426 of conductive means forms the input electrode to resistive element 412 at point E, which has its output at point F to a second arcuate strip 428 of conductive means 222 that is in electrical communication with a ground plane 208.

Figure 8D:
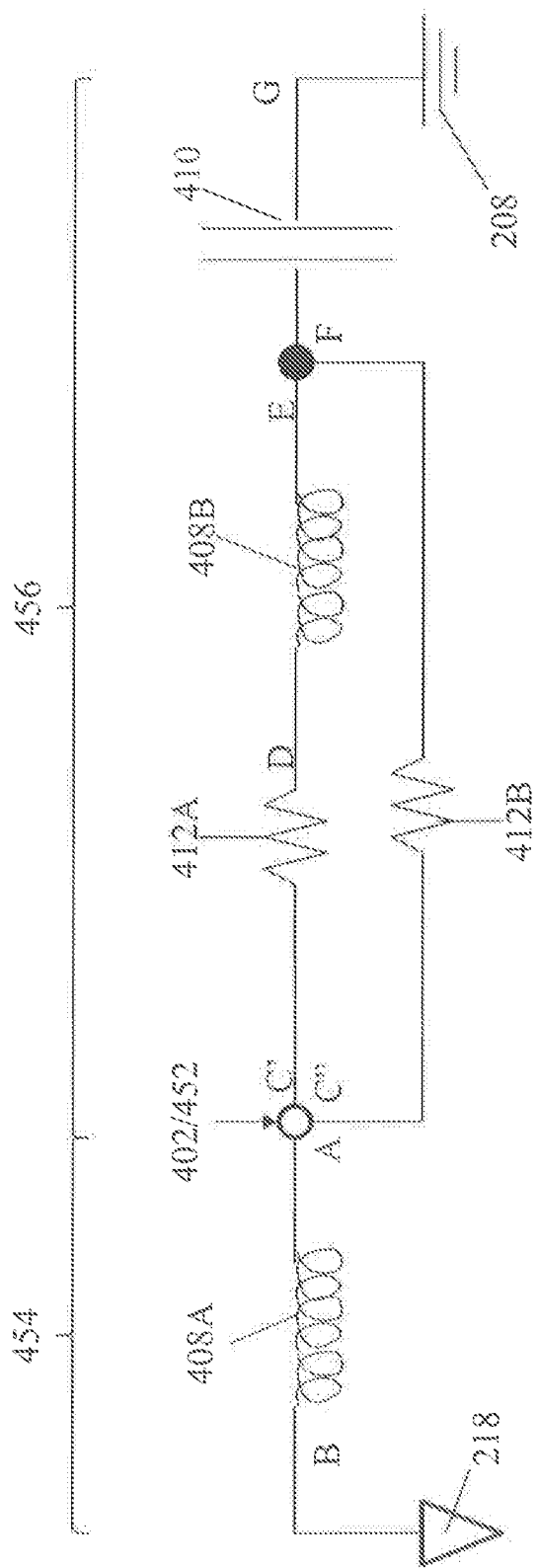
Figure 8E:
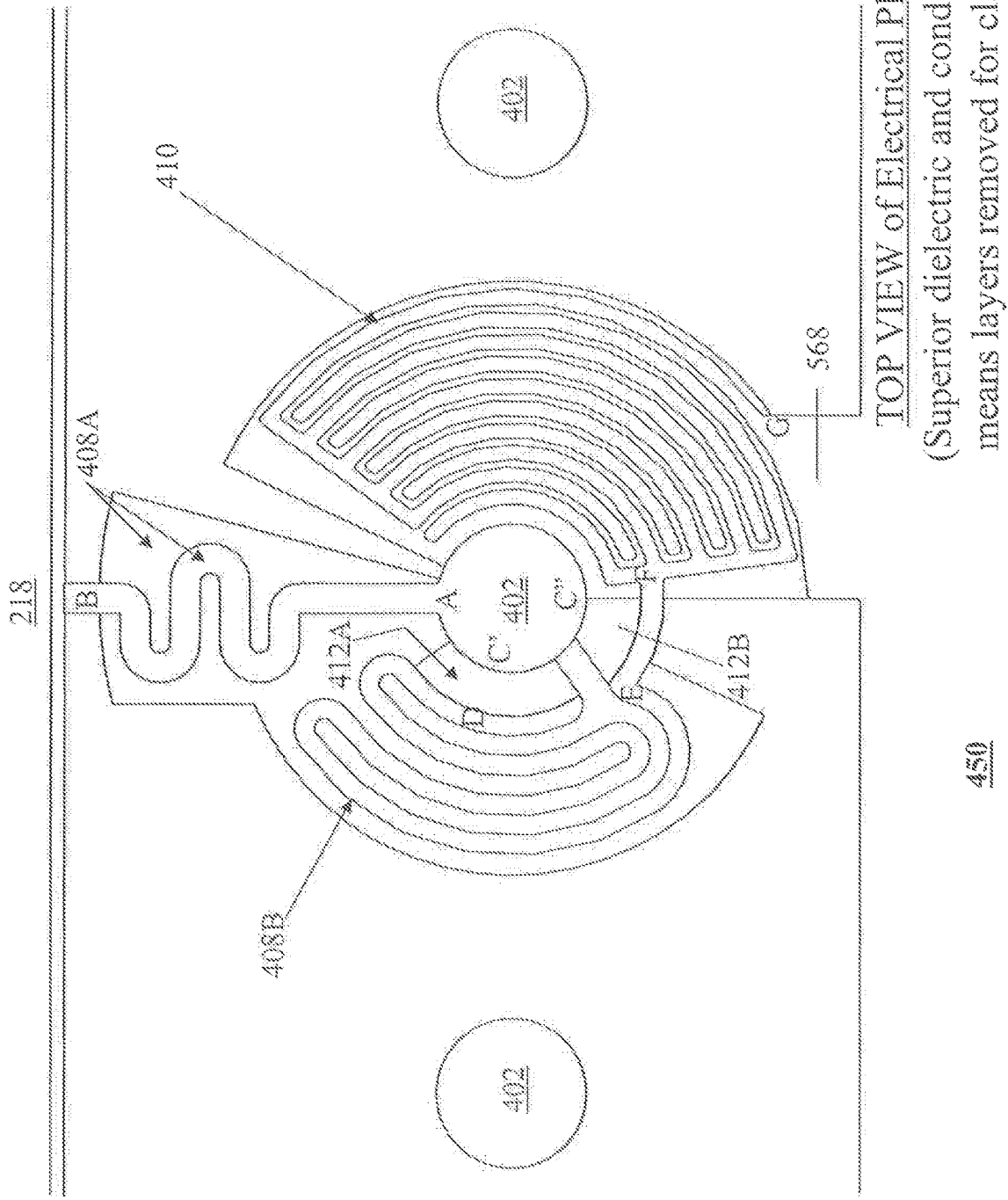

A more sophisticated planar passive filtering 406 formed as an integrated via 450 in which the via contact pad 402 functions as node a 452 for two branches 454,456 of the planar passive filtering network 406 is illustrated as an integrated via 450 in FIGS. 8D&8E.

The first branch 454 electrically connects input from the via contact pad 402 to a first arcuate inductor 408A at point A. The first arcuate inductor 408A electrically connects with device load 218 at point B.

The second branch 456 forms a parallel electrically connection from the contact via pad 402 at points C',C'. Point C' electrically connects via contact pad 402 to resistive element 412A configured in series at point D with inductive element 408B that terminates at point E. Point C" electrically connects via contact pad 402 to resistive element 412B configured in parallel with resistive element 412A and inductive elements 408B which join at point E. Point F forms the input to a capacitive element 410 that is in electrical communication with an arcuate strip 458 that is in electrical communication with ground 208.

The via contact pad 402 electrically connects the integrated vias 400,450 to other electrical planes (206,208,210, 212) within the high-peak bandwidth I/O channel 202, where it may electrical connection to other planar passive filtering networks 520,522 or additional branches of planar passive filtering networks configured to provide termination, equalization, amplification, signal directionality, or clock and data recovery functionality within the high-peak bandwidth I/O channel 202.

Figure 9A:
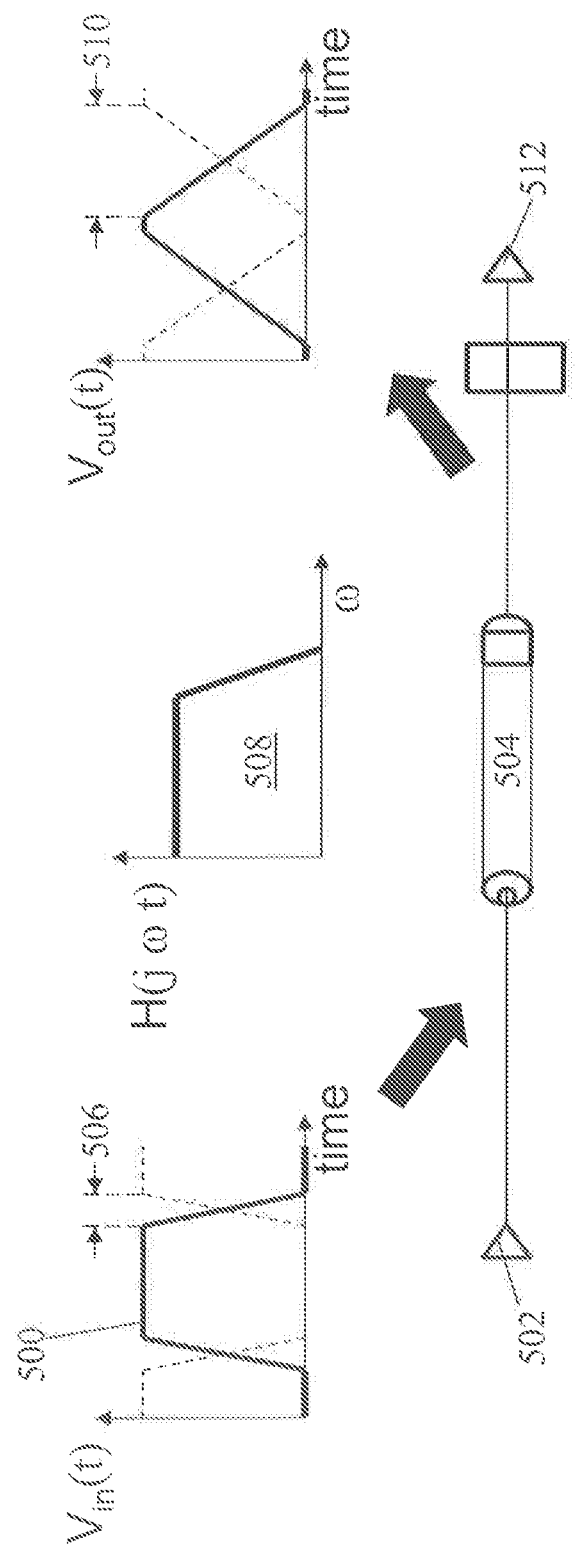

FIGS. 9A,9B,9C provide background for preferred embodiments of the invention that instruct means to apply passive circuitry to enhance signal integrity within high-peak bandwidth I/O channels 202 embedded a semiconductor carrier 102, a chip stack assembly 106, a semiconductor die 228, an interposer circuit 232, a circuit module 226, or a hybrid computing module 100.

The signal integrity of digital communications critically depends upon preserving the pulse rise time 189 through the I/O channel. A digital pulse 500 generated by a transmitter 502 must exit the I/O channel 504 with the desired pulse rise time 506. Channel distortion 508 characterized by transfer function $\infty\mathscr{E}(j\omega t)$ attenuates the digital pulse's 500 higher frequency components, causing it to have an unreadable pulse rise time 510 when it arrives at the of the receiver 512.

Embedded passive filtering networks 404,406 to function as an embedded passive equalizer 514 within high-peak bandwidth I/O channels 202 formed on a semiconductor chip carrier 102, semiconductor die 228, or active semiconductor interposer circuit 232 is a preferred embodiment of the invention. The integration of active equalizers that electrically connect passive equalizer circuitry embedded with the high-peak bandwidth I/O channel 202 with the active semiconductor surface 214 of a semiconductor die 228, active semiconductor interposer circuit 232, or a semiconductor chip carrier 102 is an additional preferred embodiment of the invention.

An embedded passive equalizer 514 comprises passive filtering networks 404,406 that generate an inverse transfer function to the channel distortion 508. A digital pulse 500 entering the embedded passive equalizer 514 will exit the embedded passive equalizer 514 as a frequency-compensated pulse 516. A frequency-compensated pulse 516 launched into the I/O channel 504 will then exit the I/O channel 504 with its power attenuated 518 by conductor loss 12 and dielectric loss 13 from materials in the I/O channel 504, but will still have a desirable pulse rise time 506.

When the embedded passive equalizer 514 is located in advance of the I/O channel 504 it is configured in Pre-Emphasis Mode. The embedded passive equalizer 514 may also be configured in Post-Emphasis Mode when it is located between the I/O channel 504 and the receiver 512.

Two dominant filtering topologies are often used in printed circuit board circuitry. The MAXIM topology 520 comprises a parallel RC circuit with a resistive element in parallel connection to ground. The AGILENT topology 522 comprises a capacitor in parallel connection with two resistors, wherein a parallel connection to ground through an RL-series network is inserted between the two resistors.

Figure 9D:
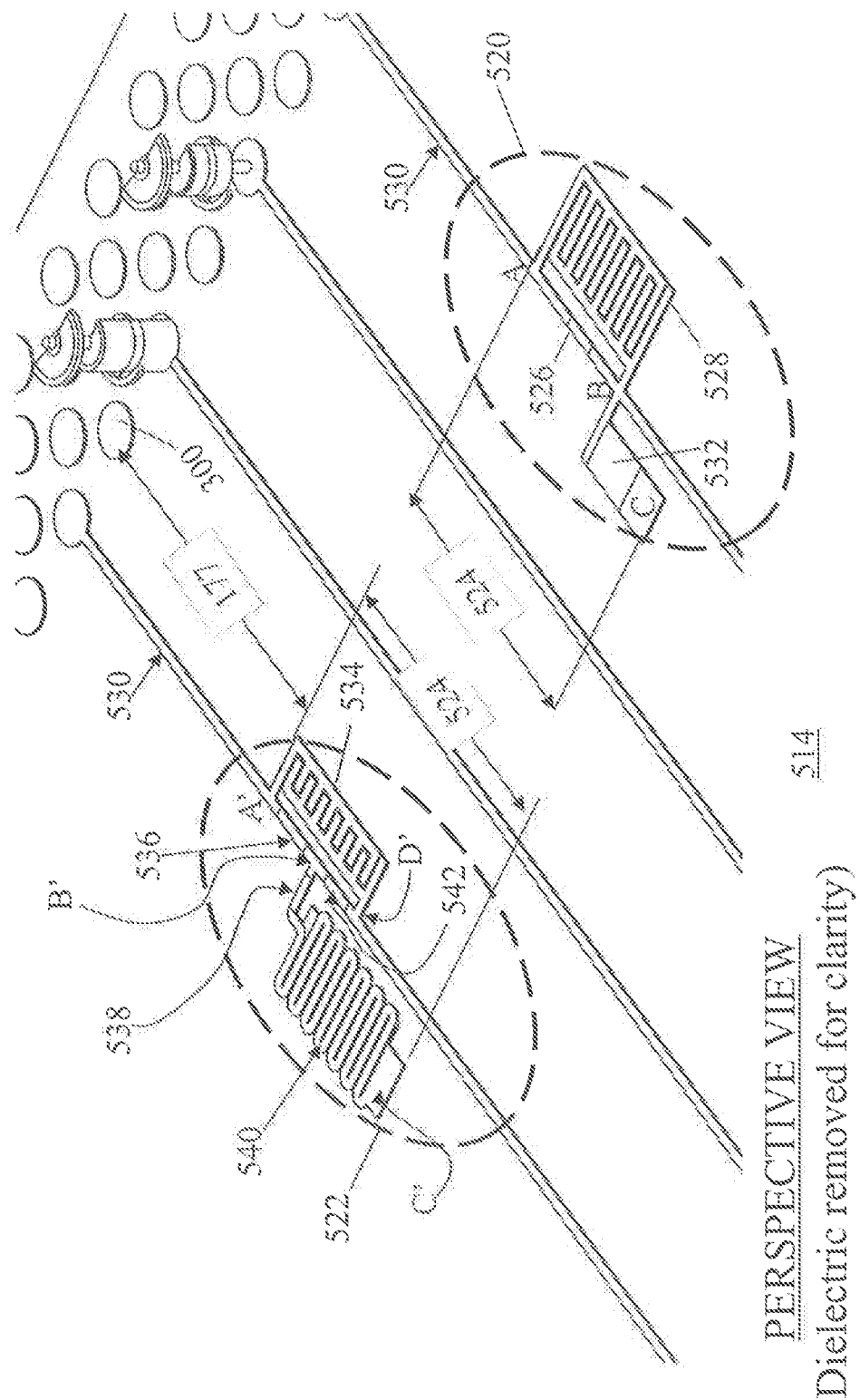
Figure 9E:
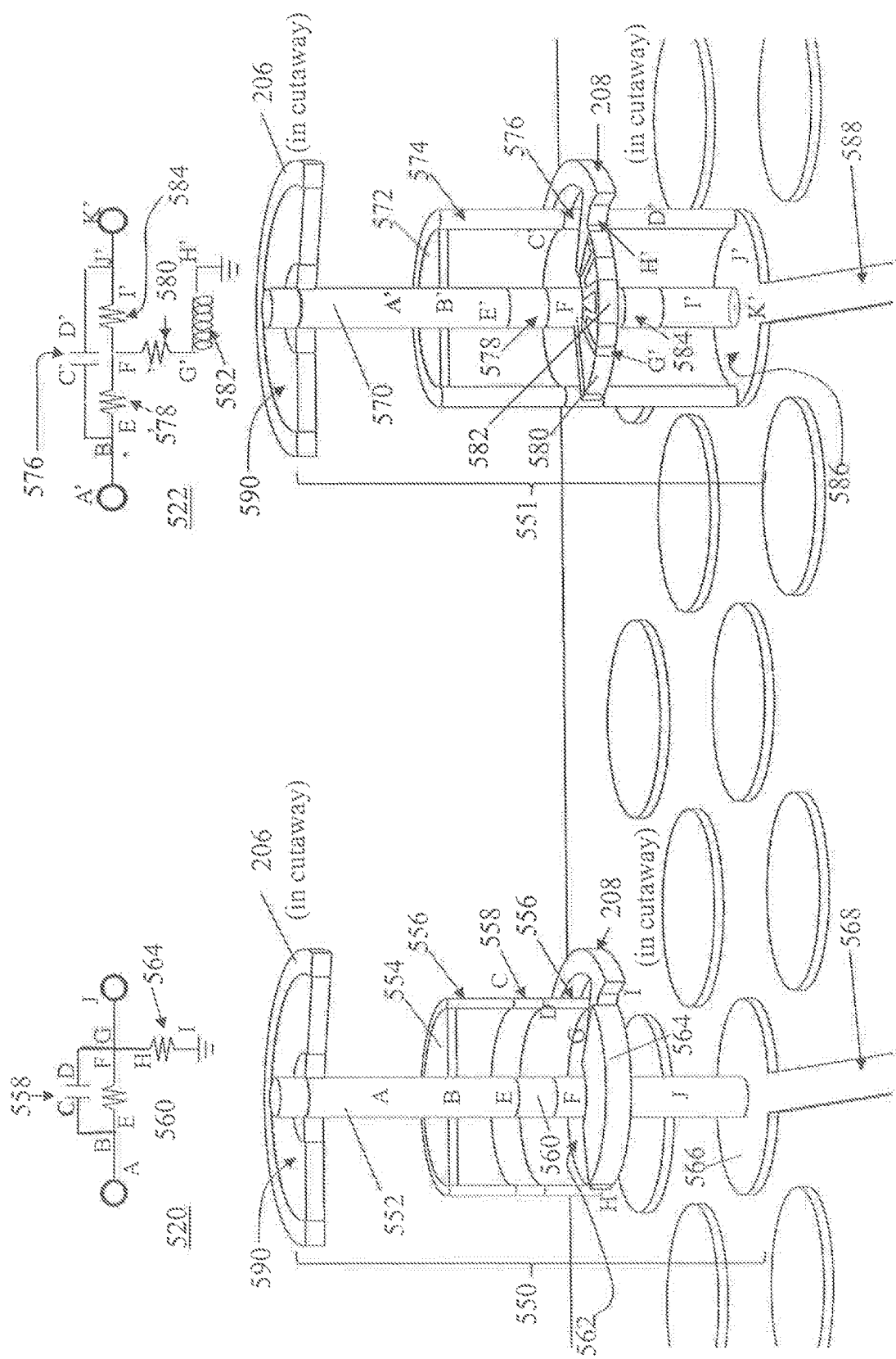

FIGS. 9D,9E,9F illustrate preferred embodiments relating to the configuration of embedded passive equalizer 514 circuitry located within a high-peak bandwidth I/O channel 202. Dielectric layers 218 are removed and conductive means 222 for power planes 206 and ground planes 208 are shown in cutaway in FIGS. 9D,9E,9F to provide illustrative clarity. The first embodiment configures the embedded passive equalizer 514 as a largely planar equalization circuit embedded within or making electrical contact with a metallization layer 222 of a power plane 206, data signal plane 210, control signal plane 212, the active semiconductor surface 214, or a ground plane 208 of a high-peak bandwidth I/O channel 202. FIG. 9D illustrates embedded passive equalizer circuitry 514 in the form of MAXIM topology 520 and an AGILENT topology 522.

The embedded passive equalization circuitry 514 preferably has a stub length 177 and overall physical dimension 524 less 100 µm, preferably less than 10 µm to be safely within the "lumped circuit" limits. As depicted in FIG. 9D, the MAXIM topology 520 comprises a first planar resistive element 526 in parallel connection with a planar capacitor 528 at points A and B along a channel link 530. At point B, a branching electrical connection is made to a second planar resistive element 532 that is in electrical communication to a ground plane 208 through a via (not shown) at point C. The AGILENT topology 522 comprises a parallel connection between second planar capacitive element 534 and second first planar resistive 536 at point A'. The second first planar resistive element 536 is in electrical contact at branch point B' with a second planar resistive element 538 in electrical communication through a planar inductive element 540 to a ground plane through a via (not shown) at point C. The first second planar resistor 536 makes a series connection through point B' with a third planar resistor 542, which makes parallel connection to the second planar capacitor 534 at point D'.

The embedded passive equalizer 514 within the high-peak bandwidth I/O channel 202 needs not assume a MAXIM topology 520, nor an AGILENT topology 522, used in printed circuit boards. Rather, the embedded passive equalizer 514 assumes a filtering topology that is the optimal inverse of the I/O channel link of the multilayer surface interface 200 formed upon a semiconductor carrier 102, interposer circuit 232, or semiconductor die 228.

FIG. 9E illustrates a preferred embodiment of the present invention that eliminates stub length 177 by distributing embedded passive equalizer 514 and/or termination circuitry 174,176,178,179,183,186 vertically across multiple planes within the multilayer surface interface through which a via 300 traverses. A vertically integrated passive equalizer embedded within a via 550 effectively has zero stub length 177 because all passive circuitry is located directly beneath the pin of a device 218 and all elements of the vertically integrated passive equalizer embedded within a via 550 have physical dimension that fall within the "lumped circuit" limit. A vertically integrated passive equalizer embedded within a via 550 having MAXIM topology 520 may comprise a micro via shaft 552 that serves as the network filter's input at point A. The input signal encounters a circuit branch at point B, where part of the signal is directed through a via pad 554 to a cylindrical conductor 556 formed around the micro via shaft 552 to point C, which is the input to a planar capacitive element 558 configured around the micro via shaft 552. The planar capacitive element 558 has its output at point D.

A second branch of the vertically integrated passive equalizer embedded within a via 550 having MAXIM topology 520 carries another portion of the signal from point B to point E through the micro via shaft 552, which is the input to a first planar resistive element 560 formed within the micro via shaft 552 that outputs the signal at point F.

The signal outputs from points D and F conjoin at point G, which is a via pad 562 for which a portion comprises a second planar resistive element 564 having its input at point H that, in turn, makes electrical contact to conductive means 222 forming a ground plane 208 (illustrated in cutaway for clarity) at point I. The vertically integrated passive equalizer embedded within a via 550 having MAXIM topology 520 has its output at point J, which is in electrical communication with a via pad 566 in electrical contact with the I/O channel link 568 of the high-peak bandwidth I/O channel 202.

Similarly, vertically integrated passive equalizer embedded within a via 551 having AGILENT topology 522 may comprise a micro via shaft 570 that serves as the network filter's input at point A'. The input signal encounters a circuit branch at point B', where part of the signal is directed through a via pad 572 to a cylindrical conductor 574 formed around the micro via shaft 570 to point C', which is the input to a planar capacitive element 576 configured around the micro via shaft 570. The planar capacitive element 576 has its output at point D'.

A second branch of the vertically integrated passive equalizer embedded within a via 551 having AGILENT topology 522 carries another portion of the signal from point B' to point E' through the micro via shaft 570, which is the input to a first planar resistive element 578 formed within the micro via shaft 570 that outputs the signal at point F'. Point F' branches another part of the signal through a second planar resistive element 580 that is configured in arcuate fashion around micro via shaft 570 and is connected in series to a planar inductive element 582 that is also configured in arcuate fashion around micro via shaft 570 and terminates at point G' where it electrically connects to conductive means 222 forming a ground plane 208 (illustrated in cutaway for clarity) at point H'.

The micro via shaft 570 of vertically integrated passive equalizer embedded within a via 551 having AGILENT topology 522 carries a portion of the signal from point F' through third planar resistor 584 embedded within micro via shaft 570. The third planar resistor 584 has its output at point I'.

Branched signals from points D' and I' in the vertically integrated passive equalizer embedded within a via 551 having AGILENT topology 522 conjoin at point J' where via pad 586 electrically connects the branched signal in the micro via shaft 570 with the branched signal in cylindrical conductor 574 to the I/O channel link 588 of the high-peak bandwidth I/O channel 202 at point K'.

Active terminations 178,179,186 are configured in a vertically integrated passive equalizer embedded within a via 550,551 are made through arcuate resistive elements 590 inserted between the micro via shafts 552,570 and conductive means 222 forming a power plane 206. Vertically integrated passive equalizers embedded within a via 550, 551, with or without active terminations 178,179,186, are preferred embodiments of high-peak bandwidth I/O channels 202 formed on a semiconductor chip carrier 102, circuit module 226, semiconductor die 228 and interposer circuit 232. A semiconductor chip carrier 102, circuit module 226, semiconductor die 228 and interposer circuit 232 comprising high-peak bandwidth I/O channels 202 may further comprise dielectric waveguides and conductive means 222 is configured as send/receive radiating elements as instructed by de Rochemont '234.

As illustrated in FIG. 9F, vertically integrated passive equalizers embedded within a via 550,551 used to form a high-peak bandwidth I/O channel 202 with a given signal directionality 592 may be deployed in Pre-Emphasis Mode 594, Post-Emphasis Mode 596 or both Pre-Emphasis Mode 594 and Post-Emphasis Mode 596.

FIGS. 10A,10B,10C,10D illustrate means to mitigate and eliminate crosstalk within a high-peak bandwidth I/O channel 202. Ultra-low loss dielectric 218 and conductive means 222 used to form ground planes 208 are removed from FIGS. 10A,10B,10C to provide greater clarity with respect to conductive means 222 structures used to form the I/O link.

A first means to assure higher signal integrity within the high-peak bandwidth I/O channel 202 is to configure the I/O channel link as differential pair conductor lines 600, wherein two vias 602A,602B are combined to form a signal line 600A and a reference line 600B. This requires one of the conductor lines (600A in FIGS. 10A,10B) to be directly tap its respective via (602A), while the other (600B) loops around via 602A to form the paired trace 600B that runs parallel to 600A on a vertically higher plane that is between the ground planes 208 (not shown for clarity) that isolate the differential pair conductor lines 600 from differential pair conductor lines 600' located on other data signal planes 210 in the high-peak bandwidth I/O channel 202.

A second means is to stagger the differential pairs 600, 600' across multiple data signal planes 210A,210B,210C, 210D. The in-plane coupling length, which governs the intensity of crosstalk distortions, is then increased from the I/O pitch length 604 to its multiple with the number of the data signal planes 210A,210B,210C,210D forming the high-peak bandwidth I/O channel 202. The use of multiple data signal planes 210A,210B,210C,210D need not be restricted to I/O links comprising a differential pair 600, its use may be universally applied to any transmission line structure, including dielectric waveguides, incorporated into the high-peak bandwidth I/O channel 202.

To achieve I/O densities >2,500 I/Os-mm-2 per layer the link will require line widths on the order of 0.75 μm. The use of four data signal planes will reduce the coupling length from 0.75 μm to 3 μm and adding more layers places cost constraints on a commercially viable design. As demonstrated in Table IV, insertion loss at higher Nyquist frequencies still imposes considerable loss, which will be due primarily to crosstalk which needs to be eliminated to achieve higher data rates and higher peak bandwidths.

TABLE IV

| | Loss (Db/inch) vs. Coupling Length | |
|---|---|---|
| Nyquist | 3 μm | 0.75 μm |
| 12 GHz | 35 | 69 |
| 24 GHz | 49 | 196 |

Figure 10A:
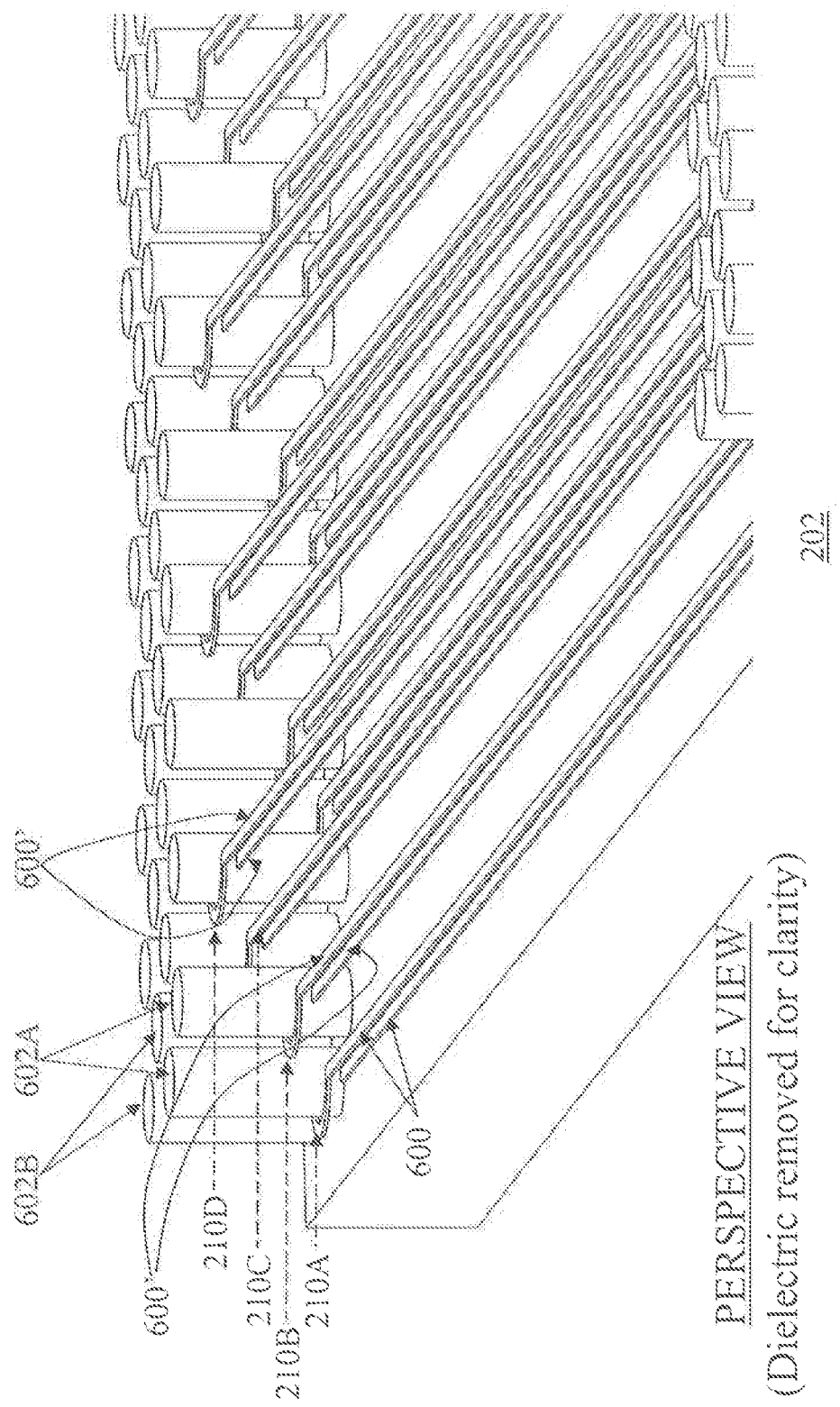
FIGS. 10A thru 10D illustrate means to uncouple data lanes within a high-peak bandwidth I/O channel.
Figure 10B:
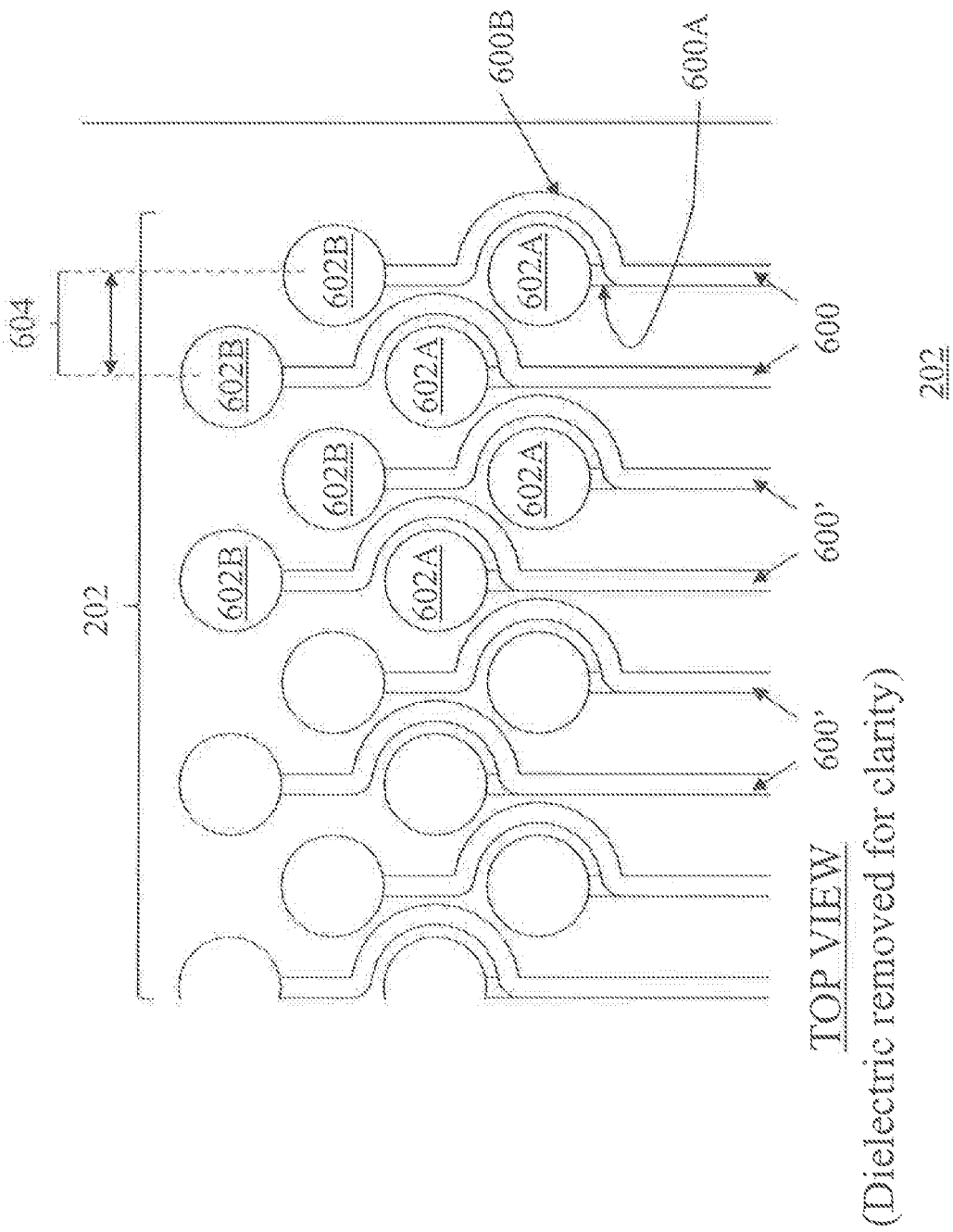
Figure 10C:
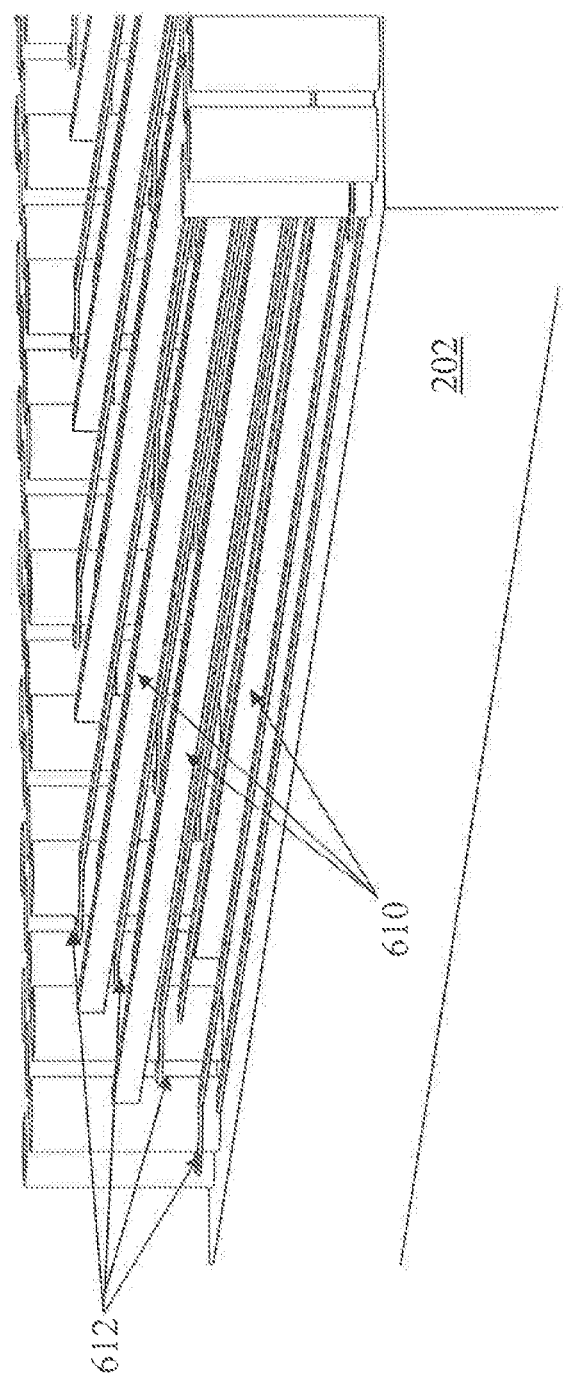
Figure 10D:
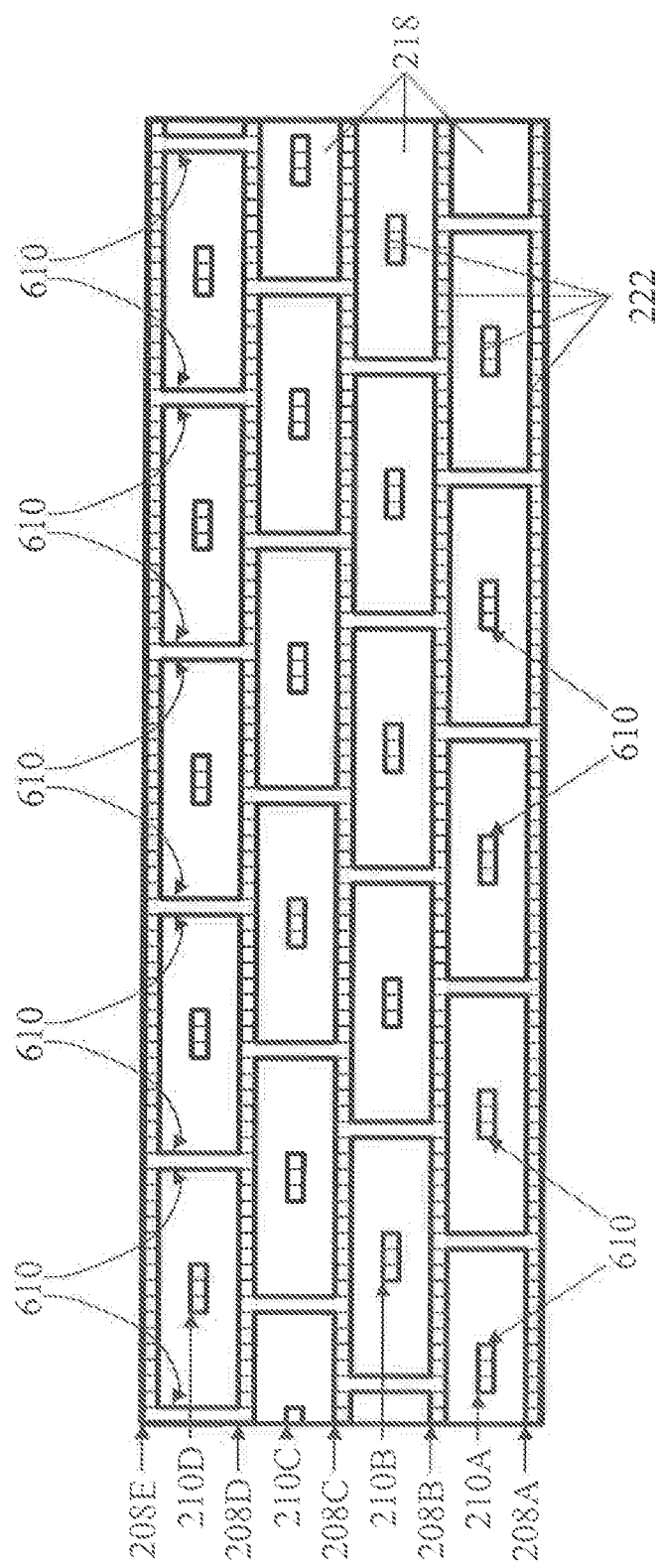

As illustrated in FIGS. 10C,10D, preferred means to eliminate crosstalk from a high-peak bandwidth I/O link inserts ground walls 610 between data signal lines 612 that run within the same data signal plane 210 to decouple adjacent channel links. FIG. 10C illustrates a high-peak bandwidth I/O channel 202 with ground walls 610 inserted between data signal lines 612 embedded within the same data signal plane 210. (Ultra-low loss dielectric 218 and conductive means 222 used to form ground planes 208 are not shown in FIG. 10C for clarity.) FIG. 10D depicts a cross-sectional view of ground walls 610 decoupling signal lines 612 formed on data signal planes 210A,210B,210C, 210D inserted between ground planes 208A,208B,208C, 208D,208E within a high-peak bandwidth I/O channel 202 comprising conductive means 222 and ultra-low loss dielectric 218.

Embedded terminations with minimal or zero stub length 177 are used to mitigate or eliminate noise attributed to signal reflections. Embedded passive equalization provides frequency compensation to preserve the signal rise time of a digital pulse traveling within a data link. Ground walls mitigate crosstalk, and eliminate crosstalk if there is means to curtail power switching noises and ground bounce by evenly distributing power to all devices. As noted previously, material losses ultimately become the primary loss factor when the design is right.

Reference is now made to FIGS. 11A,11B,11C,12A to illustrate means to amplify signals attenuated by materials losses within the high-peak bandwidth I/O channel 202. de Rochemont '489 and '532, incorporated herein by reference, instructs art relating to the resonant gate transistor 700. A resonant gate transistor 700 embedded within the semiconductor surface active layer 214 of a multilayer surface interface 200 is designed to function as an active switching element that operates at high speed or as a high efficiency amplifier operating at high frequencies above 1 GHz that generates minimal waste heat. These characteristics of a resonant gate transistor 700 enable to pJ/bit energy demand to be sharply reduced while driving signals at higher Nyquist frequencies and expanding channel densities, bit counts, and data rates.

The resonant gate transistor 700 comprises inductive (and other passive) elements 712 embedded within the gate electrode 702 of a transistor having elongated gate width 704. The elongated gate width 704 generates high gate capacitance, which normally limits switching speeds. Inductive elements 712 embedded within the gate electrode 702 will offset tire high gate capacitance and cause resonant gate transistor 700 to resonate at predetermined frequencies. On-resistance, RON, generated at the transistor junction is directly proportional to gate length 706 and inversely proportional to gate capacitance and gate width 704. Maximized gate width 704 and gate capacitance couple to minimal gate length 706 maximizes the device efficiency by reducing On-Resistance to negligible levels at frequencies well above the normal frequency cut-off transistors having elongated gate widths.

Embedding inductive elements and other passive elements 712 within the transistor's elongated gate electrode 702 creates a passive filtering network 404,406 that is more useful than the simple low-pass filter created by a conventional transistor gale. The proper selection of inductor, capacitor and resistor values embedded within the transistor gate electrode 702 allows it to resonate at specified frequencies or frequency bands and provide high-gain transistor function at those specified frequencies or frequency bands. These embedded inductive elements and other passive elements cause the resonant gate transistor to tailor maximal amplification of the attenuated signal with maximal efficiency at a resonant frequency, over desired spectral frequency bands, or at a selection of resonant frequencies. These band-tuning elements or terminating resistors may also be designed to maximally amplify the signal over equalization bands the resonant gate transistor 702 functions as an amplifying equalization circuit.

Figure 11A:
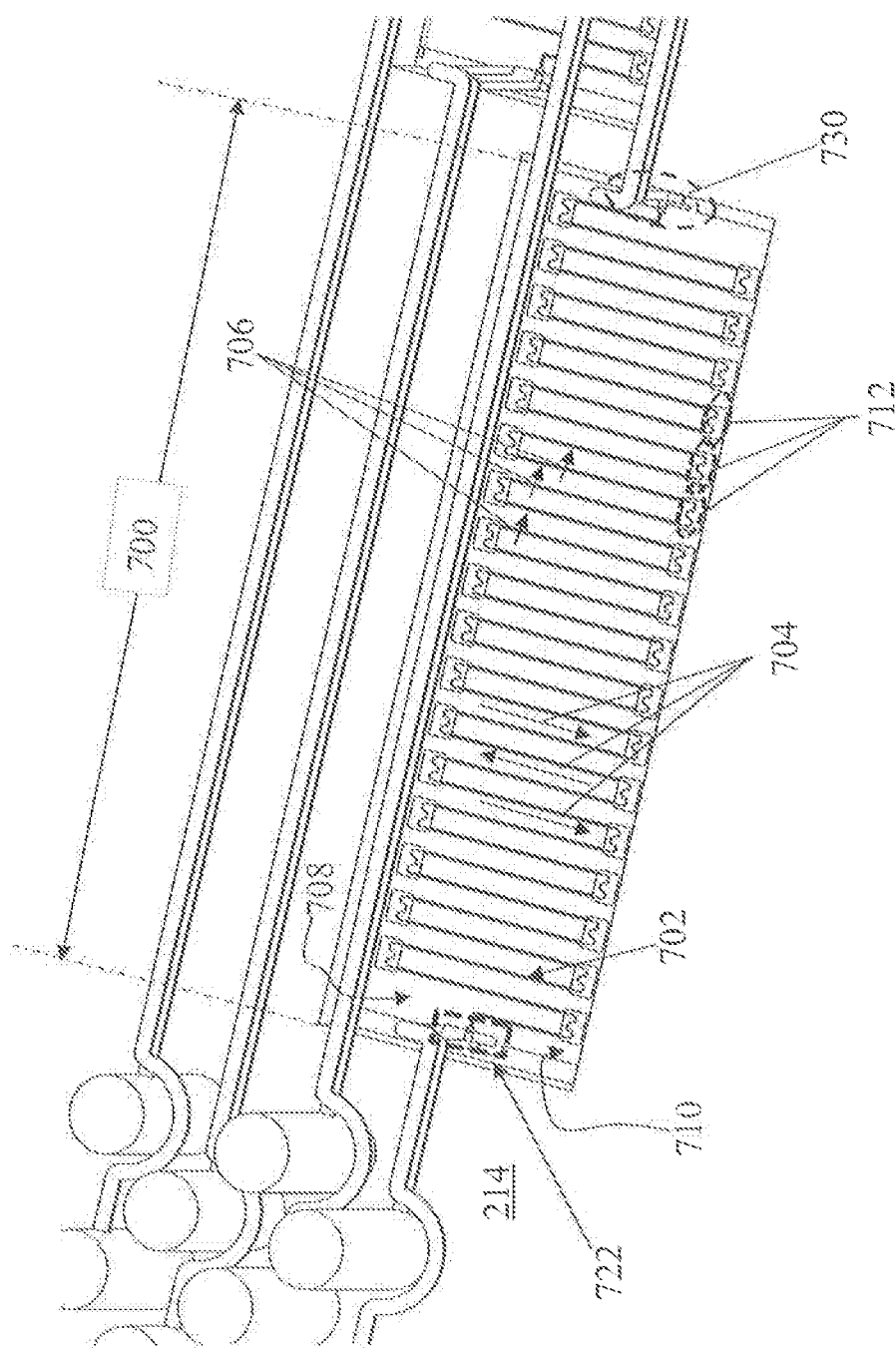
FIGS. 11A thru 11C illustrate means to amplify attenuated signals within a uni-directional or bi-directional high-peak bandwidth I/O channel.
Figure 11B:
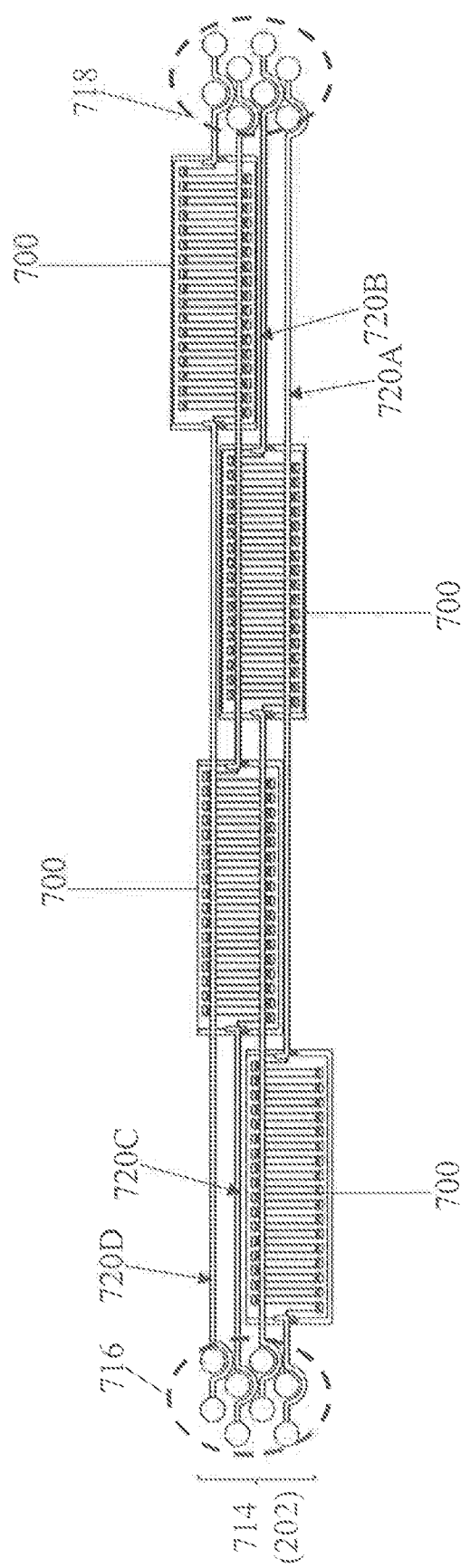

FIG. 11A illustrates a resonant gate transistor 700 embedded within an active semiconductor surface 214 of a semiconductor chip carrier 102, semiconductor die 228, or active semiconductor interposer circuit 232 that is an integral component of a high-peak bandwidth I/O channel 202. The resonant gate transistor 700 comprises a transistor gate 702 having elongated gate width 704 and narrow gate length 706, a source electrode 708, a drain electrode 710, as well as resonating planar inductors 712 that are integrated within the transistor gate 702.

The resonant gate transistor 700 is inserted within an I/O channel 714, preferably a high-peak bandwidth I/O channel 202, between input vias 716 and output vias 718. It may be placed at various lengths along the I/O channel 714 and may occupy the width of several channel links 720A, 720B, 720C, 720D when the channel links are dispersed across several data signal planes 210 in a multilayer structure, but each stage only makes electrical contact 722 with a single channel link 720 to amplify the attenuated signal 724.

In the case of a differential pair signal line 726A,726B, the source electrode 708 is in electrical communication with the reference voltage 726B. In other channel architectures the source electrode could either be connected to a reference voltage or ground. In uni-directional channels, the attenuated signal 728 is input to the transistor gate 702, and the amplified signal is collected from the drain electrode 710 in electrical communication with the signal line 726A at the opposite end 730 of the resonant gate transistor 700.

Figure 11C:
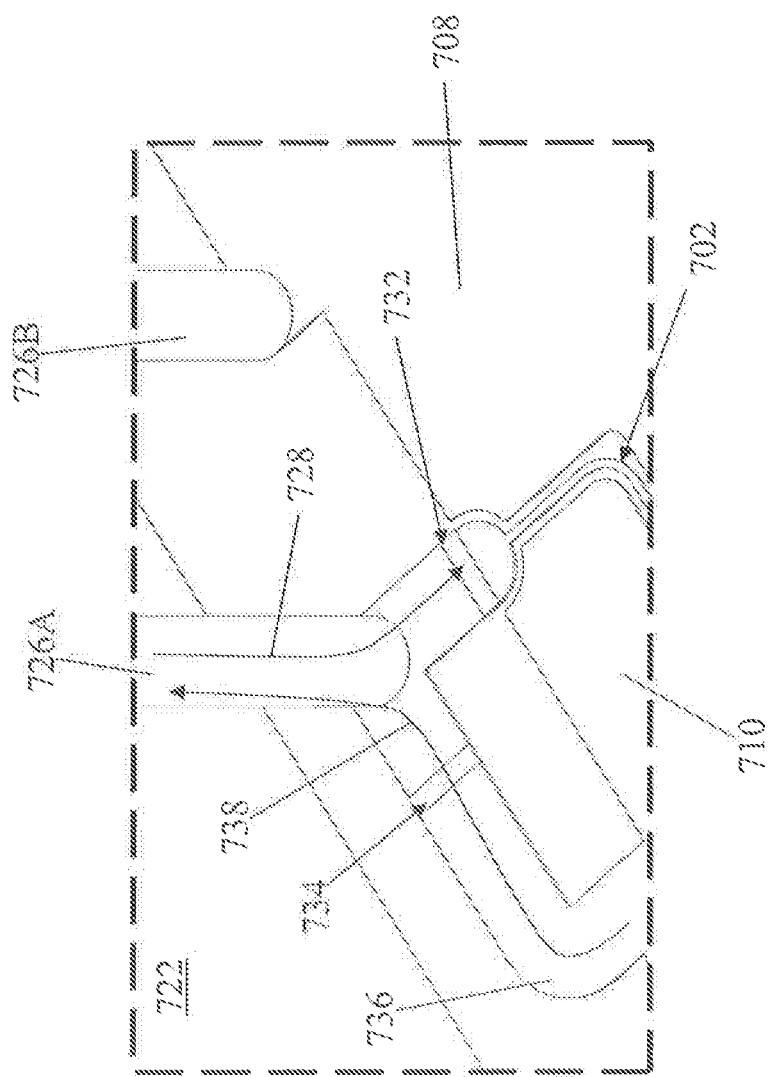

As illustrated in FIG. 11C, the high-peak bandwidth I/O channel 202 may optionally include a bi-directional resonant gate transistor 700 in which the opposite end 730 of the resonant gate transistor 700 has a conjugated electrode configuration to the pattern illustrated in FIG. 11C. In this instance, a first active switching element 732 connects the differential pair signal line 726A to the gate electrode 702, and a second active switching element 734 connects the differential pair signal line 726A to drain electrode 710 through an electrical short 736. The same switching configuration is used at the opposite end 730, but operated in conjugate manner. The first active switching element 732 and the second active switching element 734 are controlled through connections to signals directed through the signal control plane 212 (not shown for clarity).

The first active switching element 732 is closed and the second active switching element 734 is open when an attenuated signal 728 is directed to the opposite end 730 of the I/O link 714, forcing the attenuated signal to flow through the transistor gate 702, while the second active switching element 734 is closed and the first active switching element 732 is open at the opposite end forcing an amplified signal 738 to be collected by differential pair electrode 726A at the opposite end 730.

When operating in the reverse direction, control signals close the first active switching element 732 and open the second active switching element 734 forcing an attenuated signal 728 into the transistor gate 702 at the opposite end 730, while the first active switching element 732 is opened and the second active switching element 734 is closed at electrical connection 722, permitting amplified signal 738 to be collected by differential pair electrode 726A at electrical connection 722. Other active switching elements that balance impedance matching circuitry in the I/O link 714 are not shown for clarity as they would be obvious to those skilled in the art of high-speed circuits.

Figure 12A:
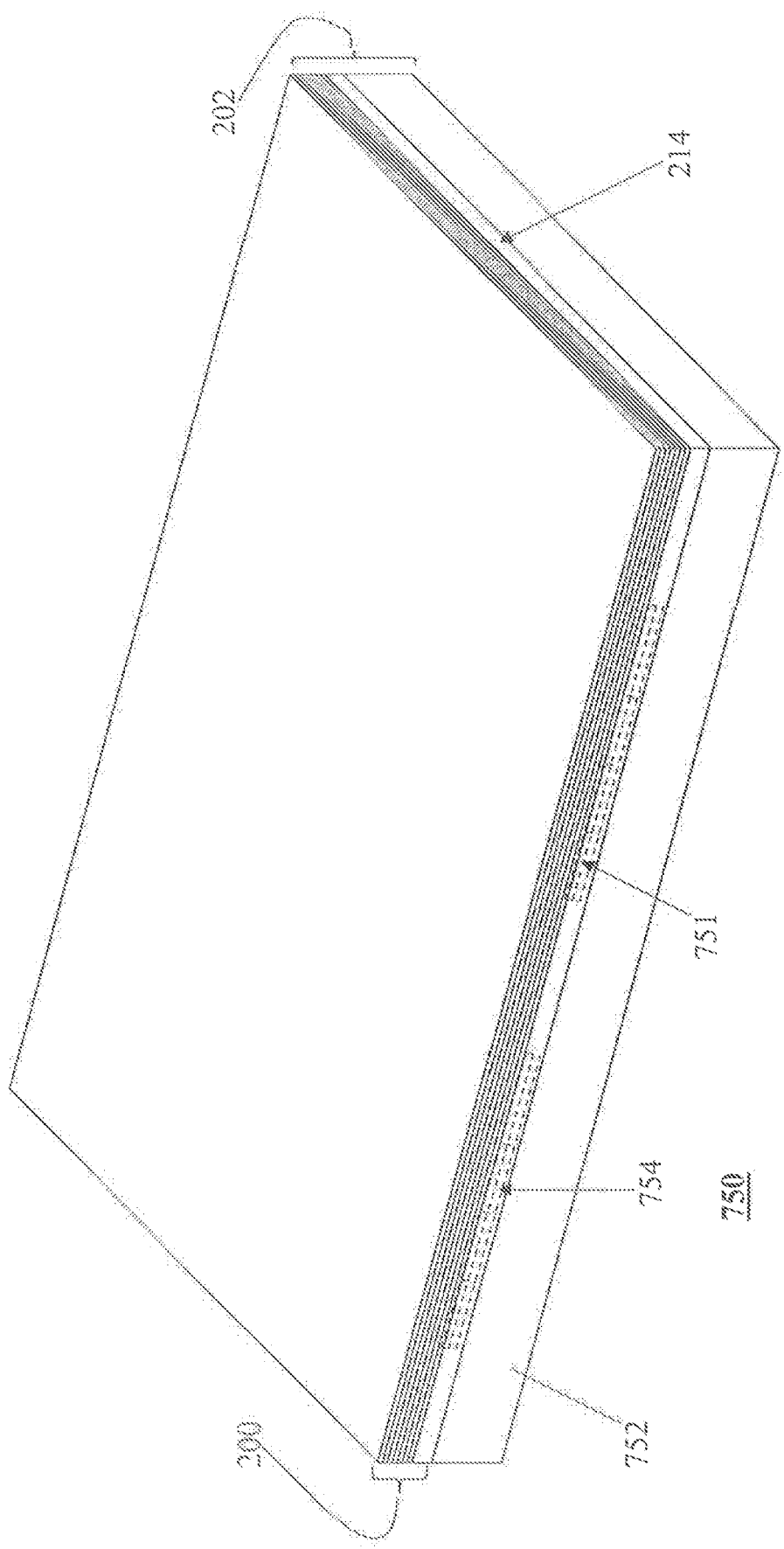
FIG. 12A thru 12D illustrate art relating to resonant gate transistor modules comprising high peak bandwidth I/O channels and fully integrated gyrator circuits.
Figure 12B:
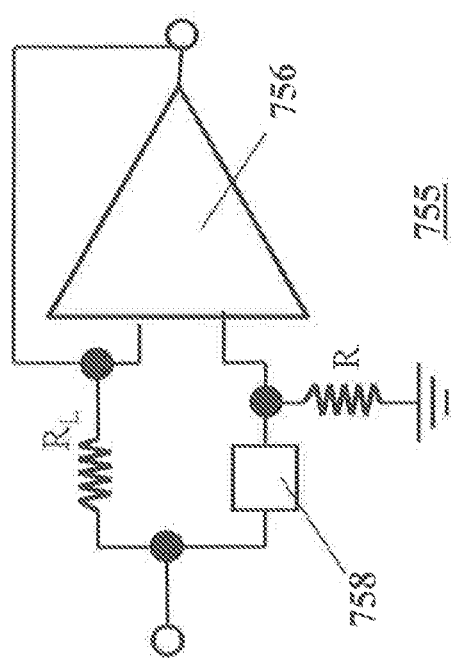
Figure 12C:
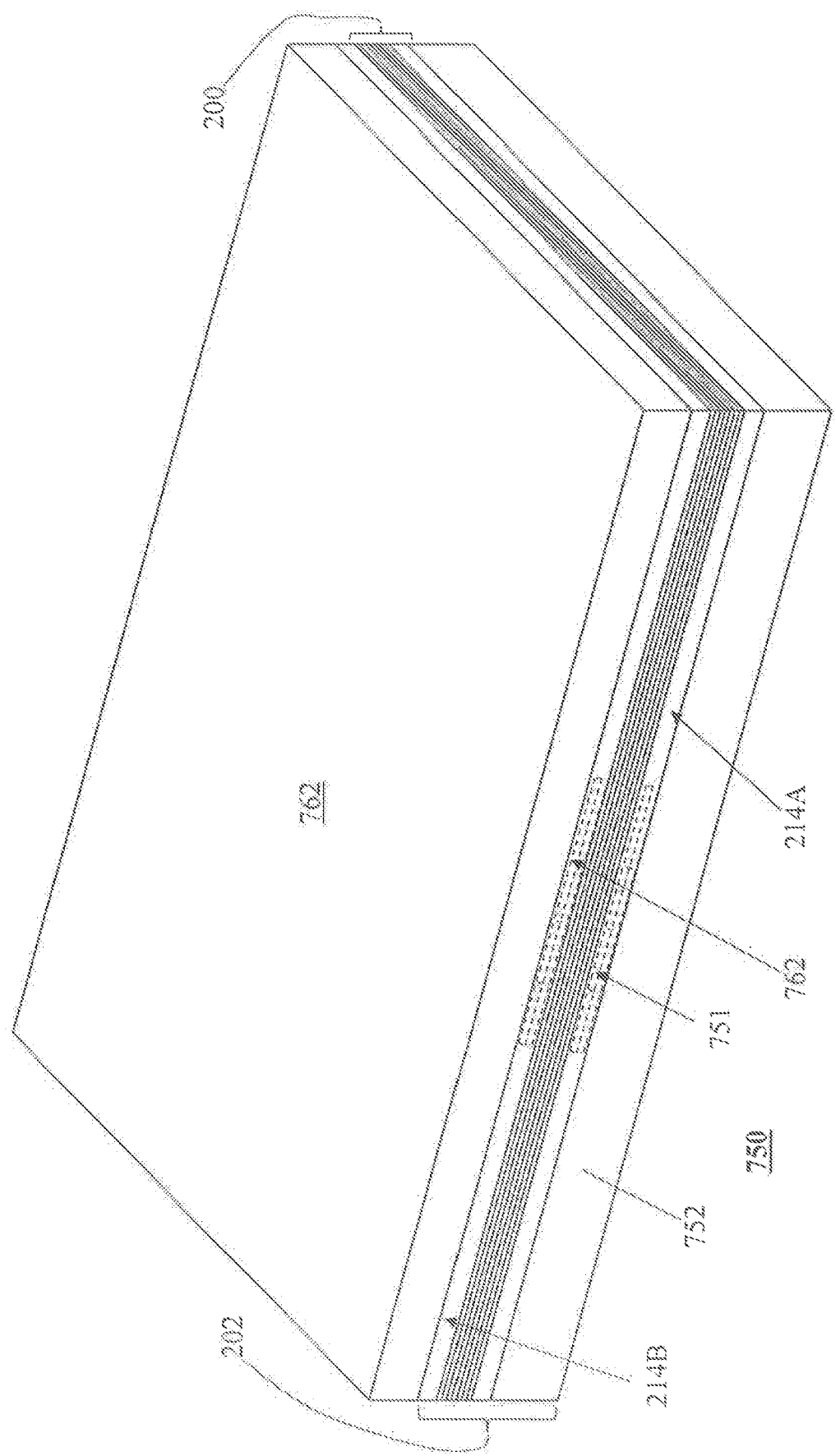
Figure 12D:
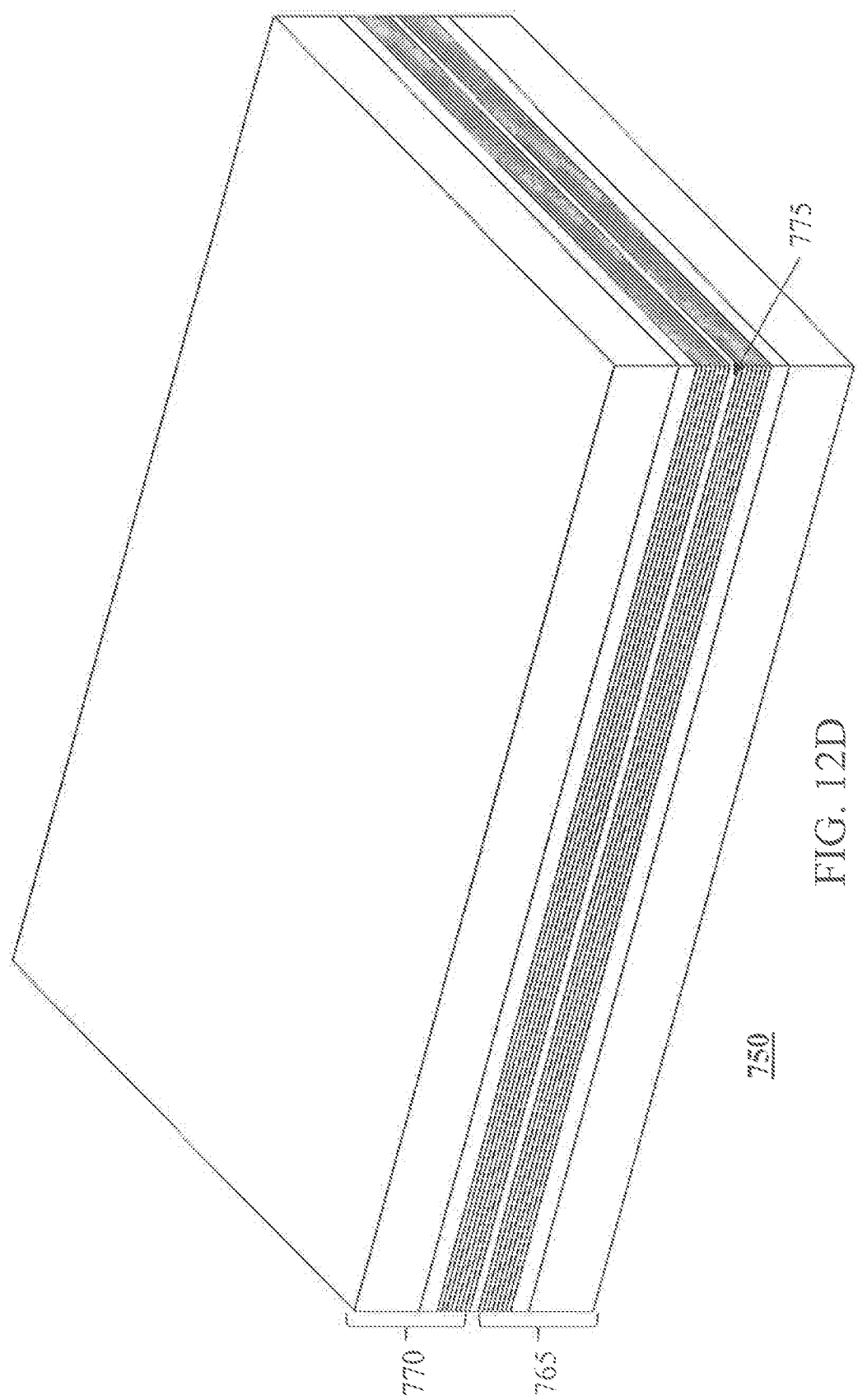

FIGS. 12A,12B,12C illustrate essential features elements of a resonant gate transistor embedded within a hybrid computing module 100, a high-peak bandwidth I/O channel 202, circuit module 226, or a resonant gate transistor module 750. While reference below is made explicitly to a resonant gate transistor module 750, it is implicitly understood this reference applies equally to the application of a resonant gate transistor 700 within the above-mentioned circuit module embodiments 100,202,226.

A preferred embodiment of the application comprises a resonant gate transistor 700 embedded within a first region 751 of an active semiconductor surface 214 on a semiconducting substrate 752 that forms an electrical interface with a multilayer surface interface 200 in which high-peak bandwidth I/O channels 202 have been embedded. Inductive and other passive elements 712 may be embedded directly within the gate electrode 702 in the first region 751. Alternatively, when design criteria permit, the inductive and other passive elements 712 may be located within one or more signal data planes 210 of the multilayer surface interface 200 and electrically inserted within the gate electrode 702, through input vias 716 and output vias 718. Inductive and other passive elements 712 located within the one or more signal data planes 210 may be configured to form a plurality of distinct passive filtering networks 404,406 wherein an active switching element 734 is used to select which of the passive filtering networks 404,406 is inserted into the gate electrode 702 to determine the resonant response of the resonant gate electrode.

In certain applications, it is desirable to electrically interface a plurality of resonant gate transistors together as a single part within a resonant gate transistor module. In this instance, it is desirable to embed a resonant gate transistor 700 in a first region 751 of an active semiconductor surface 214 and form an electrical interface through the high-peak bandwidth I/O channel 202 to another resonant gate transistor 700 in a second region 754 of the active semiconductor surface 214.

At higher signal frequencies the permeability of high energy density electroceramic dielectric 224 may be a limiting design factor and prevent the inductive element 712 from having physical dimension small enough to be integrated into the desired circuit. In this instance, the integration of a fully integrated gyrator that functions as a loss-less linear inductor is a preferred embodiment of the application.

de Rochemont '411, incorporated herein by reference, instructs art related to the fully integrated gyrator 755, which comprises an operational amplifier (Op-Amp) 756 and an inverting passive circuit 758. The fully integrated gyrator 755 functions as an inductive element 712 when the inverting passive circuit 758 is a capacitor. Similarly, the fully integrated gyrator 755 functions as a capacitor when the inverting passive circuit 758 is an inductor. The inverting passive circuit 758 may alternatively comprise more complex passive filtering networks 404,406, thereby allowing the resonant gate transistor 700 to function as an amplifying equalization circuit.

It is preferable to locate the Op-Amp 756 circuitry in close physical proximity to the resonant gate transistor 700 in order to achieve circuit synchronization within a high-speed circuit environment. In each of the following instances, inductive and other passive elements 712 that form the resonant gate transistor 700 may be located as planar passive components 306,310,314 embedded within the gate electrode 702 in the first region 751, or as planar passive components 306,310,314 within signal data planes 210 in the multilayer surface interface 200 or within integrated vias 400,450 of the high-peak bandwidth I/O channel 202. Inductive elements 712 within the resonant gate transistor 700 may additional comprise a planar inductive component 306 or comprise a folly integrated gyrator 755 wherein the inverting passive circuit 758 is a capacitor comprising a high energy density electroceramic dielectric that polarizes and depolarizes with femto-second response times.

One first aspect of the invention claims a resonant gate module 750 that functions as an amplifying equalization circuit and comprises a fully integrated gyrator 755 wherein the resonant gate transistor 700 and the active circuitry Op-Amp circuitry 756 are co-located in a first region 751 or a second region 754 of the active semiconductor surface 214 in a high peak bandwidth I/O channel 202. The inverting passive circuit 758 of the folly integrated gyrator 755 is embedded within the multilayer surface interface 200 of the high-peak bandwidth I/O channel 202 and vias 718 form an electrical interface between Op-Amp 756 circuitry and the resonant gate transistor 700. In this instance, the inverting passive circuit 758 may comprise planar passive circuit components 306,310,314 within, may alternatively comprise integrated vias 400,450 or a combination of planar passive circuit components 306,310,314 and integrated vias 400,450.

When design or manufacturing constraints/efficiencies do not favor the first aspect of the application, an additional aspect of the invention claims a resonant gate transistor module 750 wherein active circuit elements of the resonant gate transistor 700 are integrated within a first region 751 of the active layer of the first semiconductor surface 214A within multilayer surface interface 200 of a high-peak bandwidth I/O channel 202. The active circuit elements of the Op-Amp 756 circuitry are integrated within a second region 762 located in an active semiconductor layer 214B of a second semiconductor device 760 that is directly bonded to the high-peak bandwidth I/O channel 202 through which it forms an electrical interface with the resonant gate transistor 700. It is preferably to bond the semiconductor substrate 752 to the second semiconductor die 760 such the first region 751 of the first semiconductor surface 214A is in vertical alignment with the second region 762 of the second semiconductor device 760. In all bonded configurations of the resonant gate transistor module 750 the semiconductor substrate 752 and the second semiconductor device 762 may comprise a chip stack or bonded wafers.

In this additional aspect of the invention, the inverting passive circuit 758 of the fully integrated gyrator 755 is embedded within the multilayer surface interface 200 of the high-peak bandwidth I/O channel 202 and vias 718 form an electrical interface between Op-Amp 756 circuitry and the resonant gate transistor 700. In this instance, the inverting passive circuit 758 may comprise planar passive circuit components 306,310,314 within, may alternatively comprise integrated vias 400,450 or a combination of planar passive circuit components 306,310,314 and integrated vias 400,450.

A third aspect of the resonant gate transistor module 750 claims a bonded pair of semiconductor circuit modules 765,770 that each comprise high peak bandwidth I/O channels 202, resonant gate transistors 700 integrated within the active layer of a semiconductor surface 214, and passive filtering networks embedded within the signal data planes 210 or integrated vias 400,450 of the modules' multilayer surface interface 200, wherein an active interfacial layer 775 is located at the bonding interface and comprises Op-Amp 758 circuitry needed to form fully integrated gyrator 755 circuits in the pair of semiconductor circuit modules 765, 770.

Vias 718 form an electrical interface between Op-Amp 756 circuitry in the active interfacial layer 775 and the resonant gate transistors 700 in semiconductor circuit modules 765,770. The inverting passive circuit 758 of fully integrated gyrator 755 circuits is embedded within the multilayer surface interfaces 200 of the high-peak bandwidth I/O channels 202 of modules 765,770. The inverting passive circuit 758 may comprise planar passive circuit components 306,310,314, may alternatively comprise integrated vias 400,450, or comprise a combination of planar passive circuit components 306,310,314 and integrated vias 400,450.

Preferred circuit and system embodiments for the bonded pair of semiconductor circuit modules 765,770 comprise wireless transceivers within a satellite of terrestrial telecommunications network, optical or electro-optical transceivers within a space-based satellite system or terrestrial fiber-optic telecommunications network, or processor units with a server farm or server farm network, in particular, within a hybrid computing module, or as a wireless or processor unit within a mobile computing device 806 that interfaces with a regional or global server farm network.

Figure 13A:
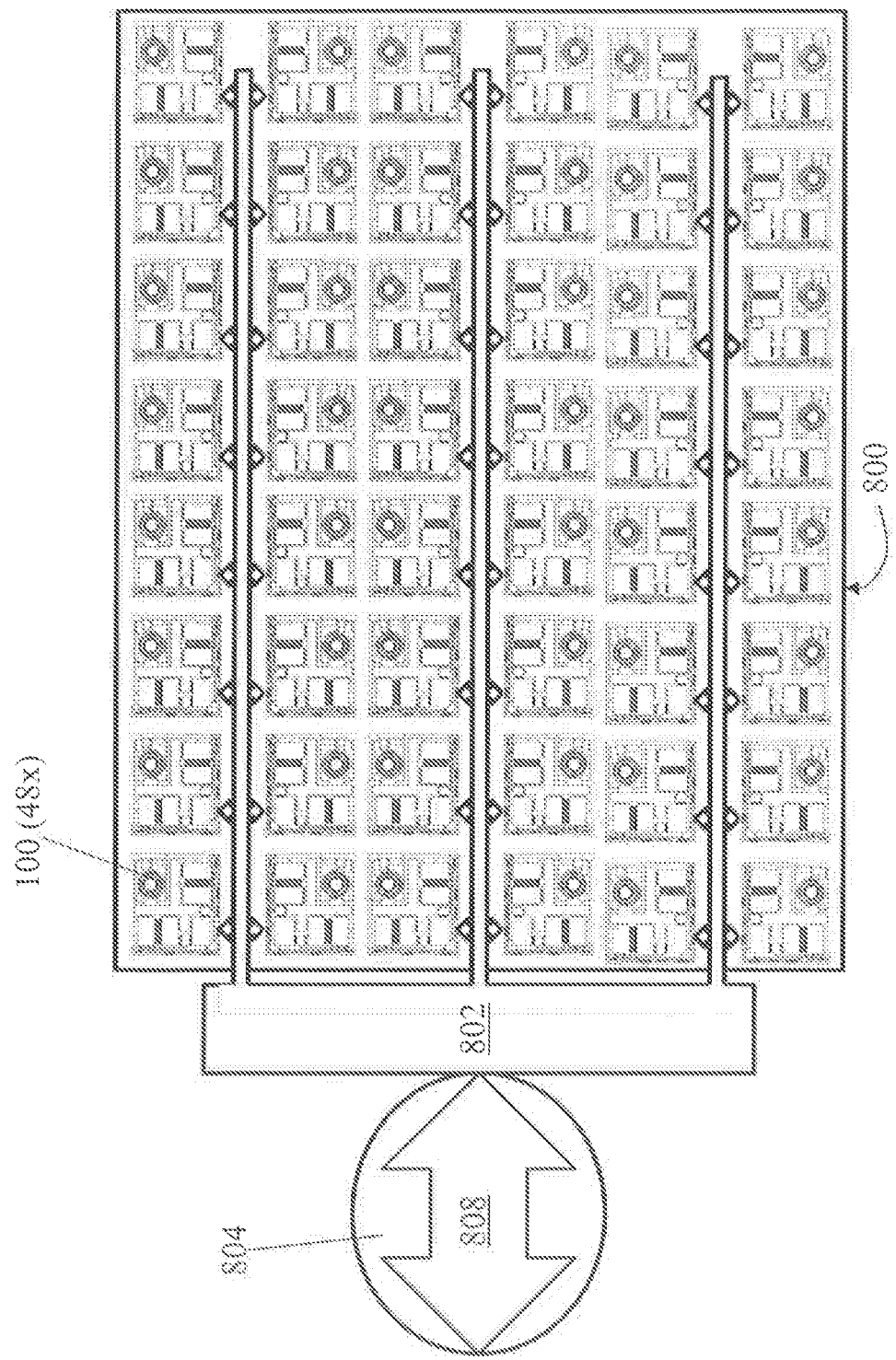
FIG. 13A,13B illustrate a networked computing and telecommunications system comprising high-peak bandwidth I/O channels.
Figure 13B:
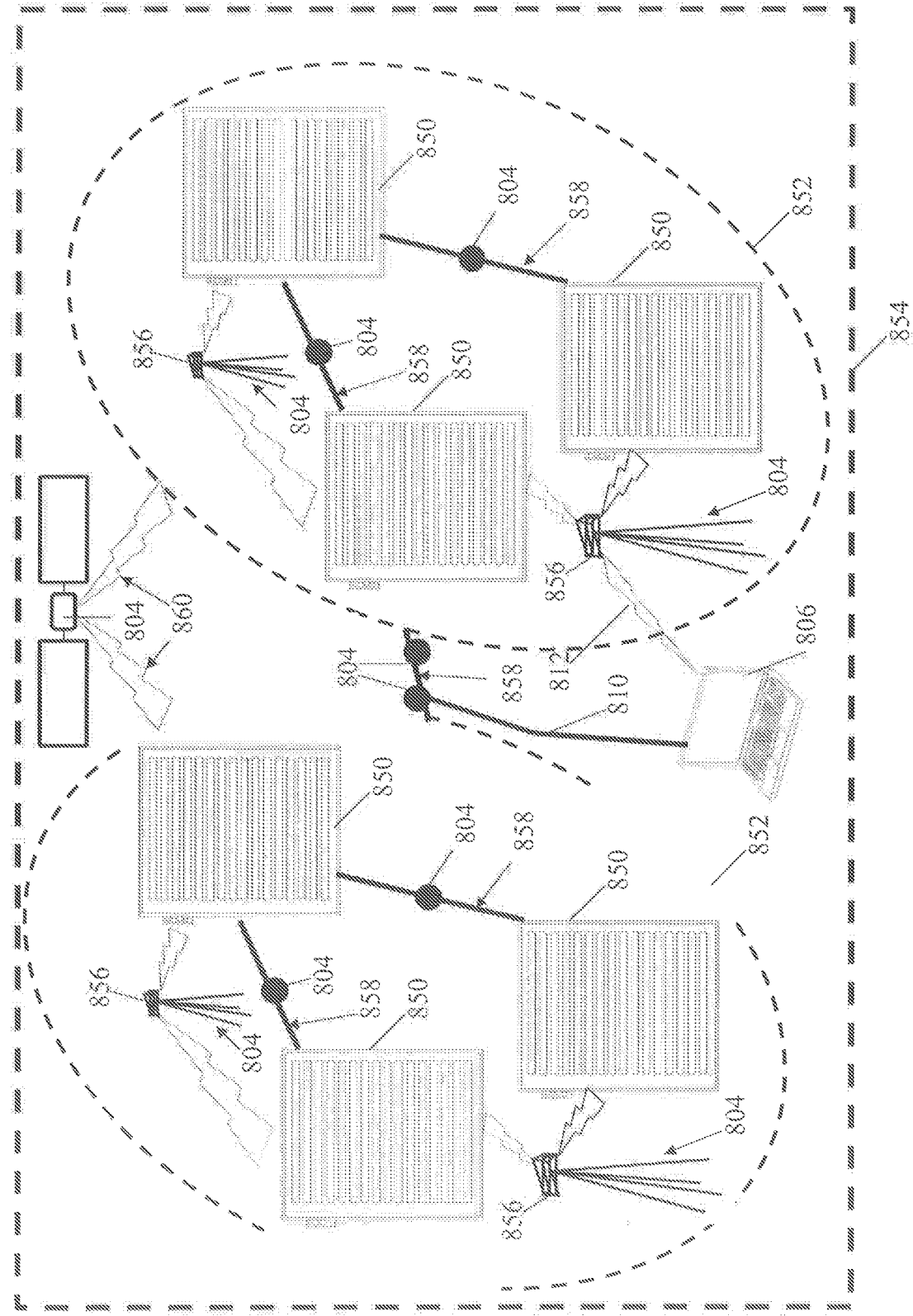

Reference is now made to FIGS. 13A,13B to illustrate a preferred embodiment of the application that applies hybrid computing modules 100 within in a networked computing system 800 that consists of a plurality of hybrid computing modules 100 comprising semiconductor die 104,106,228 that serve all functions needed by networked computing (memory, processor units, controllers, etc.). As discussed above, semiconductor die 104,106,228 within the hybrid computing module are mounted on a substrate, preferably a semiconductor carrier 102, as single heterogeneous semiconductor die 104, wherein the substrate comprises high-peak bandwidth I/O channels. Semiconductor die 104,106, 228 may also be bonded within an chip stack 106 that comprises an interposer circuit 232.

High peak bandwidth I/O channels 202 within the hybrid computing module 100 form an electrical communications interface between semiconductor die 104,106,228 and an electro-optic transceiver 110. The electro-optic transceiver 110 encodes electronic signals processed on the hybrid computer module 100 into optical signals transmitted to a local optical communications bus 802 through optical ports 111, preferably fiber-optic ports. The networked computing systems 800 may also comprise hybrid computing modules 100 that are co-located on an optical panel assembly wherein the local optical communications bus 802 is integral to optical panel as instructed by de Rochemont '411. The optical panel assemblies may be mounted in a rack and housed in a server farm or distributed among a plurality of server farms. The local optical communications bus 802 forms a communications interface with other hybrid computing modules 100 within the networked computing system 800. Similarly, the electro-optic transceiver 110 decodes optical signals received from the local optical communications bus 802 into electronic signals to be processed on the hybrid computing modules 100.

The local optical communications bus 802 may be used to optically interface all hybrid computing modules 100 within a server farm 850 and larger network nodes 804 that comprise transceiver circuits 806 and form a communications interface with other server farms 850 within a regional network 852 or a global network 854. The regional network 852 and global network 854 comprise wireless 856, optical 858, and satellite 860 telecommunications systems. Mobile computing devices 806 interact with the regional networks 852 and global networks 854 through landline connections 810 or wireless connections 812. A preferred element of the application claims larger network nodes 804 and mobile computing devices 806 that additionally comprise transceivers 808 that further comprise circuit modules 226, hybrid computing modules 102, semiconductor die 232, or interposer circuits 232 that form an electrical interface with one another through a high-peak bandwidth I/O channel 202. Another preferred element of the application claims larger network nodes 804 and mobile computing devices that additionally comprise a fully integrated gyrator 755, preferably a semiconductor circuit 765,770 further comprising a fully integrated gyrator 755 and a resonant gate transistors 700 wherein the fully integrated gyrator 755 comprises an inverting passive circuit 758 that functions as an amplifying equalization circuit.

Networked computing systems 800 may additionally consist of comprise hybrid computing modules 100 further comprising electro-optical transceivers 110 that comprise a material layer forming a 3D quantum gas medium, as instructed by de Rochemont '768 is an additional preferred embodiment of the application.

What is claimed is:

1. A computing system that comprises one or more hybrid computing modules that further comprise at least one high peak bandwidth I/O channel embedded within a multilayer surface interface, wherein,
    the multilayer surface interface is formed on a dielectric or semiconducting substrate to form a semiconducting die, a semiconductor carrier, an interposer circuit embedded within a semiconductor chip stack or bonded assembly of semiconductor wafers that are mounted on a substrate or semiconductor carrier;
    the high peak bandwidth I/O link additionally comprises vias that form an electrical interface with input and output ports on semiconductor die, the semiconductor carrier, or an interposer circuit embedded within the stacked assembly of semiconductor chips;
    the multilayer surface interface comprises conducting means that forms a channel link within a data signal plane that electrically interfaces signal transmission between the vias, low permittivity/ultra-low loss dielectric, additional conductive means to form power planes and ground planes, and may optionally signal comprise an active semiconductor layer and one or more control planes;
and,
    the multilayer surface interface further comprises a passive network filtering circuit comprising capacitive, inductive, and resistive elements embedded within the high peak bandwidth I/O channel,
wherein,
    the passive network filtering circuit further comprises high energy density electroceramic dielectric components that polarize and depolarize with femto-second response times.

2. The hybrid computing module of claim 1, wherein active switching elements embedded within an active semiconductor surface of a semiconductor chip carrier, a semiconductor die mounted on the semiconductor chip carrier, or semiconductor embedded within the stacked assembly of semiconductor chips, form an electrical interface with a signal control plane in the multilayer surface interface and the passive network filtering circuit functions as a clock or data recovery circuit.

3. The hybrid computing module of claim 1, wherein a resonant gate transistor is:
    embedded within an active semiconductor surface of a multilayer interface formed on a semiconductor chip carrier, a semiconductor die, or an active semiconductor interposer circuit, in electrical communication with the signal control plane of the multilayer surface interface, and, inserted between input and output vias within the high-peak bandwidth I/O channel to amplify an attenuated signal.

4. The resonant gate transistor of claim 3, wherein inductors, capacitors, and resistors embedded within the resonant gate transistor's gate electrode function as band tuning elements to tailor maximal amplification of the attenuated signal at a resonant frequency or over desired spectral frequency bands.

5. The high-peak bandwidth I/O channel of claim 3, wherein the high-peak bandwidth I/O channel additionally comprises conductive means configured as a differential pair and active switching elements that configure the resonant gate transistor to operate as a bi-directional amplification stage.

6. The hybrid computing module of claim 1, wherein the high peak bandwidth I/O channels are distributed across several data signal planes of the multilayer surface interface and comprise ground walls and ground planes, and have interconnection density exceeding 200 I/O/mm/layer.

7. A high peak bandwidth I/O channel embedded within a multilayer surface interface that forms the bus circuitry electrically interfacing the output or input port on a first semiconductor die with the input or output port on a second semiconductor die, wherein the high peak bandwidth I/O channel comprises:
  vias in electrical communication with the input and output ports on the first and second semiconductor die,
  a channel link comprising conductive means embedded within low permittivity/ultra-low loss dielectric that electrically interconnects the vias,
  a passive network filtering circuit comprising capacitive, inductive, and resistive elements embedded within the high peak bandwidth I/O channel,
  a multilayer surface interface comprising the channel link embedded within a data signal plane,
  additional conductive means to form power planes and ground planes, or optional signal control planes;
wherein,
  the passive network filtering circuit comprises components including high energy density electroceramic dielectric that polarizes and depolarizes with femto-second response times.

8. The high peak bandwidth I/O channel of claim 7, wherein the multilayer surface interface is formed on a dielectric substrate or semiconducting die, a semiconductor carrier, or an interposer circuit embedded within a stacked assembly of semiconductor chips.

9. The high-peak bandwidth I/O channel of claim 8, wherein active switching elements are embedded within an active semiconductor surface of a semiconductor chip carrier, a semiconductor die mounted on the semiconductor chip carrier, or semiconductor embedded within the stacked assembly of semiconductor chips form an electrical interface with a signal control plane in the multilayer surface interface and the passive network filtering circuit functions as a clock or data recovery circuit.

10. The high peak bandwidth I/O channel of claim 7, wherein the signal control planes are used to modulate active switching elements embedded within the active semiconductor layer.

11. The high peak bandwidth I/O channel of claim 10, wherein a plurality of channel links are distributed across a across a plurality of data signal planes embedded within the multilayer surface interface.

12. The high peak bandwidth I/O channel of claim 11, wherein the plurality of channel links are electrically isolated from one another by ground planes and ground walls.

13. The high peak bandwidth I/O channel of claim 12, wherein the high peak bandwidth I/O channel is a high interconnection density I/O channel has a linear escape density in excess of 200 I/O/mm/layer.

14. A networked computing system including a telecommunications system that contains network nodes and manages the flow of data between and within server farms, wherein the hardware forming the telecommunications system, transceiver circuits within network nodes, and server farms comprise hybrid computing modules that comprise:
  semiconductor die that serve all functions needed to support networked computing, wherein,
  the semiconductor die are mounted on a substrate that forms an electrical interface between the semiconductor die in the hybrid computing module, and,
  the substrate comprises a multilayer surface interface that further comprises a high peak bandwidth I/O channel comprising:
  low permittivity/ultra-low loss dielectric;
  conductive means used to form ground planes, power planes, signal data planes and electrical interface between the ground planes, power planes, and signal data planes; wherein,
  the signal data planes further comprise high energy density electroceramic dielectric embedded within layers of low permittivity/ultra-low loss dielectric and photo-lithographically patterned to form passive circuit elements configured to function as a passive filtering network; and,
  wherein high energy density electroceramic dielectric forming capacitive passive circuit elements has a dielectric response that polarizes and de-polarizes on femto-second time scales and maintains physical dimension less than $\frac{1}{20}$th of the guided wavelength of a system operating frequency in excess of 3 GHz.

15. The networked computing system of claim 14, wherein the substrate is a semiconductor carrier wherein the multilayer layer interface comprises a control signal layer and active circuitry embedded within an active semiconductor layer.

16. The networked computing system of claim 15, wherein a plurality of semiconductor die are bonded within a chip stack comprising an interposer circuit.

17. The networked computing system of claim 16, wherein the interposer circuit comprises a high peak bandwidth I/O channel.

18. The networked computing system of claim 14, wherein the hybrid computing module comprises a multilayer layer interface having a control signal layer and active circuitry embedded within an active semiconductor layer.

19. The networked computing system of claim 14, wherein the high peak bandwidth I/O channels form an electrical interface between the semiconductor die and an electro-optic transceiver that further comprises high peak bandwidth I/O channels within its internal circuitry that encodes electronic signal data processed by the hybrid computing module into optical signal data transmitted from the hybrid computing module though a local optical communications bus and decodes optical signal data received by the hybrid computing module from the local optical communications bus into electronic signal data to be processed by the hybrid computing module.

20. The networked computing system of claim 14, wherein the passive filtering network is embedded within an integrated via.

\* \* \* \* \*